(12) United States Patent
Nakatsuka et al.

(10) Patent No.: US 8,927,326 B2
(45) Date of Patent: Jan. 6, 2015

(54) ORGANIC ELECTROLUMINESCENCE ELEMENT, PRODUCTION METHOD THEREOF, ORGANIC EL DISPLAY DEVICE, ORGANIC EL LIGHTING, AND APPARATUS FOR PRODUCING ORGANIC ELECTROLUMINESCENCE ELEMENT

(75) Inventors: Takeshi Nakatsuka, Kanagawa (JP); Yoshimasa Bando, Kanagawa (JP); Kiyoshi Sugiyama, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 13/616,452

(22) Filed: Sep. 14, 2012

(65) Prior Publication Data

US 2013/0240844 A1    Sep. 19, 2013

Related U.S. Application Data

(63) Continuation of application No. PCT/JP2011/055970, filed on Mar. 14, 2011.

(30) Foreign Application Priority Data

Mar. 15, 2010 (JP) .................................. 2010-057606

(51) Int. Cl.
*H01L 33/62* (2010.01)
*H01L 51/56* (2006.01)
*H01L 51/00* (2006.01)
*C09B 57/00* (2006.01)
*H01L 51/50* (2006.01)

(52) U.S. Cl.
CPC ............ *H01L 51/56* (2013.01); *H01L 51/0029* (2013.01); *C09B 57/008* (2013.01); *H01L 51/006* (2013.01); *H01L 51/0061* (2013.01); *H01L 51/0067* (2013.01); *H01L 51/0072* (2013.01); *H01L 51/0085* (2013.01); *H01L 51/5016* (2013.01); *H01L 51/0003* (2013.01)
USPC ................................ 438/99; 257/40; 257/79

(58) Field of Classification Search
USPC .................. 118/715–733; 156/345.1–345.55; 438/99; 257/40, 79–103, E21.024
See application file for complete search history.

(56) References Cited

U.S. PATENT DOCUMENTS 3,961,018 A * 6/1976 Williamson ................. 423/228
4,530,817 A * 7/1985 Holter et al. ................. 422/122

(Continued)

FOREIGN PATENT DOCUMENTS

JP   10-202153       8/1998
JP   2003-217840 A   7/2003

(Continued)

OTHER PUBLICATIONS

Risk and Exposure Assessment to Support the Review of the SO2 Primary National Ambient Air Quality Standards: Final Report, EPA-452/R-09-007, Jul. 2009.*

(Continued)

*Primary Examiner* — Matthew W Such
*Assistant Examiner* — Stephen C Smith
(74) *Attorney, Agent, or Firm* — Oblon, Spivak, McClelland, Maier & Neustadt, L.L.P.

(57) ABSTRACT

The present invention relates to a method for producing an organic electroluminescence element, comprising an organic layer between an anode and a cathode of the organic electroluminescence element by a wet film-forming method by using a composition containing an organic electroluminescence element material and a solvent in any one environment of the following film formation environments 1 to 3, and drying the formed film: film formation environment 1: a carbon dioxide concentration of 0.7 $g/m^3$ or less and an oxygen concentration of 18 to 22 vol %, film formation environment 2: a sulfur oxide concentration of 2.2 $\mu g/m^3$ or less and an oxygen concentration of 18 to 22 vol %, and film formation environment 3: a nitrogen oxide concentration of 3.1 $\mu g/m^3$ or less and an oxygen concentration of 18 to 22 vol %.

6 Claims, 2 Drawing Sheets

(56) References Cited

U.S. PATENT DOCUMENTS

| | | | |
|---|---|---|---|
| 7,061,011 B2 * | 6/2006 | Forrest et al. ................... | 257/40 |
| 7,168,224 B2 | 1/2007 | Angelopoulos et al. | |
| 8,278,411 B2 * | 10/2012 | Yang et al. ................... | 528/423 |
| 2003/0175414 A1 | 9/2003 | Hayashi | |
| 2008/0003314 A1 | 1/2008 | Ochiai et al. | |
| 2008/0008812 A1 | 1/2008 | Ochiai et al. | |
| 2011/0171447 A1 * | 7/2011 | Krishnamoorthy et al. .. | 428/220 |

FOREIGN PATENT DOCUMENTS

| | | |
|---|---|---|
| JP | 2003-272847 A | 9/2003 |
| JP | 2004-199935 A | 7/2004 |
| JP | 2006-261055 A | 9/2006 |
| JP | 2007-123257 A | 5/2007 |
| JP | 2007-207543 A | 8/2007 |
| JP | 2007-207544 A | 8/2007 |
| JP | 2008-125515 A | 6/2008 |
| JP | 2008-192433 A | 8/2008 |
| JP | 2008-218363 A | 9/2008 |
| JP | 2009-231278 A | 10/2009 |
| JP | 2009-266814 A | 11/2009 |
| WO | WO 2011/074550 A1 | 6/2011 |

OTHER PUBLICATIONS

Regenerative Contamination Control Assembly, EADS Space Transportation Brochure, (date-stamped Jan. 6, 2007 at the Wayback Machine archive).*

Innovative Air Filtration Media, Purafil Corp. from a picture taken Feb. 22, 2010, © 2009 (downloaded from the Wayback Machine on Mar. 25, 2014).*

International Search Report Issued May 24, 2011 in PCT/JP2011/055970 (with English translation).

Office Action issued on Dec. 17, 2013 in the corresponding Japanese Patent Application No. 2013-242804 (with English Translation).

Japanese Office Action issued Mar. 25, 2014, in Japan Patent Application No. 2013-242804 (with English translation).

* cited by examiner

US 8,927,326 B2

ORGANIC ELECTROLUMINESCENCE ELEMENT, PRODUCTION METHOD THEREOF, ORGANIC EL DISPLAY DEVICE, ORGANIC EL LIGHTING, AND APPARATUS FOR PRODUCING ORGANIC ELECTROLUMINESCENCE ELEMENT

CROSS-REFERENCE TO RELATED APPLICATIONS

This application is a Continuation of PCT/JP2011/055970 filed on Mar. 14, 2011. This application is based upon and claims the benefit of priority to Japanese Application No. 2010-057606 filed on Mar. 15, 2010, the contents of which are incorporated herein by reference.

BACKGROUND OF THE INVENTION

1. Technical Field

The present invention relates to a method for producing an organic electroluminescence element, an organic electroluminescence element, an organic EL display device, an organic EL lighting, and an apparatus for producing an organic electroluminescence element.

2. Background Art

Since the announcement by Kodak Corp. of a layer-stacked organic electroluminescence (hereinafter, sometimes simply referred to as "EL") element using a vapor deposition process, aggressive development of an organic EL display or an organic EL lighting is ongoing. An organic EL display or an organic EL lighting is currently being put into practical use.

In such a layer-stacked organic electroluminescence element, plural organic layers (for example, an emitting layer, a hole injection layer, a hole transport layer and an electron transport layer) are provided by stacking the layers between an anode and a cathode. As the method for forming these organic layers, a vacuum vapor deposition process is known. However, in the vacuum vapor deposition process, it is sometimes difficult to obtain a homogeneous defectless thin film, and at the same time, since a long time is required to form plural organic layers, there is a problem to be solved also in view of production efficiency of the element.

In this connection, a technique where plural organic layers of a layer-stacked organic electroluminescence element are formed by a wet film-forming method has been reported. For example, Patent Document 1 describes an organic electroluminescence element having an organic thin film formed using an organic thin film-forming solution obtained by dissolving a low molecular organic material in a solvent.

On the other hand, in the case of forming an organic layer in an organic electroluminescence element by the above-described wet film-forming method, it is generally known that when the film formation is performed in air, characteristics of the obtained organic electroluminescence element are deteriorated.

In this connection, there is disclosed a technique related to production of an organic electroluminescence element for avoiding the deterioration due to air. For example, Patent Documents 2 and 3 describe a method for producing an organic EL element in an inert gas containing moisture or oxygen in not more than a predetermined concentration.

RELATED ART

Patent Document

Patent Document 1: JP-A-2004-199935 (the term "JP-A" as used herein means an "unexamined published Japanese patent application")
Patent Document 2: JP-A-2003-217840
Patent Document 3: JP-A-2006-261055

SUMMARY OF THE INVENTION

Problems that the Invention is to Solve

However, the methods described in Patent Documents 2 and 3 require an environment shielded from oxygen or moisture and therefore, nitrogen purging or the like must be done by using an apparatus such as glove box, which is liable to raise the production cost. Also, particularly in the case of using a large-size substrate or in the case of using a continuous process such as roll-to-roll, productivity can be hardly enhanced.

Taking these problems into consideration, an object of the present invention is to provide a high-efficiency organic electroluminescence element having a long driving life at a low cost while ensuring that in forming an organic layer of the organic electroluminescence element by a wet film-forming method, a special environmental control, for example, by performing nitrogen purging with use of an apparatus such as glove box is not required and deterioration during film formation can be prevented.

Another object of the present invention is to provide a method for producing an organic electroluminescence element, particularly, a method for producing an organic electroluminescence element, including forming an emitting layer by a wet film-forming method, where a high-efficiency organic electroluminescence element having a long driving life is produced with high production efficiency.

Means for Solving the Problems

The present inventors have made intensive studies to attain the above-described objects. Here, in the case of conventionally forming an organic layer by a wet film-forming method, the formation must be performed in an environment from which oxygen or moisture is removed, and for this purpose, a special apparatus such as glove box is required, which is estimated to be a cause incurring a steep rise of the production cost and making it difficult to enhance the production efficiency.

This estimation leads to a presumption that the problems above can be solved when formation of an organic layer by a wet film-forming method is performed in an air environment without using a special apparatus such as glove box.

However, as described in Patent Documents 2 and 3, oxygen or moisture in the film formation environment affects the element characteristics, and it is a common-sense technique of one skilled in the art to block oxygen or moisture.

Then, the present inventors have further made intensive studies, as a result, it has been found that compared with the effect of components such as oxygen and moisture in the film formation environment, the effect of other specific components on the driving life or efficiency of the element is greater. The present invention has been accomplished based on this finding.

That is, the gist of the present invention resides in a method for producing an organic electroluminescence element, an organic electroluminescence element, an organic EL display device, an organic EL lighting, and an apparatus for producing an organic electroluminescence element, which are described below.

[1] A method for producing an organic electroluminescence element having an organic layer between an anode and a cathode, wherein
a step of forming at least one layer contained in the organic layer comprises: a wet film-forming step by using an organic electroluminescence element composition containing an organic electroluminescence element material and a solvent; and a film-drying step of drying the formed film, and
the wet film-forming step is performed in an environment having a carbon dioxide concentration of 0.7 g/m$^3$ or less and an oxygen concentration of 18 to 22 vol %.

[2] A method for producing an organic electroluminescence element having an organic layer between an anode and a cathode, wherein
a step of forming at least one layer contained in the organic layer comprises: a wet film-forming step by using an organic electroluminescence element composition containing an organic electroluminescence element material and a solvent; and a film-drying step of drying the formed film, and
the wet film-forming step is performed in an environment having a sulfur oxide concentration of 2.2 μg/m$^3$ or less and an oxygen concentration of 18 to 22 vol %.

[3] A method for producing an organic electroluminescence element having an organic layer between an anode and a cathode, wherein
a step of forming at least one layer contained in the organic layer comprises: a wet film-forming step by using an organic electroluminescence element composition containing an organic electroluminescence element material and a solvent; and a film-drying step of drying the formed film, and
the wet film-forming step is performed in an environment having a nitrogen oxide concentration of 3.1 μg/m$^3$ or less and an oxygen concentration of 18 to 22 vol %.

[4] A method for producing an organic electroluminescence element having an organic layer between an anode and a cathode, wherein
a step of forming at least one layer contained in the organic layer comprises: a wet film-forming step by using an organic electroluminescence element composition containing an organic electroluminescence element material and a solvent; and a film-drying step of drying the formed film, and
the wet film-forming step is performed in an environment having an oxygen concentration of 18 to 22 vol % and satisfying at least two of the following (1) to (3):
  (1) a carbon dioxide concentration is 0.7 g/m$^3$ or less,
  (2) a sulfur oxide concentration is 2.2 μg/m$^3$ or less, and
  (3) a nitrogen oxide concentration is 3.1 μg/m$^3$ or less.

[5] A method for producing an organic electroluminescence element having an organic layer between an anode and a cathode, wherein
a step of forming at least one layer contained in the organic layer comprises: a wet film-forming step by using an organic electroluminescence element composition containing an organic electroluminescence element material and a solvent; and a film-drying step of drying the formed film, and
the wet film-forming step is performed in an environment having an oxygen concentration of 18 to 22 vol % and an absolute humidity of 15 g/kg (DA) or less, and satisfying at least one of the following (1) to (3):
  (1) a carbon dioxide concentration is 0.7 g/m$^3$ or less,
  (2) a sulfur oxide concentration is 2.2 μg/m$^3$ or less, and
  (3) a nitrogen oxide concentration is 3.1 μg/m$^3$ or less.

[6] The method of producing an organic electroluminescence element as claimed in any one of the items [1] to [5], wherein the layer obtained through the wet film-forming step and the film-drying step is an emitting layer.

[7] The method of producing an organic electroluminescence element as claimed in any one of the items [1] to [6], wherein the layer obtained through the wet film-forming step and the film-drying step is a hole transport layer.

[8] The method of producing an organic electroluminescence element as claimed in any one of the items [1] to [7], wherein the organic electroluminescence element material contains at least one member selected from the group consisting of an organometallic complex, an aromatic amine-based compound and an anthracene derivative.

[9] An organic electroluminescence element obtained by the method of producing an organic electroluminescence element claimed in any one of the items [1] to [8].

[10] An organic EL display device comprising the organic electroluminescence element claimed in the item [9].

[11] An organic EL lighting comprising the organic electroluminescence element claimed in the item [9].

[12] An apparatus for producing an organic electroluminescence element having an organic layer between an anode and a cathode, comprising:
a portion of forming at least one layer contained in the organic layer by a wet film-forming method by using an organic electroluminescence element composition containing an organic electroluminescence element material and a solvent;
a drying portion of drying the film, and
an air purification portion of reducing any one or more of a carbon dioxide concentration, a sulfur oxide concentration and a nitrogen oxide concentration in an atmosphere of the film formation portion.

Advantage of the Invention

According to the present invention, an element ensuring that in forming an organic layer of an organic electroluminescence element by a wet film-forming method, even when the film formation step is performed in an environment containing oxygen or moisture, reduction in the luminescence life is suppressed, can be provided. That is, according to the present invention, a high-efficiency organic electroluminescence element having a long driving life can be produced at a low cost with high production efficiency by not using a special apparatus such as glove box.

MODE FOR CARRYING OUT THE INVENTION

Figure 1:
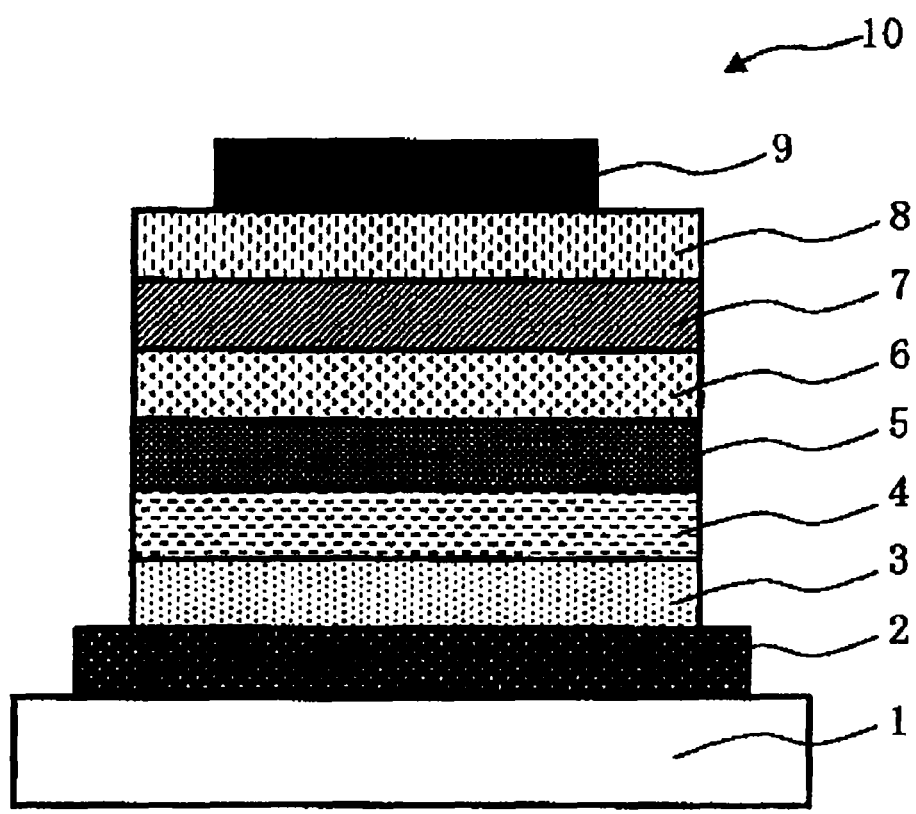
FIG. 1 is a cross-sectional view schematically showing one example of the structure of the organic electroluminescence element of the present invention.

The mode for carrying out the present invention is described in detail below, but the following descriptions of constituent requirements are an example (representative example) of the embodiment of the present invention. The present invention is not limited to these contents as long as its gist is observed.

[1] Production Method of Organic Electroluminescence Element

The production method of an organic electroluminescence element of the present invention is characterized in that in forming an organic layer of an organic electroluminescence element through a film formation step of forming a film by a wet film-forming method by using an organic electroluminescence element composition containing an organic electroluminescence element material and a solvent and a drying step of drying the formed film, the wet film formation is performed in any one environment of the following film formation environments 1 to 3:

film formation environment 1: an environment having a carbon dioxide concentration of 0.7 g/m$^3$ or less and an oxygen concentration of 18 to 22 vol %, film formation environment 2: an environment having a sulfur oxide concentration of 2.2 μg/m$^3$ or less and an oxygen concentration of 18 to 22 vol %, and film formation environment 3: an environment having a nitrogen oxide concentration of 3.1 μg/m$^3$ or less and an oxygen concentration of 18 to 22 vol %.

[Target Organic Layer of Film Formation]

In the production method of an organic electroluminescence element of the present invention, the organic layer formed by wet film formation in an environment of the film formation environments 1 to 3 above may be sufficient if it is an organic layer formed between an anode and a cathode of an organic electroluminescence element, and the organic layer is not particularly limited but is preferably an emitting layer and/or a hole transport layer.

[Film Formation Environment]

The film formation environment according to the present invention is described below.

[About Oxygen]

In the film formation environment according to the present invention, when the carbon dioxide concentration, the sulfur oxide concentration or the nitrogen oxide concentration is controlled, the oxygen concentration can be made to be equal to the concentration of oxygen contained in the air. Therefore, in the film formation environments 1 to 3, the oxygen concentration is from 18 to 22 vol %, similarly to that in the normal air.

That is, in the present invention, by controlling only the carbon dioxide concentration, the sulfur oxide concentration or the nitrogen oxide concentration, a long-life element can be high-efficiently obtained by wet film formation in the air without requiring a special apparatus such as glove box.

[About Carbon Dioxide]

(1) Measuring Method

The carbon dioxide concentration in the environment can be measured, for example, by gas chromatography equipped with a thermal conductivity detector (GC/TCD method). Specifically, the concentration is measured by the following procedure. A gas prepared by mixing an He standard gas containing carbon dioxide in a predetermined concentration and a nitrogen gas at various flow rate ratios is introduced into the GC/TCD apparatus, and the gas chromatograph is measured. A calibration curve of the amount of carbon dioxide and the signal strength of GC/TCD is formed. Subsequently, a gas to be measured is trapped in a predetermined amount of, for example, 0.5 cm$^3$ in a syringe having a cock at its tip and then introduced into the apparatus above, and GC/TCD measurement is performed. The amount of carbon dioxide in the gas of 0.5 cm$^3$ is calculated from the calibration curve, whereby the carbon dioxide concentration is quantitatively determined. As the GC/TCD apparatus, for example, "GC-2010" manufactured by Shimadzu Corporation can be used. Incidentally, the carbon dioxide concentration in Examples later is a value measured also by this method. The detection limit of carbon dioxide concentration in this method is 0.04 g/m$^3$. As long as the same measurement as in the apparatus above can be performed, other apparatuses may be used for the GC/TCD measurement.

(2) Reason to Control Carbon Dioxide Concentration

Carbon dioxide is usually contained in the air in an amount of approximately from 0.5 to 1.0 g/m$^3$. In the present invention, the carbon dioxide concentration in the film formation environment is set to be not more than the predetermined value for the following reason.

Carbon dioxide is known to react with moisture in the air and become carbonate ion. It is estimated that commingling of this carbonate ion in the organic layer of an organic electroluminescence element causes quenching of the charge migrating in the organic layer and the change of carrier balance in the organic layer due to the quenching leads to reduction in the efficiency or lifetime of the organic electroluminescence element.

Accordingly, in order to avoid production of such a quencher, it is considered to be necessary to decrease carbon dioxide in the film formation environment.

(3) Carbon Dioxide Concentration

In the film formation environment 1, the carbon dioxide concentration in the film formation environment is preferably lower, because inhibition of the charge transfer in the organic layer can hardly occur to deteriorate the characteristics of the organic electroluminescence element. Specifically, the carbon dioxide concentration in the film formation environment is, as the value measured by the above-described measuring method, usually 0.7 g/m$^3$ or less, preferably 0.5 g/m$^3$ or less. Also, since lower is better, the carbon dioxide concentration in the film formation environment has no particular lower limit, but the lower limit is usually 0.00004 g/m$^3$.

[About Sulfur Oxide]

(1) Measuring Method

The sulfur oxide in the environment is derived from fossil fuel burning, volcanic gas or the like, and the sulfur oxide concentration can be measured, for example, by ion chromatography. Incidentally, the sulfur oxide is a generic term for oxides of sulfur, such as sulfur monoxide, sulfur dioxide and sulfur trioxide. Specifically, the quantitative determination of the sulfur oxide concentration can be performed by trapping a gas to be measured in water at 1.5 L/min for 1 hour and analyzing it by an ion chromatographic analyzer, "Model DX500" (manufactured by DIONEX). The sulfur oxide concentration in Examples later is a value measured also by this method. The detection limit of the sulfur oxide concentration in this method is 0.1 μg/m$^3$. As long as the same measurement as in the apparatus above can be performed, the measurement of sulfur oxide concentration may be performed by using other apparatuses.

(2) Reason to Control Sulfur Oxide Concentration

Sulfur oxide is usually contained in the air in an amount of approximately from 50 to 1,700 μg/m$^3$. In the present invention, the sulfur oxide concentration in the environment is set to be not more than the predetermined value for the following reason.

Sulfur oxide is known to react with moisture in the air and become sulfuric acid that is a strong oxidizing agent. Also, sulfur dioxide and sulfur trioxide, which are a kind of a sulfur oxide, function as a reducing agent and an oxidizing agent, respectively. In turn, it is estimated that the organic compound constituting an organic electroluminescence element is oxidized or reduced by the action of the oxidizing agent or reducing agent and the characteristics of the organic compound, such as ionization potential, electron affinity and carrier mobility, are changed, leading to reduction in the lifetime and efficiency of the organic electroluminescence element.

Also, it is estimated that commingling of an acid such as sulfuric acid in the organic layer of an organic electroluminescence element causes quenching of the charge migrating in the organic layer and the change of carrier balance in the organic layer due to the quenching leads to reduction in the efficiency or lifetime of the organic electroluminescence element.

Accordingly, in order to avoid production of a quencher due to such change in quality of the organic compound or commingling of an acid, it is considered to be necessary to decrease sulfur oxide in the environment.

(3) Sulfur Oxide Concentration

In the film formation environment 2, the sulfur oxide concentration in the film formation environment is preferably lower, because change in quality of the organic layer or inhibition of the charge transfer in the organic layer can hardly occur to deteriorate the characteristics of the organic electroluminescence element. Specifically, the sulfur oxide concentration in the film formation environment is, as the value measured by the above-described measuring method, usually 2.2 $\mu g/m^3$ or less, preferably 1.2 $\mu g/m^3$ or less. Also, since lower is better, the sulfur oxide concentration in the film formation environment has no particular lower limit, but the lower limit is usually 0.0001 $\mu g/m^3$.

[About Sulfur Oxide]

(1) Measuring Method

The nitrogen oxide in the environment is derived from fossil fuel burning. Incidentally, the nitrogen oxide is a generic term for oxides of nitrogen, such as nitrogen monoxide (NO), nitrogen dioxide ($NO_2$), nitrous oxide (dinitrogen monoxide) ($N_2O$), dinitrogen trioxide ($N_2O_3$), dinitrogen tetroxide ($N_2O_4$) and dinitrogen pentoxide ($N_2O_5$). The nitrogen oxide concentration can be measured, for example, by ion chromatography. Specifically, the quantitative determination of the nitrogen oxide concentration in the gas can be performed by trapping a gas to be measured in water at 1.5 L/min for 1 hour and analyzing it by an ion chromatographic analyzer, "Model DX500" (manufactured by DIONEX). The nitrogen oxide concentration in Examples later is a value measured also by this method. The detection limit of the nitrogen oxide concentration in this method is 0.1 $\mu g/m^3$.

As long as the same measurement as in the apparatus above can be performed, the measurement of nitrogen oxide concentration may be performed by using other apparatuses.

(2) Reason to Control Nitrogen Oxide

Nitrogen oxide is usually contained in the air in an amount of approximately from 70 to 5,400 $\mu g/m^3$. In the present invention, the nitrogen oxide concentration in the environment is set to be not more than the predetermined value for the following reason.

Nitrogen oxide is known to react with moisture in the air and become nitric acid that is a strong oxidizing agent. It is estimated that the organic compound constituting an organic electroluminescence element is oxidized by the action of the oxidizing agent and the peculiar characteristics of the organic compound, such as ionization potential, electron affinity and carrier mobility, are changed, leading to reduction in the lifetime and efficiency of the organic electroluminescence element.

Also, it is estimated that commingling of nitrogen dioxide, which is a kind of a nitrogen oxide and is a radical molecule having an asymmetric electrons, in the organic layer of an organic electroluminescence element causes quenching of the charge migrating in the organic layer and the change of carrier balance in the organic layer due to the quenching leads to reduction in the efficiency or lifetime of the organic electroluminescence element.

Accordingly, in order to avoid production of a quencher due to such change in quality of the organic compound or commingling of an acid, it is considered to be necessary to decrease nitrogen oxide in the environment.

(3) Nitrogen Oxide Concentration

In the film formation environment 3, the nitrogen oxide concentration in the film formation environment is preferably lower, because change in quality of the organic layer or inhibition of the charge transfer in the organic layer can hardly occur to deteriorate the characteristics of the organic electroluminescence element. Specifically, the nitrogen oxide concentration in the film formation environment is, as the value measured by the above-described measuring method, usually 3.1 $\mu g/m^3$ or less, preferably 2.5 $\mu g/m^3$ or less. Also, since lower is better, the nitrogen oxide concentration in the film formation environment has no particular lower limit, but the lower limit is usually 0.0001 $\mu g/m^3$.

Incidentally, the wet film formation environment according to the present invention may be sufficient if it satisfies at least one of the film formation environments 1 to 3. The wet film formation environment according to the present invention preferably satisfies at least any two of the film formation environments 1 to 3, more preferably satisfies all three of the film formation environments 1 to 3.

{Means for Preparing Film Formation Environment}

The wet film formation environment according to the present invention is prepared by reducing the carbon dioxide concentration, the sulfur oxide concentration and/or the nitrogen oxide concentration in the environment and can be prepared, for example, by removing carbon dioxide, sulfur oxide and/or nitrogen oxide from the air. The environment may be also prepared by mixing oxygen with an inert gas such as nitrogen and argon.

{Means for Reducing Carbon Dioxide Concentration/Sulfur Oxide Concentration/Nitrogen Oxide Concentration}

The method for reducing the carbon dioxide concentration, the sulfur oxide concentration and the nitrogen oxide concentration in the environment includes, for example, methods using a chemical filter, an activated carbon or water. One of these methods may be used alone, or two or more thereof may be used in arbitrary combination and an arbitrary order.

Definition, specific examples, reason for suitability, and the like of each means are described below.

(1) Chemical Filter

The chemical filter for use in the present invention has a function of removing specific components such as dust and inorganic gas component from the gas. In the chemical filter, an activated carbon to which a component capable of removing specific gas components, or a material having adsorption function, such as activated alumina, is usually used.

The chemical filter is not particularly limited as long as the effects of the present invention are not impaired. Examples of the chemical filter include CHEMICALGUARD (produced by Nichias Corp.), PureLite (produced by Nippon Puretec Co., Ltd.), Puresmell (produced by Nippon Muki Co., Ltd.), and TIOS (produced by Takasago Thermal Engineering Co., Ltd.).

The chemical filter usually has high air permeability and high ability of adsorbing and trapping gaseous impurity components and furthermore, is inexpensive and easily available. In terms of these points, a chemical filter is preferably used in the present invention so as to create the film formation environments 1 to 3.

(2) Activated Carbon

The activated carbon for use in the present invention is a carbon having a large number of micropores. For the purpose of separation, removal, purification and the like of certain specific substances, the activated carbon for use in the present invention usually has a large number of micropores of 1 to 20 nm formed by applying a chemical or physical treatment so as to enhance the adsorption ability. Out of constituent substances of the activated carbon for use in the present invention, 90% or more is usually carbon.

The activated carbon is not particularly limited as long as the effects of the present invention are not impaired, but examples thereof include SHIRASAGI (produced by Japan EnviroChemicals, Ltd.), KURARAY COAL (produced by Kuraray Chemical Co., Ltd.), CALGON (produced by Calgon Mitsubishi Chemical Corporation) and activated carbon (produced by Futamura Chemical Co., Ltd. The activated carbon usually effects physical adsorption and therefore, the adsorption rate is high and less likely to depend on the flow velocity of air introduced. Also, once used activated carbon can be reused and moreover, the activated carbon is easily available at a low cost. In terms of these points, an activated carbon is preferably used in the present invention so as to create the film formation environments 1 to 3.

(3) Water

Water used for reducing the carbon dioxide concentration, the sulfur oxide concentration and the nitrogen oxide concentration in the environment is not particularly limited. From the standpoint that carbon dioxide, sulfur oxide, nitrogen oxide and the like are easily removed, for example, desalted water, water passed through an ion exchange resin, pure water, and ultrapure water are preferred.

In the case of using water, the desired effect is obtained, for example, by a method of passing air through water, or a method of spraying water on air during flowing and thereby bringing air and water into countercurrent contact.

Among the means above, it is particularly preferred in the present invention to use a chemical filter.

In the present invention, air that is supplied to the film formation environment is passed through, for example, such a chemical filter, an activated carbon-packed layer, a water layer, or air purification means composed of a combination thereof to reduce any one or more of the carbon dioxide concentration, the sulfur oxide concentration and the nitrogen oxide concentration in the air and then fed to the film formation environment for an organic layer, whereby the film formation environments 1 to 3 can be realized.

In this case, the feed rate of air (air quantity) fed to the air purification means is not particularly limited as long as the effects of the present invention are not impaired, but usually, the feed rate is preferably from 0.1 to 1.0 m/s. The feed rate in this range is preferred, because the target components in air are liable to be sufficiently removed by the air purification means.

{About Other Items in Environment}

The wet film formation environment in the present invention is sufficient if the carbon dioxide, the sulfur oxide concentration or the nitrogen oxide concentration is controlled as described above, and other items in the environment are not particularly limited. However, the moisture content is preferably smaller in view of difficulty in causing dew condensation and is preferably larger in view of difficult in generating static electricity. Accordingly, the water content is, in terms of absolute humidity, preferably 15 g/kg (DA) or less, particularly 12 g/kg (DA) or less, more particularly 9 g/kg (DA) or less, and 2 g/kg (DA) or more, particularly 4 g/kg (DA) or more, more particularly 5 g/kg (DA) or more. The measurement of humidity can be performed by using various hygrometers.

[Organic Electroluminescence Element Composition]

The organic electroluminescence element composition used for the formation of an organic layer by the wet film-forming method is described below.

The organic electroluminescence element composition usually contains an organic electroluminescence element material and a solvent.

The organic electroluminescence element material used for the organic electroluminescence element composition is appropriately selected according to the kind of the organic layer deposited by the wet film-forming method. The material preferably used for forming an emitting layer or a hole transport layer as the organic layer is described below.

{Emitting Layer Material}

Examples of the emitting layer material include an organometallic complex, an aromatic amine-based compound, and an anthracene derivative.

In the present invention, when the organic electroluminescence element material is an emitting layer material, that is, when the organic electroluminescence element composition is a composition for emitting layer, great effects are obtained particularly by employing the configuration of the present invention, and the reason therefor is presumed as follows.

The organic electroluminescence element has an emitting layer between an anode and a cathode and emits light by an energy in the emitting layer particularly when the emitting layer material returns to the ground state from the excited state. This means that a molecule in an excited state is always present in the emitting layer of an organic electroluminescence element. Here, it is presumed that when sulfur oxide or nitrogen oxide exists in the emitting layer, the oxide deteriorates the emitting layer material by oxidation or reduction. Also, it is presumed that when carbon dioxide, sulfur oxide or nitrogen oxide exists in the emitting scent layer, the charge is quenched and this quenching affects the driving voltage or current efficiency, particularly the drive life. That is, in the present invention, when performing wet film formation by using the emitting layer composition, at least one of the film formation environments 1 to 3 is preferably satisfied.

The organometallic complex, the aromatic amine-based compound and the anthracene derivative, which can be preferably used as a luminescent material, are described below.

<Organometallic Complex>

Examples of the organometallic complex for use in the present invention include a Werner type complex and an organometallic complex, each containing a metal selected from Groups 7 to 11 of the long period-type periodic table (hereinafter, unless otherwise specified, the "periodic table" indicates the long period-type periodic table) as the central metal.

Preferred examples of the metal selected from Groups 7 to 11 of the periodic table include ruthenium, rhodium, palladium, silver, rhenium, osmium, iridium, platinum and gold. Among these, iridium and platinum are more preferred.

The ligand of the complex is preferably a ligand where a (hetero)aromatic is coupled with pyridine, pyrazole, phenanthroline or the like, such as (hetero)arylpyridine ligand and (hetero)arylpyrazole ligand. In particular, phenylpyridine ligand and phenylpyrazole ligand are preferred. Here, the (hetero)aryl indicates an aromatic or heteroaromatic group.

Specific examples of the organometallic complex include tris(2-phenylpyridine)iridium, tris(2-phenylpyridine)ruthenium, tris(2-phenylpyridine)palladium, bis(2-phenylpyridine)platinum, tris(2-phenylpyridine)osmium, tris(2-phenylpyridine)rhenium, octaethyl platinum porphyrin, octaphenyl platinum porphyrin, octaethyl palladium porphyrin and octaphenyl palladium porphyrin.

Out of organometallic complexes, the phosphorescent organometallic complex is preferably a compound represented by the following formula (III) or (IV):

$$ML_{(q-j)}L'_j \quad (III)$$

(wherein M represents a metal, q represents the valence of the metal, each of L and L' represents a bidentate ligand, and j represents a number of 0, 1 or 2).

[Chem. 1]

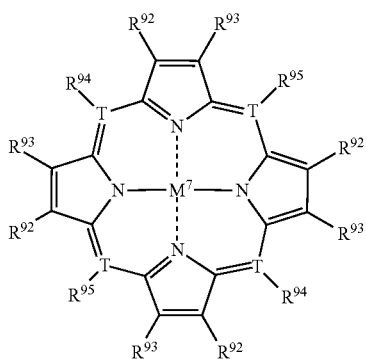

(IV)

(wherein $M^7$ represents a metal, T represents a carbon atom or a nitrogen atom, and each of $R^{92}$ to $R^{95}$ independently represents a substituent, provided that when T is a nitrogen atom, $R^{94}$ and $R^{95}$ are not present).

The compound represented by formula (III) is described below.

In formula (III), M represents an arbitrary metal, and specific preferred examples of M include the metals described above as the metal selected from Groups 7 to 11 of the periodic table.

Also, in formula (III), the bidentate ligand L indicates a ligand having the following partial structure:

[Chem. 2]

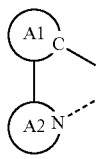

L

In the partial structure of L above, the ring A1 represents an aromatic ring group which may have a substituent. The aromatic ring group as used herein indicates an aromatic hydrocarbon group or an aromatic heterocyclic group.

The aromatic hydrocarbon group includes, for example, a group derived from a 5- or 6-membered monocyclic ring or a 2- to 5-fused ring. The term "group derived from" as used in the present invention indicates a group obtained by removing one or more hydrogen atoms from the original structure. For example, the "group derived from" a benzene ring indicates a group obtained by removing one or more hydrogen atoms of a benzene ring, such as phenyl group and phenylene group.

Specific examples of the aromatic hydrocarbon group include a monovalent group derived from a benzene ring, a naphthalene ring, an anthracene ring, a phenanthrene ring, a perylene ring, a tetracene ring, a pyrene ring, a benzopyrene ring, a chrysene ring, a triphenylene ring, an acenaphthene ring, a fluoranthene ring or a fluorene ring.

The aromatic heterocyclic group includes a group derived from a 5- or 6-membered monocyclic ring or a 2- to 4-fused ring.

Specific examples thereof include a monovalent group derived from a furan ring, a benzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a phenanthridine ring, a perimidine ring, a quinazoline ring, a quinazolinone ring or an azulene ring.

In the partial structure of L above, the ring A2 represents a nitrogen-containing aromatic heterocyclic group which may have a substituent.

The nitrogen-containing aromatic heterocyclic group includes a group derived from a 5- or 6-membered monocyclic ring or a 2- to 4-fused ring.

Specific examples thereof include a monovalent group derived from a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a furopyrrole ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a quinoxaline ring, a phenanthridine ring, a benzimidazole ring, a perimidine ring, a quinazoline ring or a quinazolinone ring.

Examples of the substituent which may be substituted on each of the ring A1 and the ring A2 include a halogen atom; an alkyl group; an alkenyl group; an alkoxycarbonyl group; an alkoxy group; an aryloxy group; a dialkylamino group; a diarylamino group; a carbazolyl group; an acyl group; a haloalkyl group; a cyano group; and an aromatic hydrocarbon group.

In formula (III), the bidentate L' indicates a ligand having a partial structure shown below. In the following formulae, "Ph" indicates a phenyl group.

[Chem. 3]

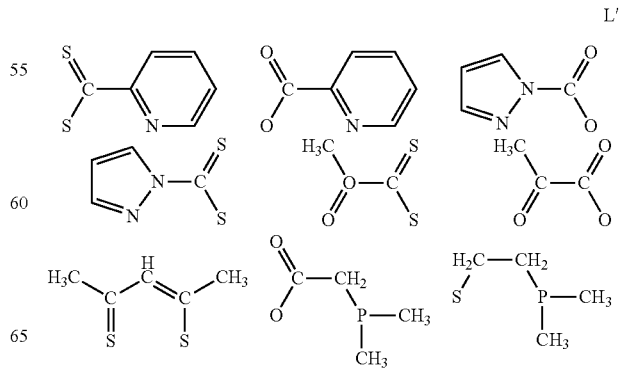

-continued

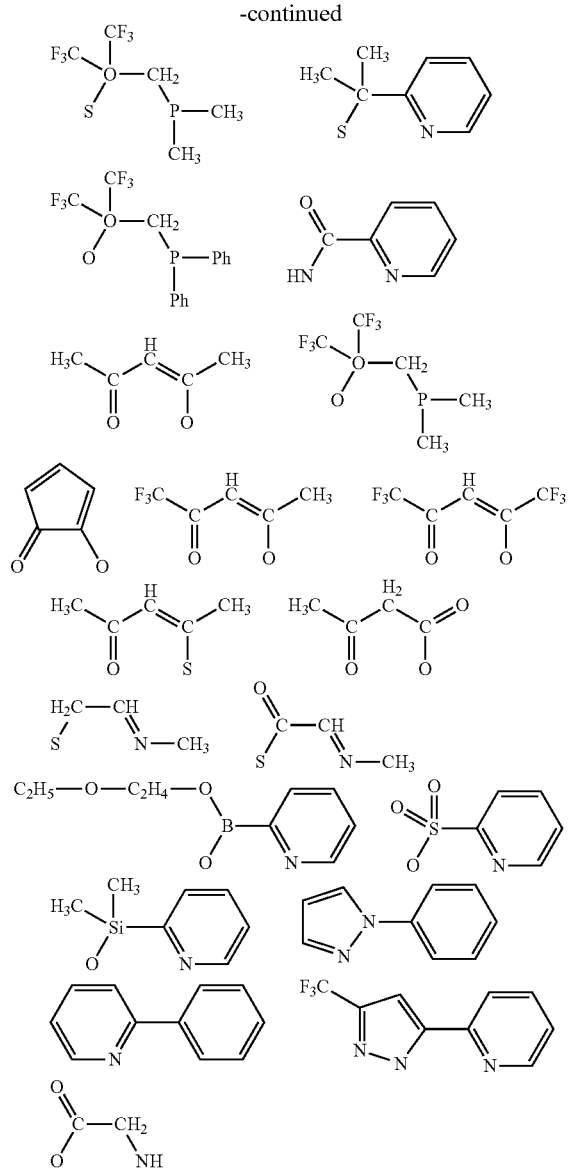

Above all, in view of stability of the complex, L' is preferably a ligand shown below.

[Chem. 4]

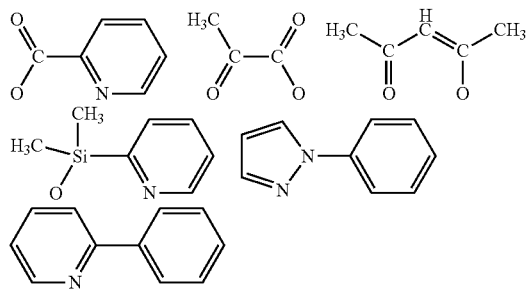

The compound represented by formula (III) is more preferably a compound represented by the following formula (IIIa), (IIIb) or (IIIc):

[Chem. 5]

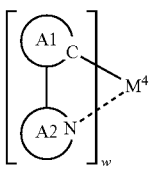
(IIIa)

(wherein $M^4$ represents the same metal as M, w represents the valence of the metal, the ring A1 represents an aromatic ring group which may have a substituent, and the ring A2 represents a nitrogen-containing aromatic heterocyclic group which may have a substituent);

[Chem. 6]

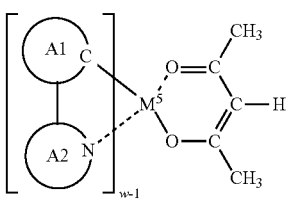
(IIIb)

(wherein $M^5$ represents the same metal as M, w represents the valence of the metal, the ring A1 represents an aromatic ring group which may have a substituent, and the ring A2 represents a nitrogen-containing aromatic heterocyclic group which may have a substituent);

[Chem. 7]

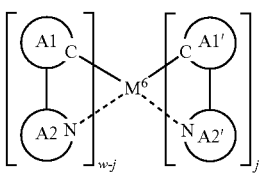
(IIIc)

(wherein $M^6$ represents the same metal as M, w represents the valence of the metal, j represents 0, 1 or 2, each of the ring A1 and the ring A1' independently represents an aromatic ring group which may have a substituent, and each of the ring A2 and the ring A2' independently represents a nitrogen-containing aromatic heterocyclic group which may have a substituent).

In formulae (IIIa) to (IIIc), preferred examples of the ring A1 and the ring A1' include a phenyl group, a biphenyl group, a naphthyl group, an anthryl group, a thienyl group, a furyl group, a benzothienyl group, a benzofuryl group, a pyridyl group, a quinolyl group, an isoquinolyl group and a carbazolyl group.

In formulae (IIIa) to (IIIc), preferred examples of the ring A2 and the ring A2' include a pyridyl group, a pyrimidyl group, a pyrazyl group, a triazyl group, a benzothiazole ring, a benzoxazole ring, a benzimidazole ring, a quinolyl ring, an isoquinolyl group, a quinoxalyl group and a phenanthridyl group.

Examples of the substituent which may be substituted on the compounds represented by formulae (IIIa) to (IIIc)

include a halogen atom; an alkyl group; an alkenyl group; an alkoxycarbonyl group; an alkoxy group; an aryloxy group; a dialkylamino group; a diarylamino group; a carbazolyl group; an acyl group; a haloalkyl group; and a cyano group.

These substituents may combine with each other to form a ring. As a specific example, a substituent on the ring A1 and a substituent on the ring A2 may combine or a substituent on the ring A1' and a substituent on the ring A2' may combine, to form one condensed ring. Examples of such a condensed ring include a 7,8-benzoquinoline group.

Above all, the substituent on the ring A1, the ring A1', the ring A2 and the ring A2' is more preferably an alkyl group, an alkoxy group, an aromatic hydrocarbon group, a cyano group, a halogen atom, a haloalkyl group, a diarylamino group, a carbazolyl group or the like.

Preferred examples of $M^4$ to $M^6$ in formulae (IIIa) to (IIIc) include ruthenium, rhodium, palladium, silver, rhenium, osmium, iridium, platinum and gold.

Specific examples of the organometallic complexes represented by formulae (III) and (IIIa) to (IIIc) are illustrated below, but the organometallic complexes represented by formulae (III) and (IIIa) to (IIIc) are not limited to the following compounds.

[Chem. 8]

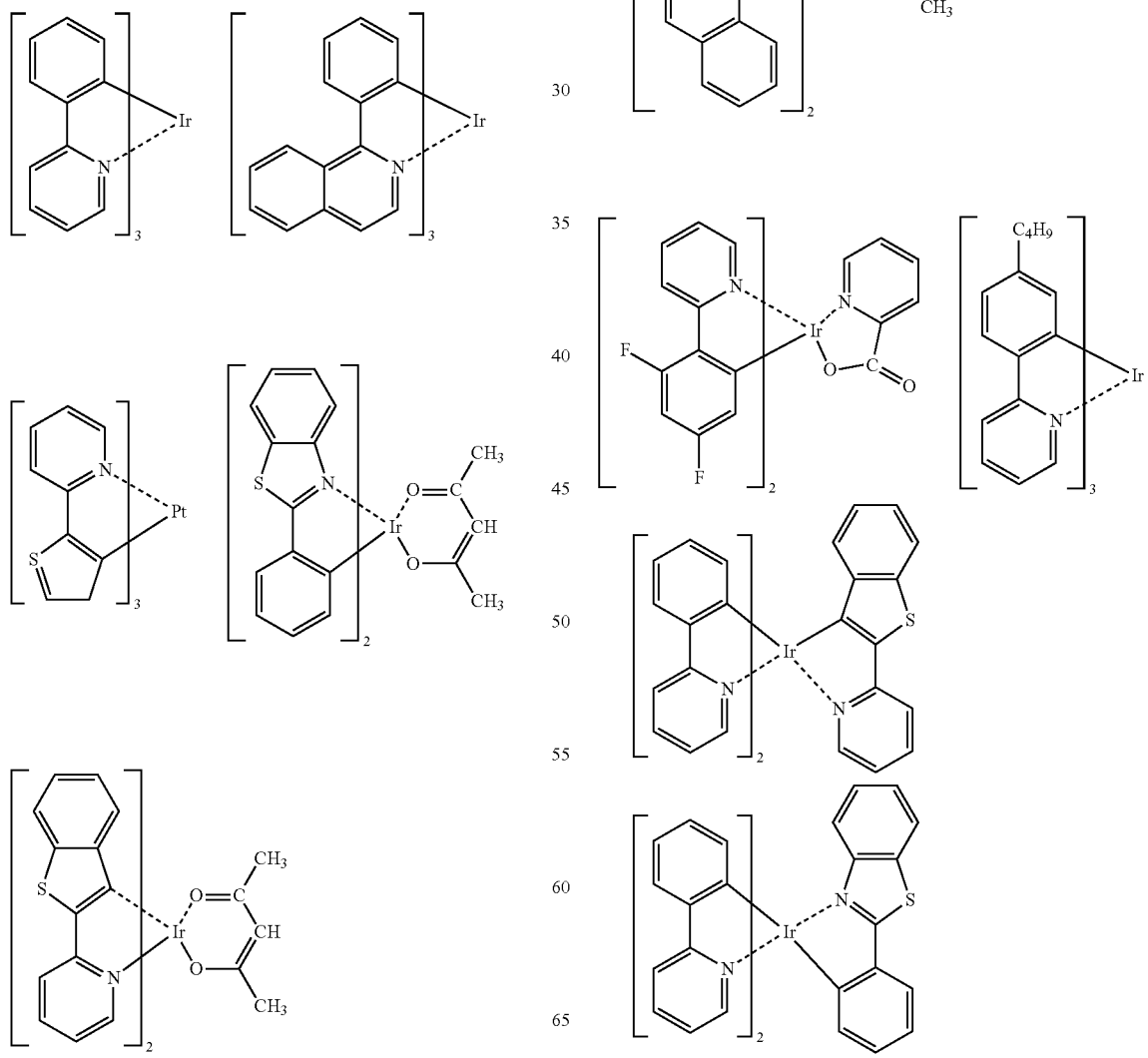

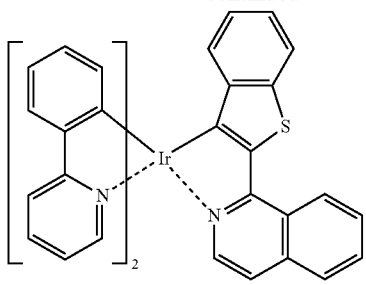
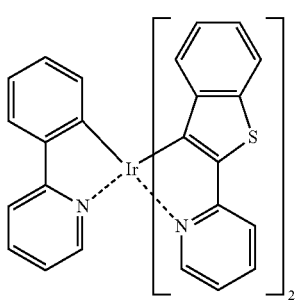
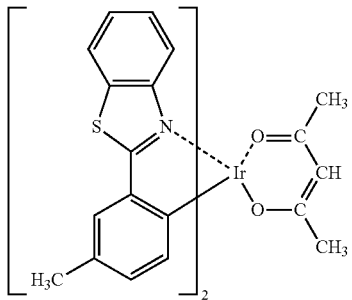
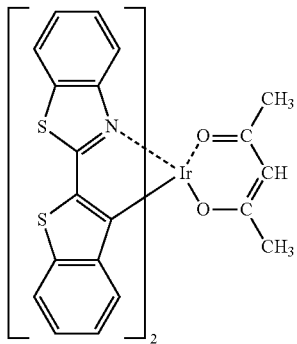
[Chem. 9]
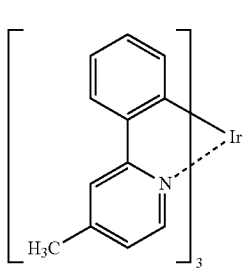
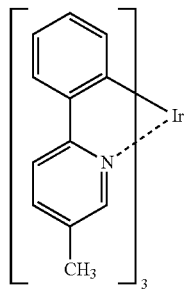
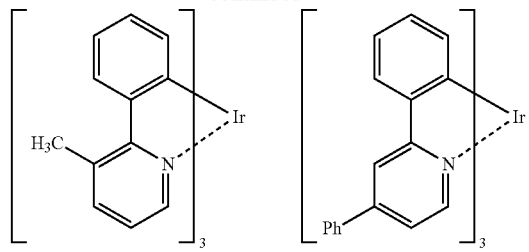
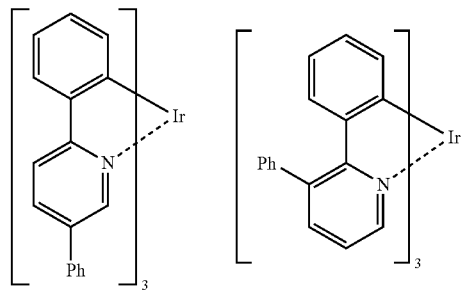
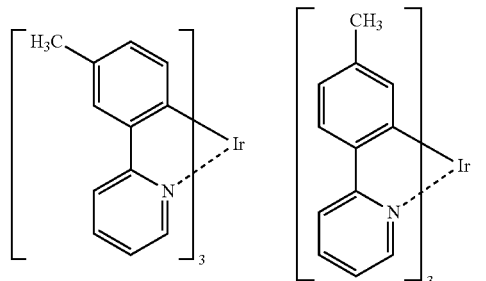
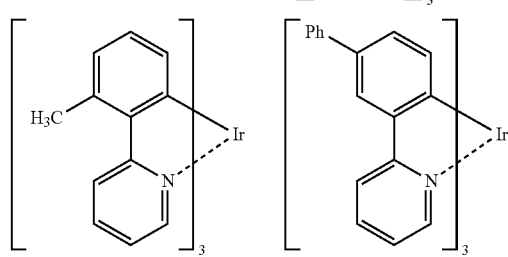
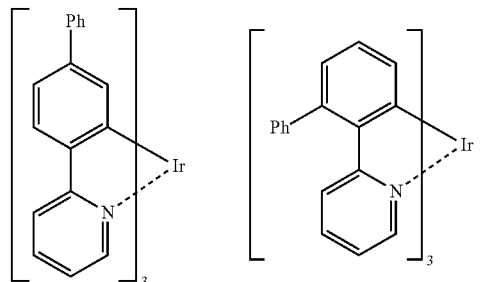
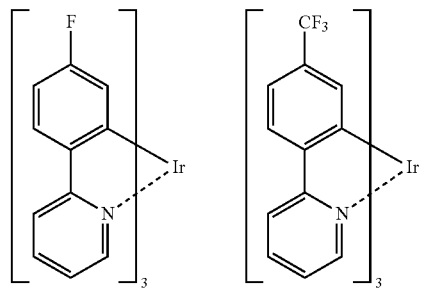

-continued

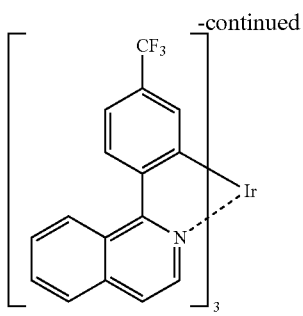

Among the organometallic complexes represented by formula (III), a compound having, as the ligand L and/or L', a 2-arylpyridine-based ligand is preferred. That is, a compound having 2-arylpyridine or having a ligand formed by bonding an optional substituent or fusing an optional group to the ligand above is preferred.

In addition, the compounds described in International Publication No. 2005/019373 may also be used as the emitting layer material.

The compound represented by formula (IV) is described below.

[Chem. 10]

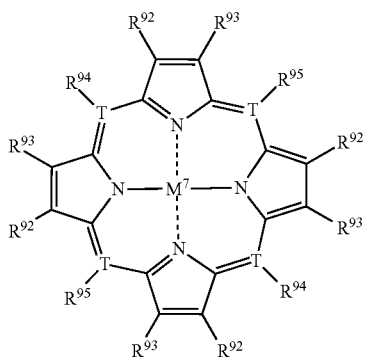

(IV)

In formula (IV), $M^7$ represent a metal. Specific examples of $M^7$ include the above-described metals selected from Groups 7 to 11 of the periodic table. Among these, ruthenium, rhodium, palladium, silver, rhenium, osmium, iridium, platinum and gold are preferred, and a divalent metal such as platinum and palladium is more preferred.

In formula (IV), each of $R^{92}$ and $R^{93}$ independently represents a hydrogen atom, a halogen atom, an alkyl group, an aralkyl group, an alkenyl group, a cyano group, an amino group, an acyl group, an alkoxycarbonyl group, a carboxyl group, an alkoxy group, an alkylamino group, an aralkylamine group, a haloalkyl group, a hydroxyl group, an aryloxy group, an aromatic hydrocarbon group, or an aromatic heterocyclic group.

In the case where T is a carbon atom, each of $R^{94}$ and $R^{95}$ independently represents a substituent whose examples are the same as those for $R^{92}$ and $R^{93}$. Also, when T is a nitrogen atom, $R^{94}$ and $R^{95}$ are not present.

Each of $R^{92}$ to $R^{95}$ may further have a substituent. In the case where each of $R^{92}$ to $R^{95}$ has a substituent, the kind of the substituent is not particularly limited, and an optional group may be used as the substituent.

Two or more members out of $R^{92}$ to $R^{95}$ may combine with each other to form a ring.

Specific examples (T-1, T-10 to T-15) of the organometallic complex represented by formula (IV) are illustrated below, but the organometallic complex represented by formula (IV) is not limited to these illustrated below. In the following chemical formulae, "Me" indicates a methyl group, and Et indicates an ethyl group.

[Chem. 11]

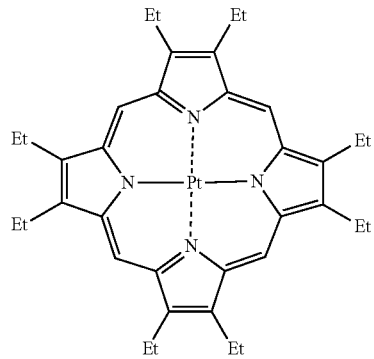
(T-1)

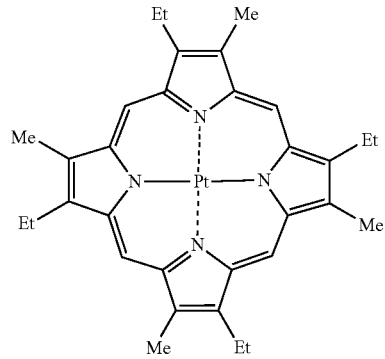
(T-10)

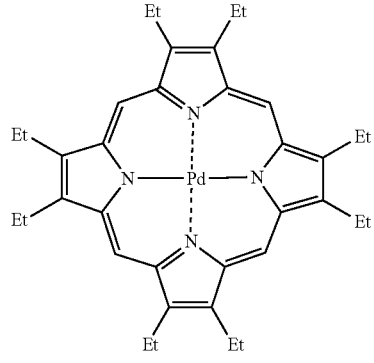
(T-11)

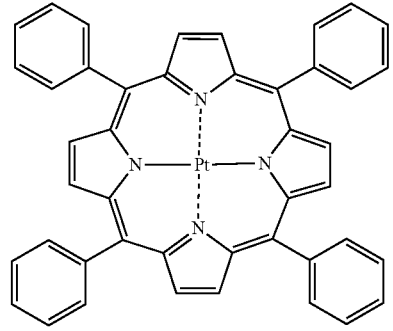
(T-12)

(T-13)

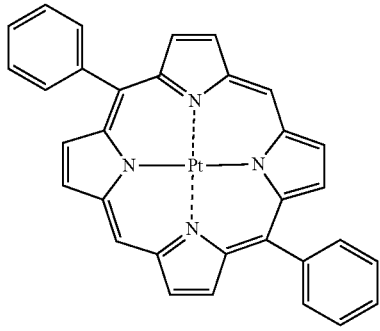

(T-14)

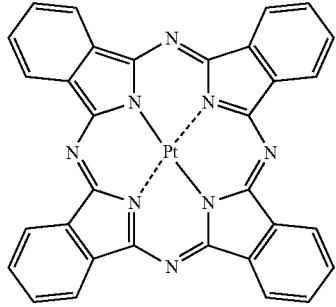

(T-15)

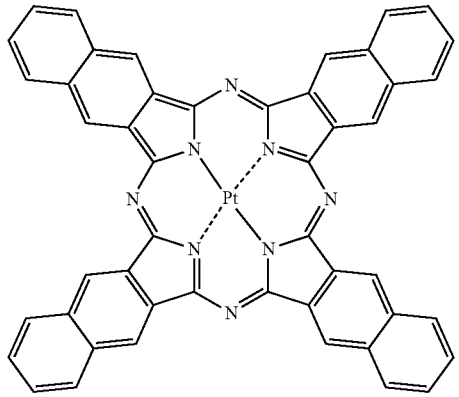

The organometallic complex may have an arbitrary molecular weight as long as the effects of the present invention are not seriously impaired, but the molecular weight is usually 10,000 or less, preferably 5,000 or less, more preferably 4,000 or less, still more preferably 3,000 or less. Also, the molecular weight of the organometallic complex is usually 100 or more, preferably 200 or more, more preferably 300 or more, still more preferably 400 or more. The molecular weight of the organometallic complex is preferably large from the point of view that the heat resistance is excellent, gas generation can hardly occur, the film formed can have excellent film quality, and the organic electroluminescence element is less likely to cause a change in the morphology due to migration or the like. On the other hand, the molecular weight of the organometallic complex is preferably small from the standpoint that the organometallic complex is easy to purify and is readily dissolved in a solvent.

Only one of the above-described organometallic complexes may be used, or two or more thereof may be used in arbitrary combination at an arbitrary ratio.

<Aromatic Amine-Base Compound>

In the present invention, from the standpoint of efficiently trapping a hole in the emitting layer, the aromatic amine-based compound as the emitting layer material is preferably a compound represented by the following formula (A).

[Chem. 12]

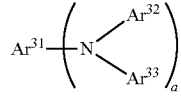

(A)

(wherein $Ar^{31}$ is a group selected from a biphenyl group, a terphenyl group, a stilbene group and a distyryl aromatic group, each of $Ar^{32}$ and $Ar^{33}$ is independently a hydrogen atom or an aromatic ring group having a carbon number of 6 to 20, $Ar^{31}$, $Ar^{32}$ and $Ar^{33}$ may have a substituent, and a is an integer of 1 to 4).

The aromatic ring group as used herein indicates an aromatic hydrocarbon group or an aromatic heterocyclic group. Also, at least either one of $Ar^{32}$ and $Ar^{33}$ is preferably substituted with a styryl group.

Examples of the aromatic ring group having a carbon number of 6 to 20 include an aromatic hydrocarbon group such as phenyl group, naphthyl group, anthranyl group, phenanthryl group and terphenyl group.

As the aromatic amine-based compound used as the host material of the emitting layer, from the standpoint of efficiently trapping a hole in the emitting layer, a compound represented by the following formula (B) is also preferred:

[Chem. 13]

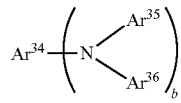

(B)

(wherein $Ar^{34}$ is a substituted or unsubstituted aromatic ring group having from 10 to 40 nuclear carbons, each of $Ar^{35}$ and $Ar^{36}$ is independently a substituted or unsubstituted aromatic ring group having from 5 to 40 nuclear carbons, and b is an integer of 1 to 4).

Examples of the aromatic ring group having from 10 to 40 nuclear carbons as $Ar^{34}$ include a naphthyl group, an anthranyl group, a phenanthryl group, a pyrenyl group, a chrysenyl group, a cholonyl group, a biphenyl group, a terphenyl group, a diphenylanthranyl group, a carbazolyl group, a benzoquinolyl group, a fluoranthenyl group, an acenaphthofluoranthenyl group, and a stilbene group.

Examples of the aromatic ring group having 5 to 40 nuclear carbons of $Ar^{35}$ and $Ar^{36}$ include a phenyl group, a naphthyl group, am anthranyl group, a phenanthryl group, a pyrenyl group, a chrysenyl group, a cholonyl group, a biphenyl group, a terphenyl group, a pyrrolyl group, a furanyl group, a thiophenyl group, a benzothiophenyl group, an oxadiazolyl group, a diphenylanthranyl group, an indolyl group, a carbazolyl group, a pyridyl group, a benzoquinolyl group, a fluoranthenyl group, am acenaphthofluoranthenyl and a stilbene group.

In the case where such an aromatic ring group has a substituent, preferred examples of the substituent include an alkyl group having a carbon number of 1 to 6 (e.g. ethyl, methyl, i-propyl, n-propyl, s-butyl, tert-butyl, pentyl, hexyl, cyclopentyl, cyclohexyl), an alkoxy group having a carbon number of 1 to 6 (e.g. ethoxy, methoxy, i-propoxy, n-propoxy, s-butoxy, tert-butoxy, pentoxy, hexyloxy, cyclopentoxy, cyclohexyloxy), an aromatic ring group having 5 to 40 nuclear atoms, an amino group substituted with an aromatic ring group having 5 to 40 nuclear atoms, an ester group containing an aromatic ring group having 5 to 40 nuclear atoms, an ester group containing an alkyl group having a carbon number of 1 to 6, a cyano group, a nitro group, and a halogen atom.

SPECIFIC EXAMPLES

Specific examples of the aromatic amine-based compound are illustrated below. However, the aromatic amine-based compound according to the present invention is not limited to the following compounds.

[Chem. 14]

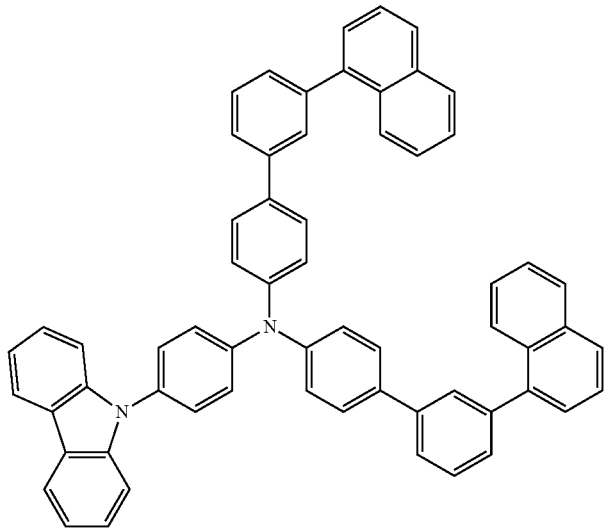

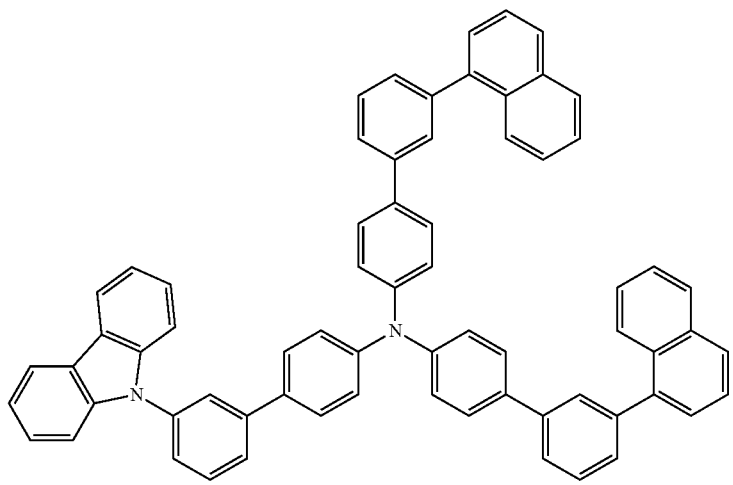

-continued
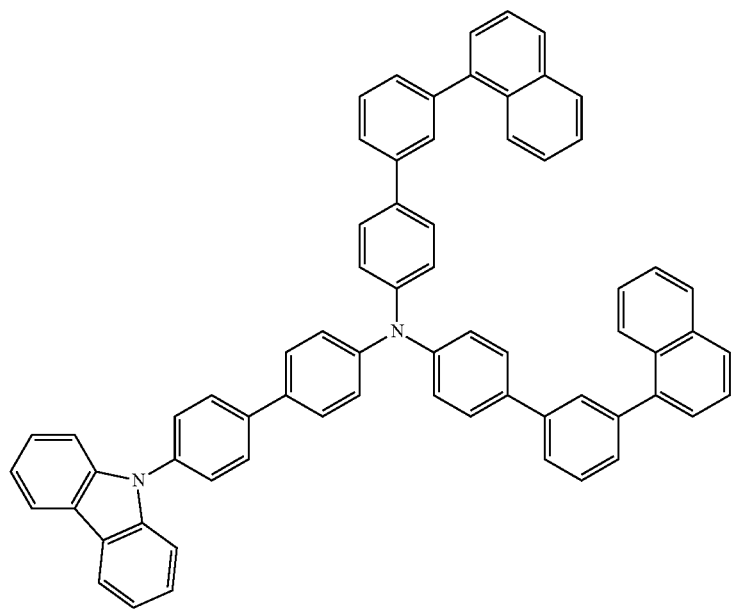
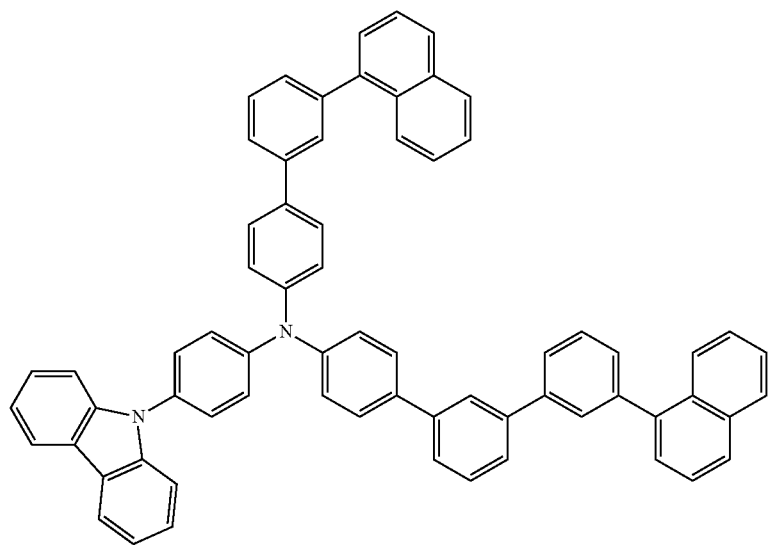
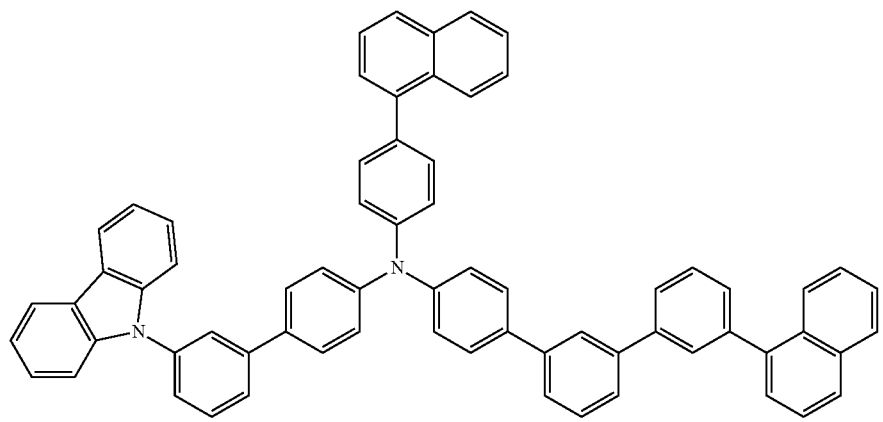

-continued
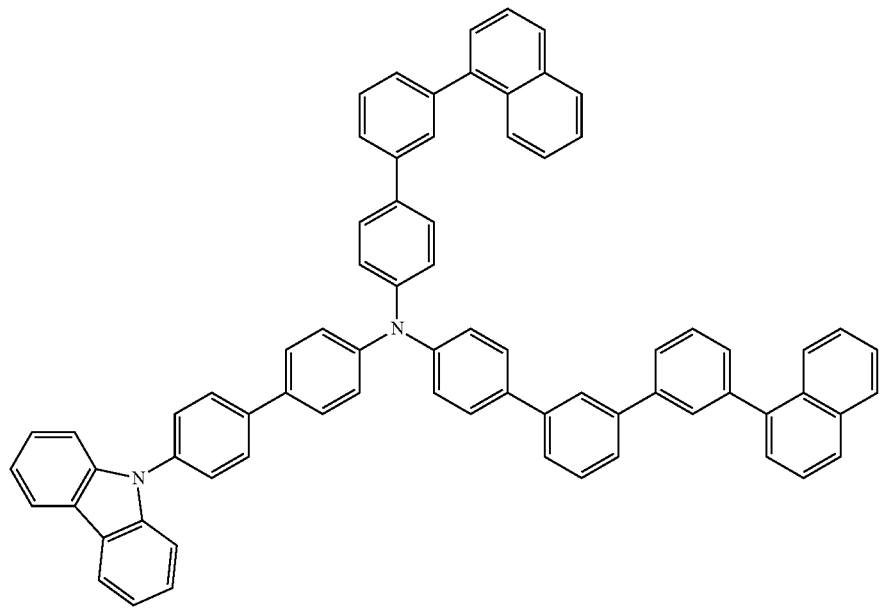
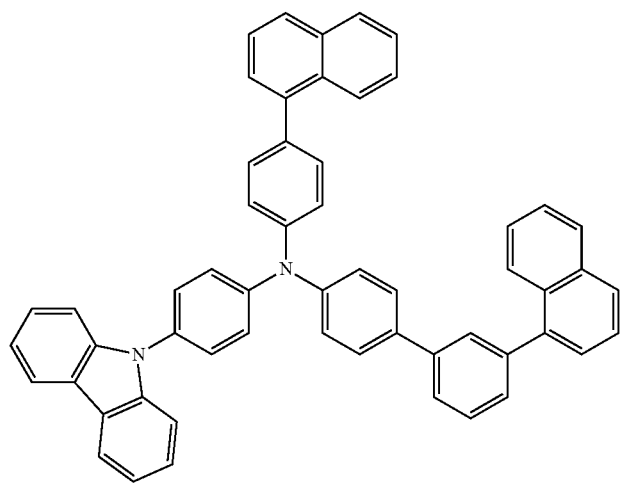
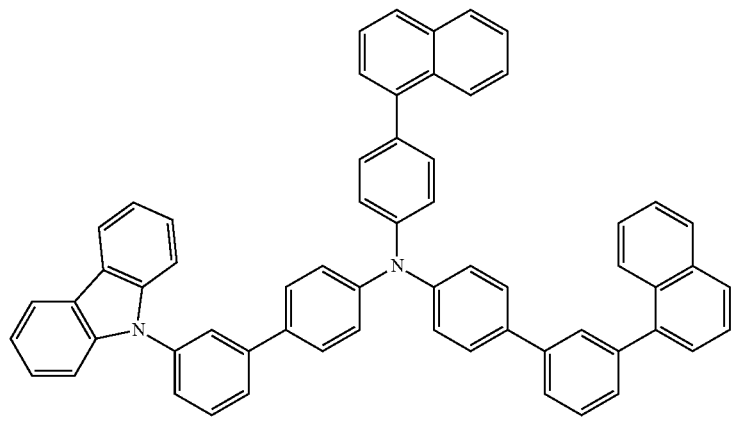

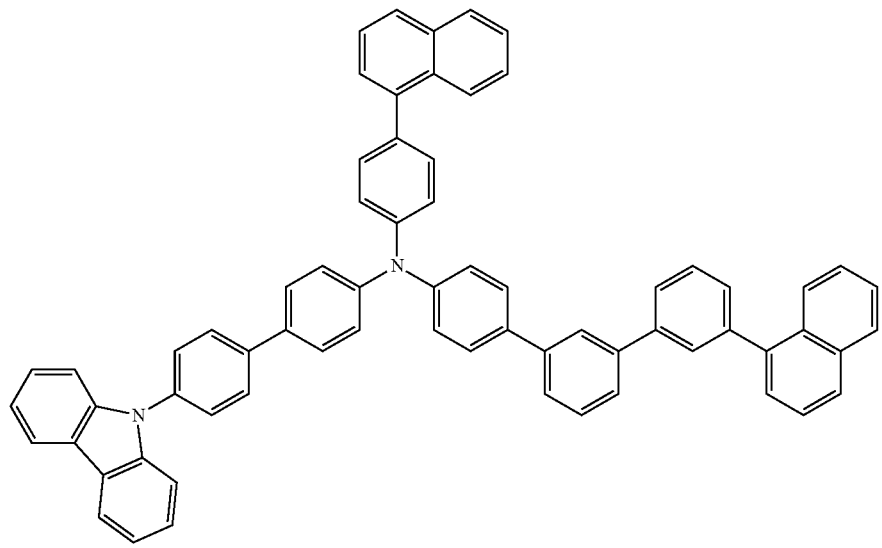
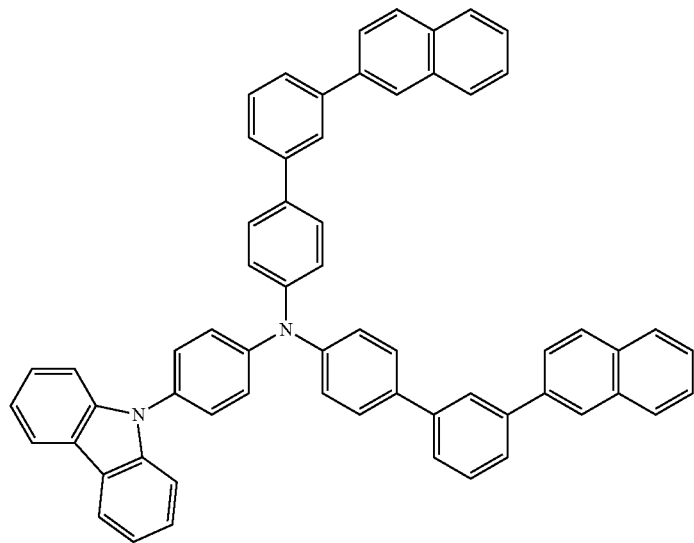
[Chem. 15]
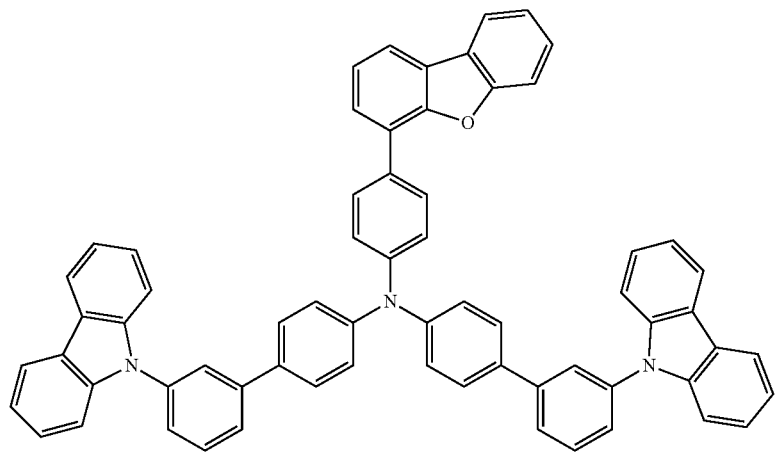

-continued
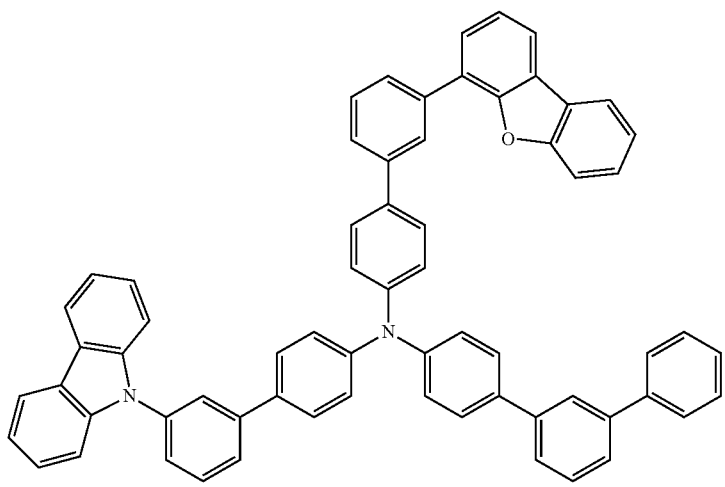
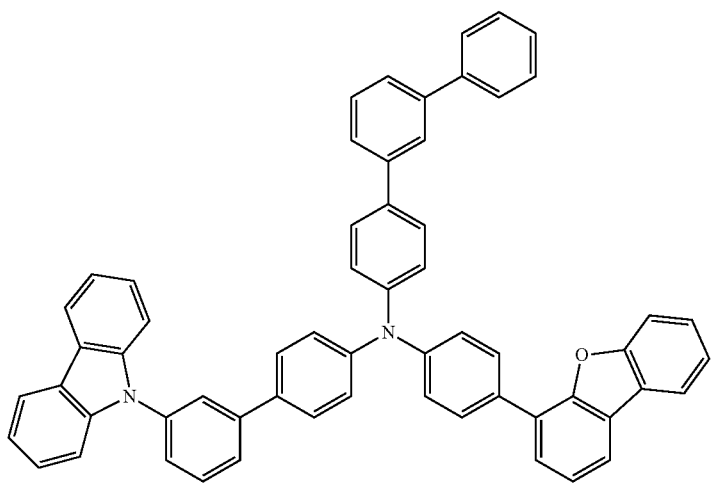
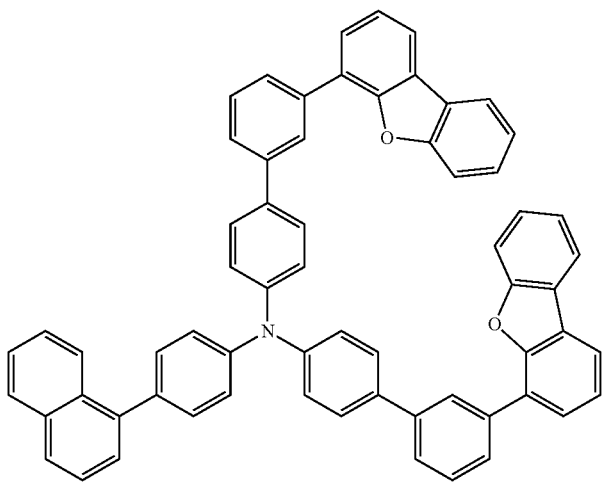

-continued
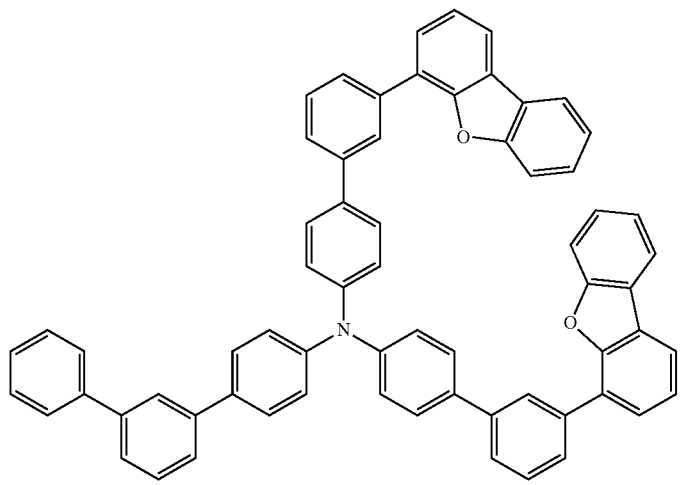
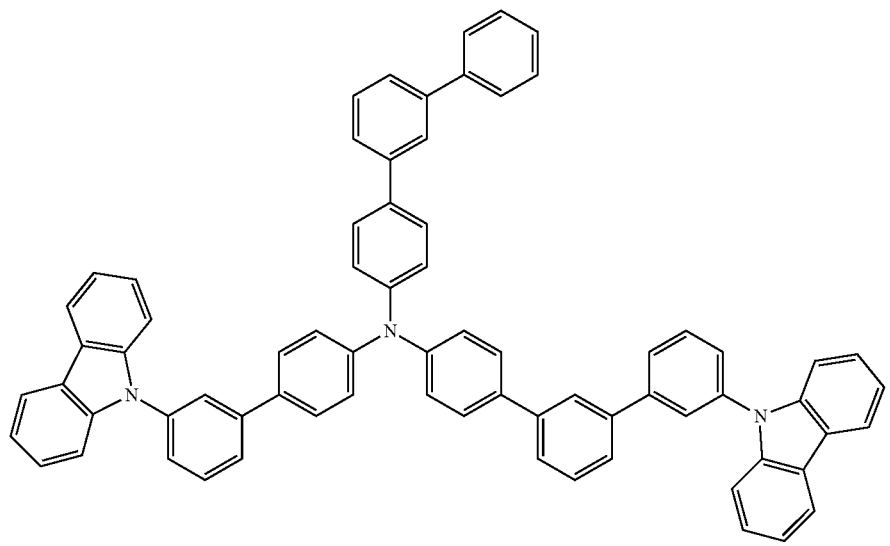
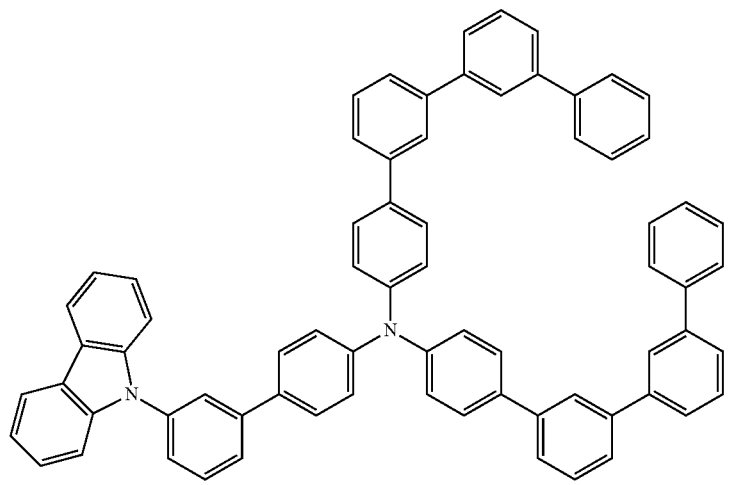

-continued
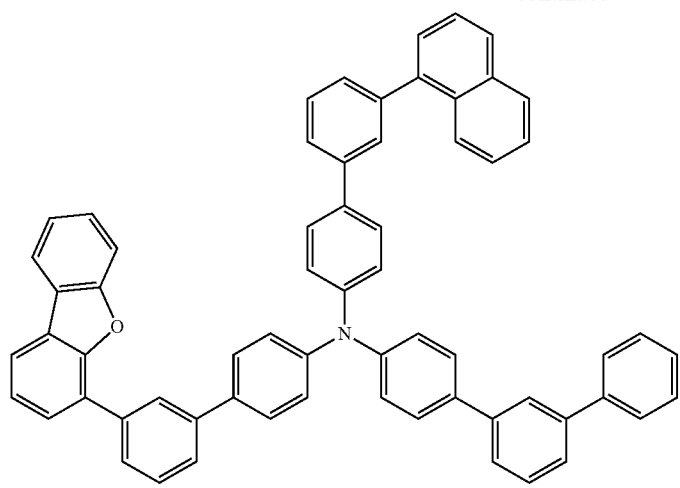
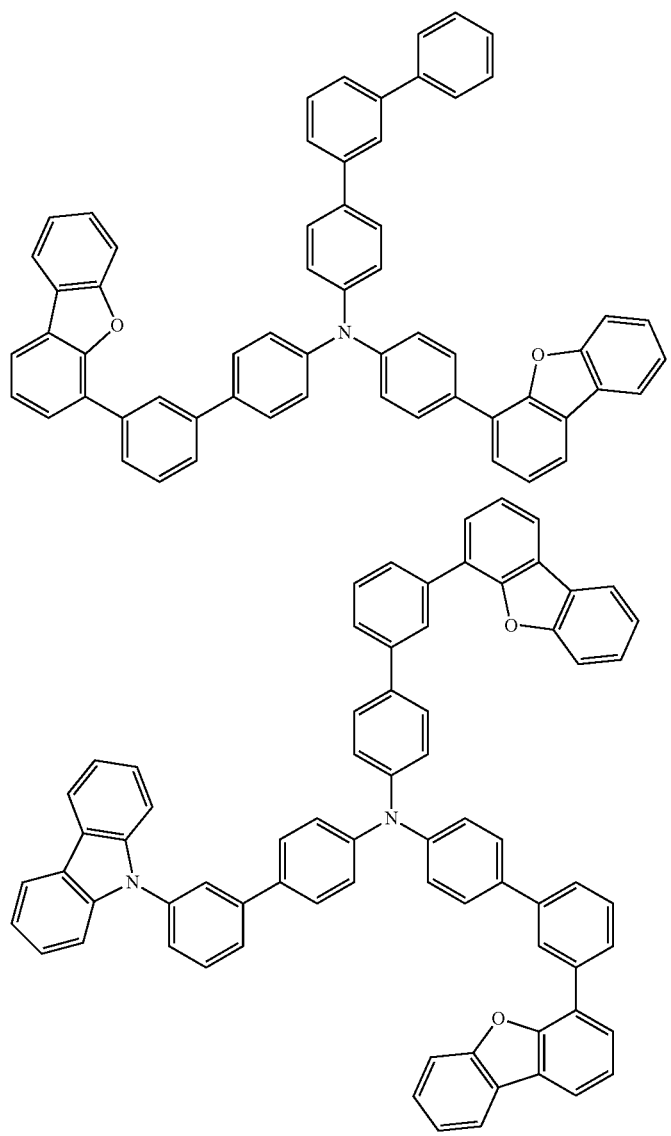

[Chem. 16]
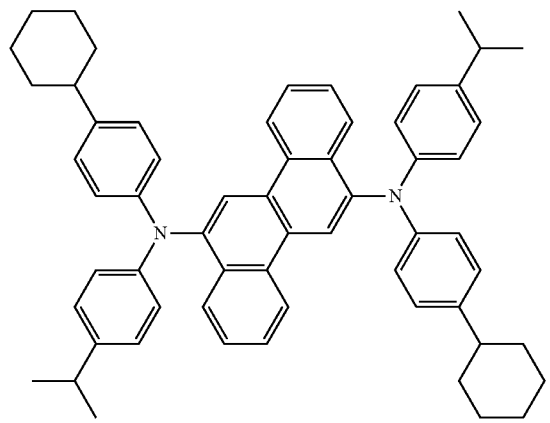
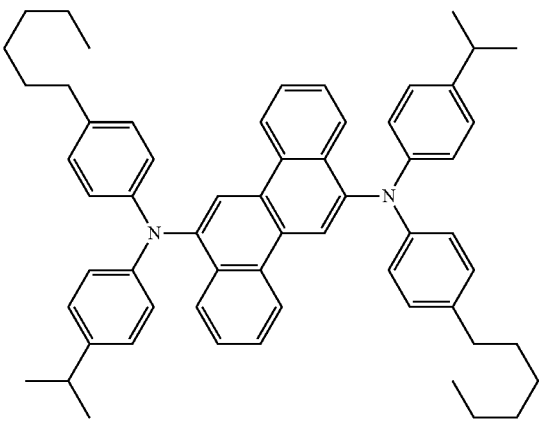
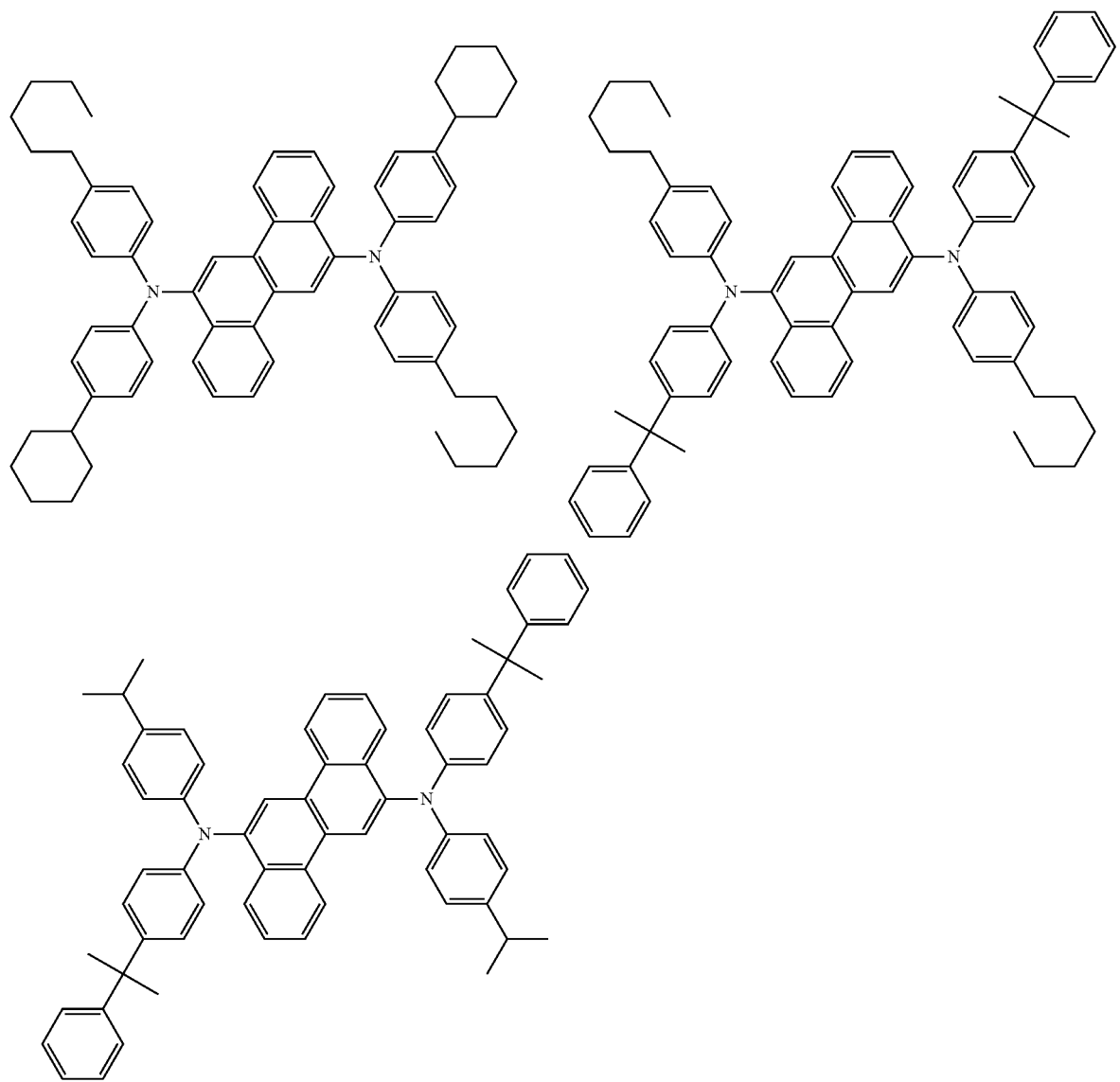

-continued
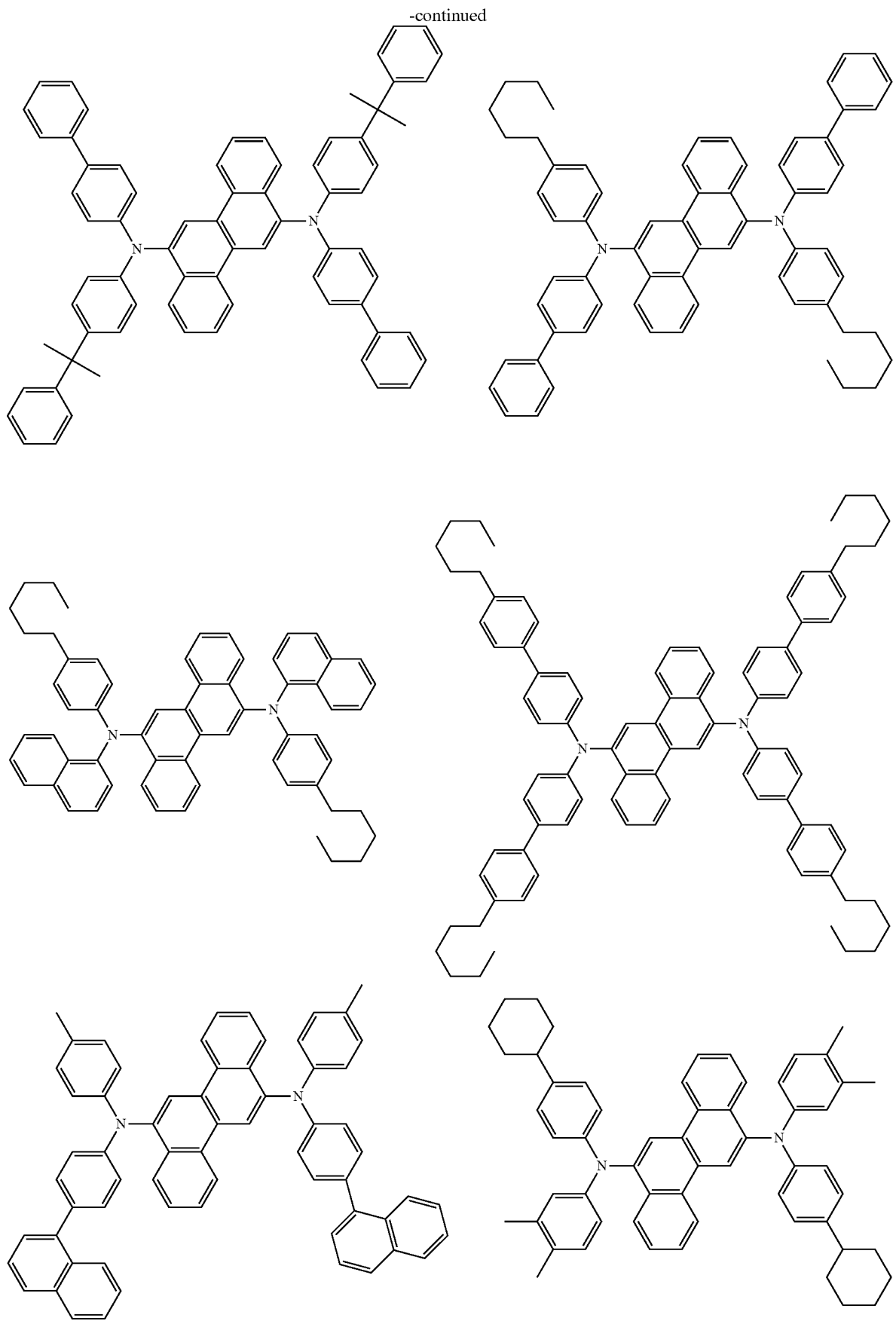

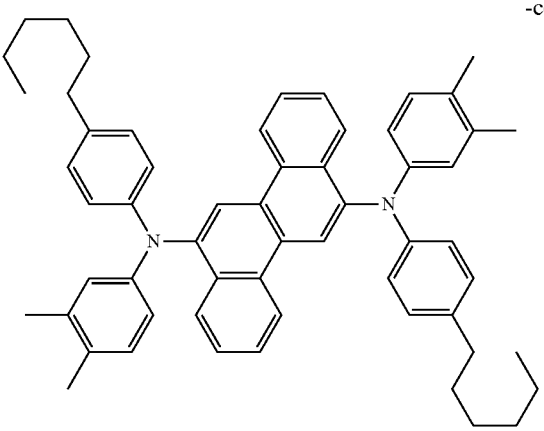
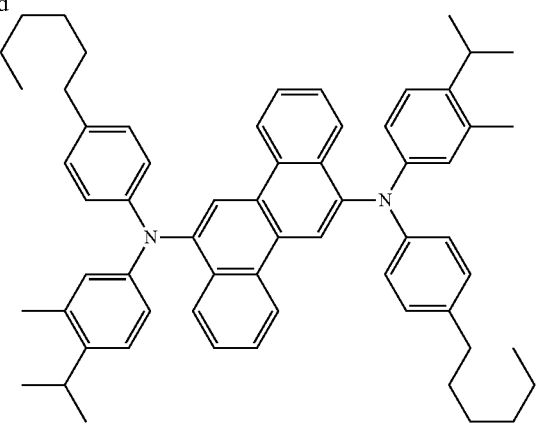
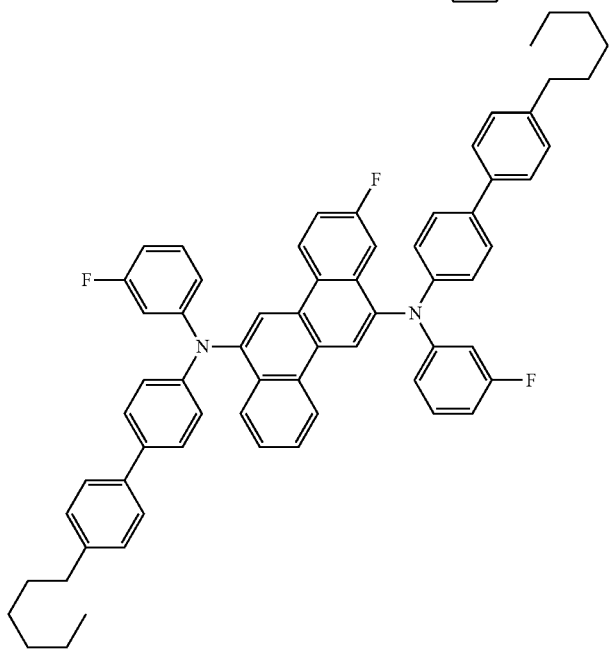

<Anthracene Derivative>

The anthracene derivative used as the emitting layer material is preferably a compound represented by the following formula (V) from the viewpoint of efficiently transporting the charge:

[Chem. 17]

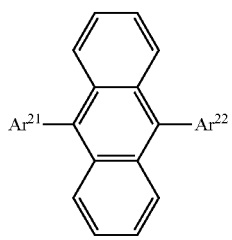

(V)

(wherein each of $Ar^{21}$ and $Ar^{22}$ independently represents an aromatic ring group which may have a substituent, and the anthracene ring in formula (V) may have a substituent other than $Ar^{21}$ and $Ar^{22}$).

Each of $Ar^{21}$ and $Ar^{22}$ independently represents an aromatic ring group which may have a substituent.

Examples of the aromatic hydrocarbon group of $Ar^{21}$ and $Ar^{22}$ include a group derived from a benzene ring or a condensed ring formed by fusing from 2 to 5 benzene rings, such as benzene ring, naphthalene ring, phenanthrene ring, anthracene ring, pyrene ring, chrysene ring, naphthacene ring and benzophenanthrene ring.

Specific examples of the aromatic heterocyclic group of $Ar^{21}$ and $Ar^{22}$ include a group derived from a furan ring, a benzofuran ring, a dibenzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a perimidine ring, a quinazoline ring, a quinazolinone ring or an azulene ring.

Examples of the substituent which may be substituted on the aromatic ring group in $Ar^{21}$ and $Ar^{22}$ include an organic group such as alkyl group, aromatic hydrocarbon group, aromatic heterocyclic group, alkoxy group, (hetero)aryloxy group, alkylthio group, (hetero)arylthio group, cyano group, dialkylamino group, alkylarylamino group and diarylamino group. Among these, an alkyl group and an aromatic hydrocarbon group are preferred in view of stability of the compound, and an aromatic hydrocarbon group is more preferred.

The alkyl group as the substituent which may be substituted on the aromatic ring group in $Ar^{21}$ and $Ar^{22}$ is preferably an alkyl group having a carbon number of 1 to 20. Specific examples thereof include a methyl group, an ethyl group, a propyl group, an iso-propyl group, a butyl group, an iso-butyl group, a sec-butyl group, a tert-butyl group, a hexyl group, an octyl group, a cyclohexyl group, a decyl group and an octadecyl group. Among these, a methyl group, an ethyl group, an iso-propyl group, a sec-butyl group and a tert-butyl group are preferred. Above all, a methyl group and an ethyl group are preferred in view of easy availability and low cost of the raw material, and an iso-butyl group, a sec-butyl group and a tert-butyl group are preferred because of their high solubility in a nonpolar solvent.

The aromatic hydrocarbon group is preferably an aromatic hydrocarbon group having a carbon number of 6 to 25. The aromatic hydrocarbon ring is preferably an aromatic hydrocarbon group derived from a 6-membered monocyclic ring or a 2- to 5-fused ring. Specific examples thereof include a group derived from a benzene ring, a naphthalene ring, an anthracene ring, a phenanthrene ring, a perylene ring, a tetracene ring, a pyrene ring, a benzopyrene ring, a chrysene ring, a triphenylene ring or a fluoranthene ring.

The aromatic heterocyclic group is preferably an aromatic heterocyclic group having a carbon number of 3 to 20. Specific examples thereof include a group derived from a furan ring, a benzofuran ring, a dibenzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a perimidine ring, a quinazoline ring, a quinazolinone ring or an azulene ring.

The alkoxy group is preferably an alkoxy group having a carbon number of 1 to 20. Specific examples thereof include a methoxy group, an ethoxy group, an isopropyloxy group, a cyclohexyloxy group, and an octadecyloxy group.

The (hetero)aryloxy group is preferably a (hetero)aryloxy group having a carbon number of 3 to 20. Specific examples thereof include a phenoxy group, a 1-naphthyloxy group, a 9-anthranyloxy group, and a 2-thienyloxy group.

The alkylthio group is preferably an alkylthio group having a carbon number of 1 to 20. Specific examples thereof include a methylthio group, an ethylthio group, an isopropylthio group, and a cyclohexylthio group.

The (hetero)arylthio group is preferably a (hetero)arylthio group having a carbon number of 3 to 20. Specific examples thereof include a phenylthio group, a 1-naphthylthio group, a 9-anthranylthio group, and a 2-thienylthio group.

The dialkylamino group is preferably a dialkylamino group having a carbon number of 2 to 29. Specific examples thereof include a diethylamino group, a diisopropylamino group, a methylethylamino group.

The alkylarylamino group is preferably an alkylarylamino group having a carbon number of 7 to 30. Specific examples thereof include a methylphenylamino group.

The diarylamino group is preferably a diarylamino group having a carbon number of 12 to 30. Specific examples thereof include a diphenylamino group and a phenylnaphthylamino group.

These substituents may further have a substituent. In the case of further having a substituent, examples of the substituent include the above-described alkyl group, aromatic ring group, alkoxy group and diarylamino group.

Specific examples of the anthracene derivative represented by formula (V) are illustrated below. However, the anthracene derivative represented by formula (V) is not limited thereto.

[Chem. 18]

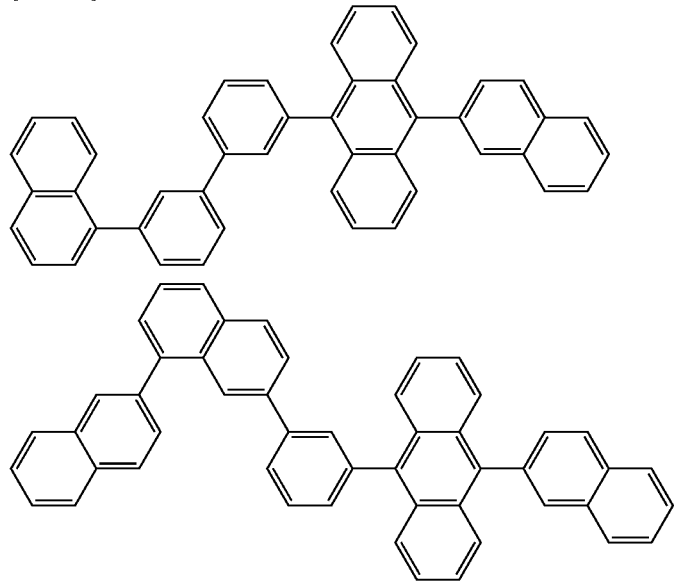

-continued
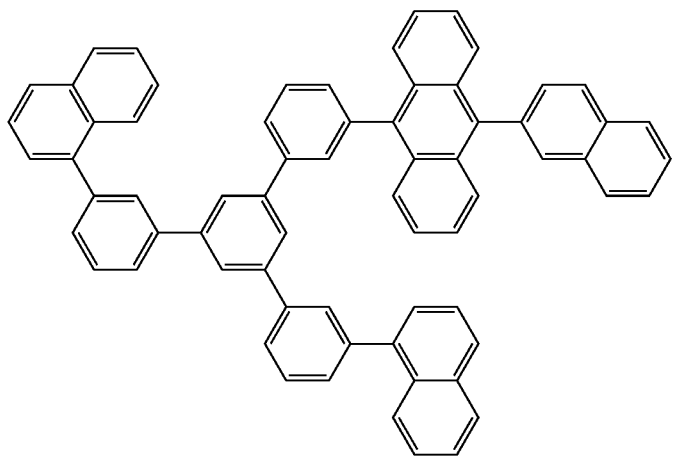

-continued
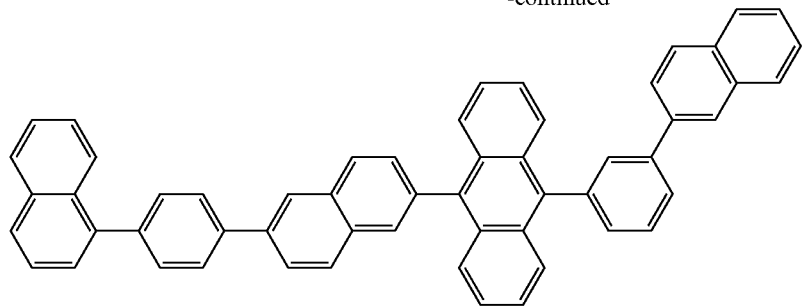
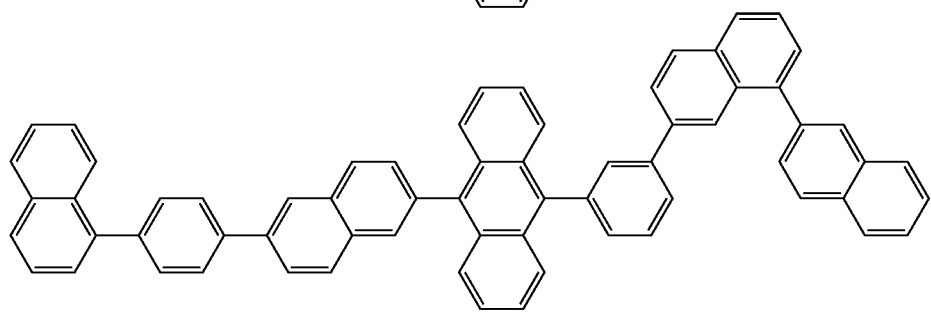
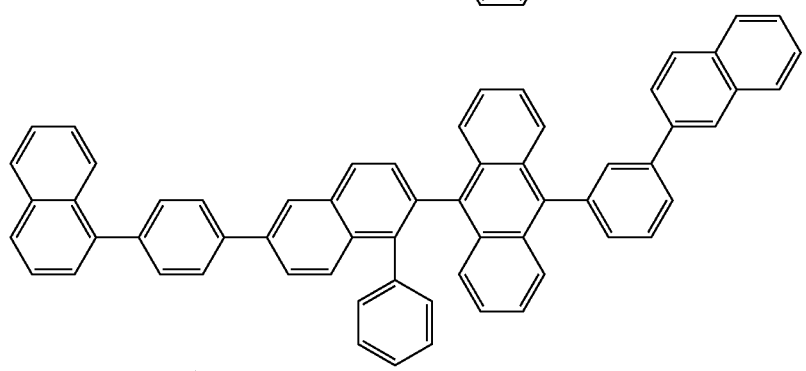
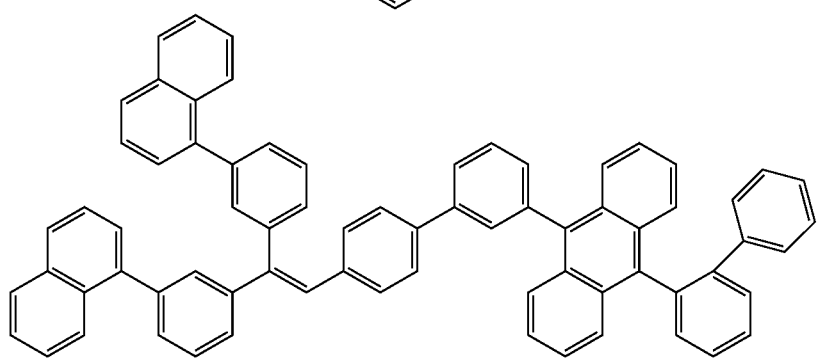
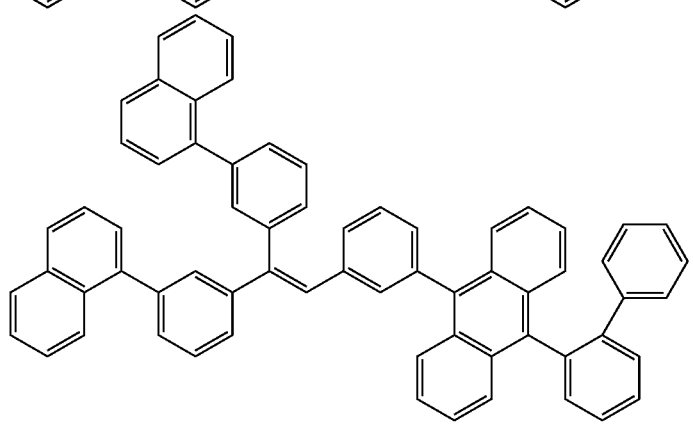

-continued

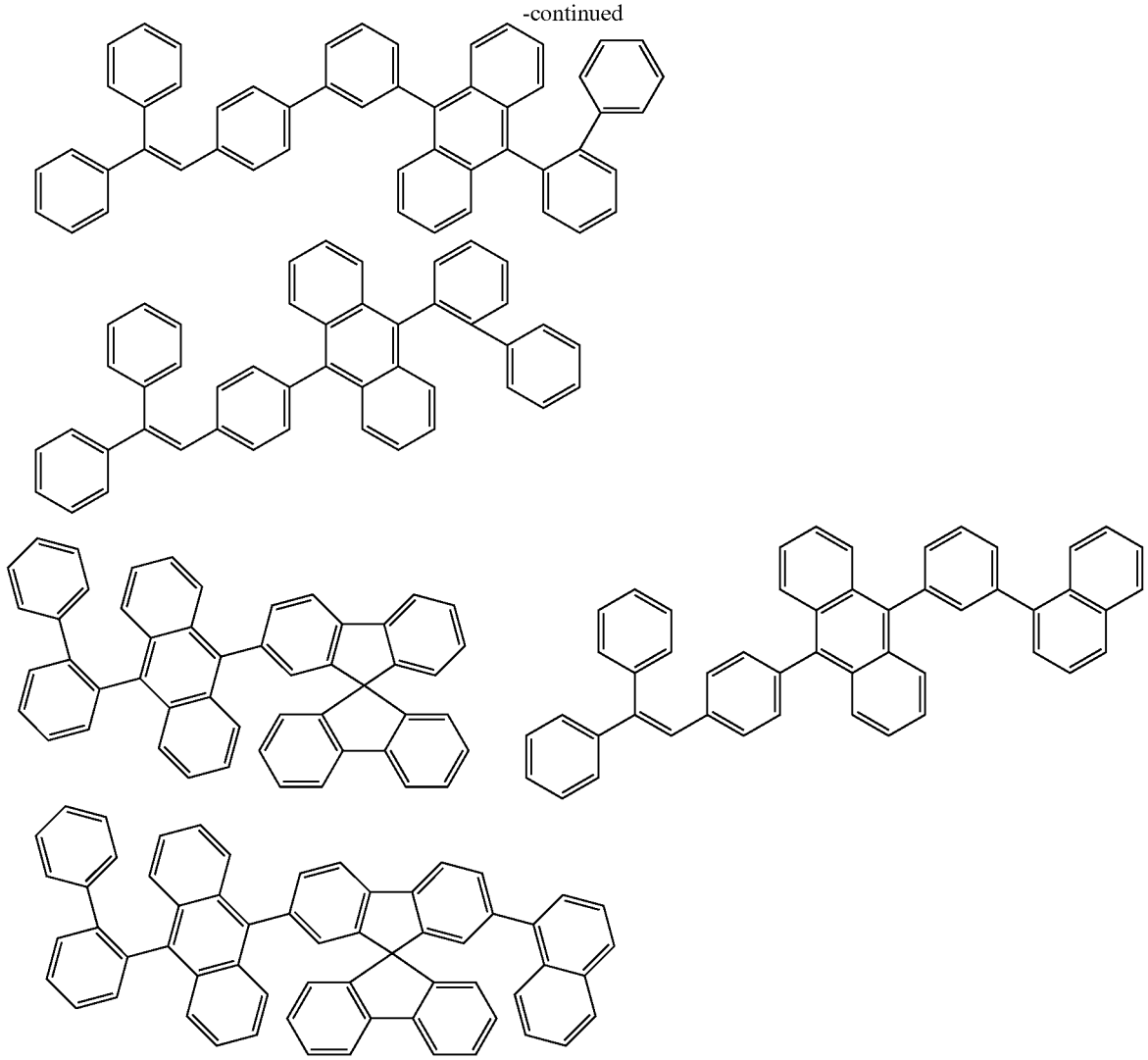

{Hole Transport Layer Material}

In the present invention, the hole transport layer has an effect of reducing the carbon dioxide, sulfur oxide and nitrogen oxide concentrations in the film formation environment, and this effect is described below.

In an organic electroluminescence element, a hole or an electron is injected into an organic layer from an electrode, and both are recombined in the emitting layer to form an excited state, thereby emitting light. In an organic electroluminescence element using a low molecule, the carrier is not injected directly into an organic layer from an electrode but in many cases, a charge transport layer for transporting a charge between the emitting layer and the electrode is provided.

It is expected that when carbon dioxide, sulfur oxide or nitrogen oxide is commingled in the charge transport layer at the time of forming the charge transport layer, the charge is quenched and the transport thereof is inhibited, as a result, the carrier balance in the emitting layer is lost, leading to reduction in the efficiency and lifetime of the organic electroluminescence element.

Accordingly, the effect of the present invention where the hole transport layer reduces the carbon dioxide, sulfur oxide and nitrogen oxide concentrations in the film formation environment is great.

The hole transport layer material is not particularly limited as long as the effects of the present invention are not impaired. However, the hole transport layer material is preferably an aromatic amine-based compound because of its excellent hole transporting ability.

The aromatic amine-based compound is described below.
<Aromatic Amine-Based Compound>

The aromatic amine-based compound includes a polymer compound containing a repeating unit represented by the following formula (VI):

[Chem. 19]

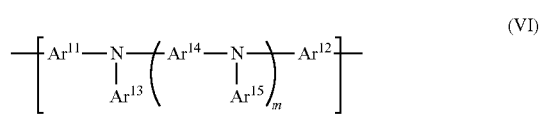

(wherein m represents an integer of 0 to 3, each of $Ar^{11}$ and $Ar^{12}$ independently represents a direct bond or an aromatic ring group which may have a substituent, and each of $Ar^{13}$ to $Ar^{15}$ independently represents an aromatic ring group which may have a substituent, provided that $Ar^{11}$ and $Ar^{12}$ are not a direct bond at the same time).

The aromatic ring group as used herein indicates an aromatic hydrocarbon group or an aromatic heterocyclic group.

Examples of the aromatic hydrocarbon group which may have a substituent include a group derived from a 6-membered monocyclic ring or a 2- to 5-fused ring such as benzene ring, naphthalene ring, anthracene ring, phenanthrene ring, perylene ring, tetracene ring, pyrene ring, benzopyrene ring, chrysene ring, triphenylene ring, acenaphthene ring, fluoranthene ring and fluorene ring.

Examples of the aromatic heterocyclic group which may have a substituent include a group derived from a 5- or 6-membered monocyclic ring or a 2- to 4-fused ring such as furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisoxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, phenanthridine ring, perimidine ring, quinazoline ring, quinazolinone ring and azulene ring.

In view of solubility for a solvent and heat resistance, each of $Ar^{11}$ to $Ar^{15}$ is independently, preferably a group derived from a ring selected from the group consisting of a benzene ring, a naphthalene ring, an anthracene ring, a phenanthrene ring, a triphenylene ring, a pyrene ring, a thiophene ring, a pyridine ring and a fluorene ring.

As $Ar^{11}$ to $Ar^{15}$, a divalent group formed by directly boning one ring or two or more rings selected from the group above or connecting the rings through a —CH═CH— group is also preferred, and a biphenylene group or a terphenylene group is more preferred.

The substituent which may be substituted on the aromatic ring group in $Ar^{11}$ to $Ar^{15}$ is not particularly limited. The substituent which may be substituted on the aromatic ring group in $Ar^{11}$ to $Ar^{15}$ includes, for example, one member or two or more members selected from the following <Substituents Z>.

<Substituents Z>

An alkyl group preferably having a carbon number of 1 to 24, more preferably a carbon number of 1 to 12, such as methyl group and ethyl group;

an alkenyl group preferably having a carbon number of 2 to 24, more preferably a carbon number of 2 to 12, such as vinyl group;

an alkynyl group preferably having a carbon number of 2 to 24, more preferably a carbon number of 2 to 12, such as ethynyl;

an alkoxy group preferably having a carbon number of 1 to 24, more preferably a carbon number of 1 to 12, such as methoxy group and ethoxy group;

an aryloxy group preferably having a carbon number of 4 to 36, more preferably a carbon number of 5 to 24, such as phenoxy group, naphthoxy group and pyridyloxy group;

an alkoxycarbonyl group preferably having a carbon number of 2 to 24, more preferably a carbon number of 2 to 12, such as methoxycarbonyl group and ethoxycarbonyl group;

a dialkylamino group preferably having a carbon number of 2 to 24, more preferably a carbon number of 2 to 12, such as dimethylamino group and diethylamino group;

a diarylamino group preferably having a carbon number of 10 to 36, more preferably a carbon number of 12 to 24, such as diphenylamino group, ditolylamino group and N-carbazolyl group;

an arylalkylamino group preferably having a carbon number of 6 to 36, more preferably a carbon number of 7 to 24, such as phenylmethylamino group;

an acyl group preferably having a carbon number of 2 to 24, preferably a carbon number of 2 to 12, such as acetyl group and benzoyl group;

a halogen atom such as fluorine atom and chlorine atom;

a haloalkyl group preferably having a carbon number of 1 to 12, more preferably a carbon number of 1 to 6, such as trifluoromethyl group;

an alkylthio group preferably having a carbon number of 1 to 24, more preferably a carbon number of 1 to 12, such as methylthio group and ethylthio group;

an arylthio group preferably having a carbon number of 4 to 36, more preferably a carbon number of 5 to 24, such as phenylthio group, naphthylthio group and pyridylthio group;

a silyl group preferably having a carbon number of 2 to 36, more preferably a carbon number of 3 to 24, such as trimethylsilyl group and triphenylsilyl group;

a siloxy group preferably having a carbon number of 2 to 36, more preferably a carbon number of 3 to 24, such as trimethylsiloxy group and triphenylsiloxy group;

a cyano group;

an aromatic hydrocarbon group preferably having a carbon number of 6 to 36, more preferably a carbon number of 6 to 24, such as phenyl group and naphthyl group; and an aromatic heterocyclic group preferably having a carbon number of 3 to 36, more preferably a carbon number of 4 to 24, such as thienyl group and pyridyl group.

These substituents may further have a substituent, examples thereof include the groups described as examples in <Substituents Z>.

The molecular weight of the substituent which may be substituted on the aromatic ring group in $Ar^{11}$ to $Ar^{15}$ other than the later-described insolubilizing group is preferably 500 or less, more preferably 250 or less, including the group that is further substituted.

In view of solubility in a solvent, each of the substituents which may be substituted on the aromatic ring group in $Ar^{11}$ to $Ar^{15}$ is independently, preferably an alkyl group having a carbon number of 1 to 12 or an alkoxy group having a carbon number of 1 to 12.

Incidentally, when m is 2 or more, the repeating unit represented by formula (VI) has two or more $Ar^{14}$s and two or more $Ar^{15}$s. In this case, $Ar^{14}$s or $Ar^{15}$s may be the same or different. Furthermore, $Ar^{14}$s or $Ar^{15}$s may combine with each other directly or through a linking group to form a cyclic structure.

In formula (VI), m represents an integer of 0 to 3. m is preferably 2 or less. When m is 2 or less, synthesis of the monomer as the raw material is easy.

In the present invention, the hole transport layer material preferably has an insolubilizing group as a substituent, because the solubility for a solvent is reduced and stacking of a layer on the hole transport layer by wet film formation or the like is facilitated.

The insolubilizing group is a group undergoing a reaction by heat and/or irradiation with active energy ray. The insolubilizing group is a group having an effect of reducing the solubility of the insolubilizing group-containing compound in an organic solvent or water by the reaction compared with before the reaction.

The insolubilizing group is preferably a group containing a dissociating group or a crosslinking group.

In the case where the polymer compound containing a repeating unit represented by formula (VI) contains an insolubilizing group-containing group as a substituent, the substitution position of the insolubilizing group may be in the repeating unit represented by formula (VI) or may be in a portion except for the repeating unit represented by formula (VI), for example, in a terminal group.

Specific examples of the group containing a crosslinking group as the insolubilizing group include those described as examples in the following <Crosslinking Groups Q>. However, the group containing a crosslinking groups as the insolubilizing group according to the present invention is not limited thereto.

<Crosslinking Groups Q>

[Chem. 20]

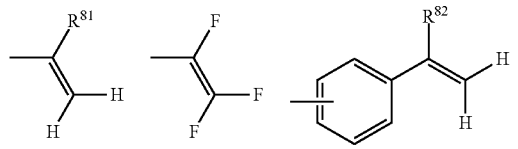

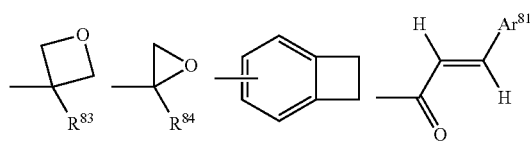

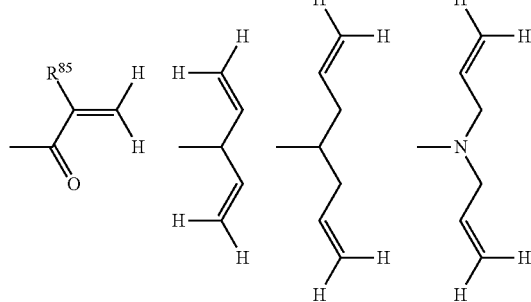

(wherein each of $R^{81}$ to $R^{85}$ independently represents a hydrogen atom or an alkyl group, and $Ar^{81}$ represents an aromatic ring group which may have a substituent).

The aromatic ring group as used herein indicates an aromatic hydrocarbon group or an aromatic heterocyclic group.

Specific preferred examples of the group containing a dissociating group as the insolubilizing group are as follows. However, the group containing a dissociating group as the insolubilizing group according to the present invention is not limited thereto.

In the case where the group containing a dissociating group is a divalent group, specific examples thereof include those illustrated in the following <Divalent Dissociating Group-Containing Groups G>.

<Divalent Dissociating Group-Containing Groups G>

[Chem. 21]

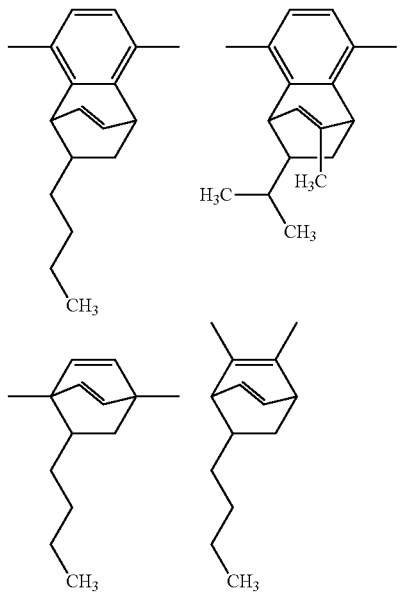

In the case where the dissociating group is a monovalent group, specific examples thereof include those illustrated in the following <Monovalent Dissociating Groups J>.

<Monovalent Dissociating Group-Containing Groups J>

[Chem. 22]

{Solvent}

The solvent contained in the organic electroluminescence element composition for use in the present invention is used to form a layer containing an organic electroluminescence element material by wet film formation. The solvent is usually a volatile liquid.

The solvent is not particularly limited as long as it is a solvent capable of successfully dissolving the above-described organic electroluminescence element material or the like that is a solute. Preferred solvents include the followings.

Examples thereof include alkanes such as n-decane, cyclohexane, ethylcyclohexane, decalin and bicyclohexane; aromatic hydrocarbons such as toluene, xylene, mesitylene, cyclohexylbenzene and tetralin; halogenated aromatic hydrocarbons such as chlorobenzene, dichlorobenzene and trichlorobenzene; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole and diphenylether; aromatic esters such as phenyl acetate, phenyl propionate, methyl benzoate, ethyl benzoate, propyl benzoate and n-butyl benzoate; alicyclic ketones such as cyclohexanone, cyclooctanone and fenchone; alicyclic alcohols such as cyclohexanol and cyclooctanol; aliphatic ketones such as methyl ethyl ketone and dibutyl ketone; and aliphatic alcohols such as butanol and hexanol; and aliphatic ethers such as ethylene glycol dimethyl ether, ethylene glycol diethyl ether and propylene glycol-1-monomethyl ether acetate (PGMEA).

Among these, alkanes and aromatic hydrocarbons are preferred.

One of these solvents may be used alone, or two or more thereof may be used in arbitrary combination at an arbitrary ratio.

The boiling point of the solvent is usually 100° C. or more, preferably 150° C. or more, more preferably 200° C. or more. The boiling point of the solvent is preferably higher because the risk of reducing the film formation stability due to evaporation of the solvent from the organic electroluminescence element composition is low.

Also, in order to obtain a more uniform film, the solvent is preferably evaporated at an appropriate rate from the liquid film immediately after film formation. For this reason, the boiling point of the solvent is usually 80° C. or more, preferably 100° C. or more, more preferably 120° C. or more, and usually 270° C. or less, preferably 250° C. or less, more preferably 230° C. or less.

{Composition}

The content of the above-described organic electroluminescence element material in the organic electroluminescence element composition for use in the present invention is usually 0.1 wt % or more, preferably 1 wt % or more, and usually 99.99 wt % or less, preferably 99.9 wt % or less. The composition preferably has a content of the organic electroluminescence element material in the range above, because the viscosity of the organic electroluminescence element composition is adequate to ensure high workability of film formation and the thickness of the film obtained by removing the solvent after film formation is sufficiently large, facilitating the film formation.

Also, the content of the solvent in the organic electroluminescence element composition for use in the present invention is preferably 10 parts by weight or more, more preferably 50 parts by weight or more, still more preferably 80 parts by weight or more, per 100 parts by weight of the organic electroluminescence element composition. On the other hand, the content of the solvent is preferably 99.95 parts by weight or less, more preferably 99.9 parts by weight or less, still more preferably 99.8 parts by weight or less, per 100 parts by weight of the organic electroluminescence element composition. The content of the solvent is preferably large from the point of view that the viscosity of the organic electroluminescence element composition is low and the film formation work is easy. However, on the other hand, the content of the solvent is preferably small from the standpoint that the thickness of the film obtained by removing the solvent after film formation is easily gained and film formation is facilitated.

The organic electroluminescence element composition for use in the present invention may contain other organic electroluminescence element materials employed to form an organic layer of an organic electroluminescence element, in addition to the above-described organic electroluminescence element material and solvent.

However, the kind, formulation and concentration of the organic electroluminescence element material, the solvent and other components in the organic electroluminescence element composition are appropriately set according to the kind of the organic layer formed by a wet film formation method. Preferred conditions for the formation of an emitting layer and a hole transport layer which are the organic layer, are described later.

[Film Formation Step]

In the method for producing an organic electroluminescence element of the present invention, the above-described organic electroluminescence element composition is wet-deposited in at least any one environment of the film formation environments 1 to 3, whereby an organic layer of an organic electroluminescence element is formed.

The wet film-forming method as used in the present invention means a process of performing the film formation in a wet system such as spin coating, dip coating, die coating, bar coating, blade coating, roll coating, spray coating, capillary coating, inkjet, screen printing, gravure printing and flexographic printing. Among these film formation methods, a spin coating method, a spray coating method and an inkjet method are preferred, because these methods are suitable for film formation in the film formation environments 1 to 3 of the present invention.

Incidentally, hereinafter, the film deposited by a wet film-forming method is sometimes referred to as a "coating film".

In the present invention, the film formation step itself by a wet film-forming method can be performed in a conventional manner.

The wet film formation temperature is not limited but is preferably 10° C. or more, more preferably 13° C. or more, still more preferably 16° C. or more, because the film is less likely to suffer a defect due to production of a crystal or aggregation in the organic electroluminescence element composition. Also, on the other hand, the wet film formation temperature is preferably 50° C. or less, more preferably 40° C. or less.

The surface on which a film is formed by a wet film-forming method varies according to the kind of the organic layer formed. For example, in the case of forming an emitting layer as the organic layer, the film is usually formed on an anode which is formed on the substrate of an organic electroluminescence element, or on an intermediate layer such as hole injection layer or hole transport layer provided, if desired, between the anode and the emitting layer. Also, in the case of forming a hole transport layer as the organic layer, the film is usually formed on an anode which is formed on the substrate of an organic electroluminescence element, or on an intermediate layer such as hole injection layer provided, if desired, between the anode and the hole transport layer.

[Drying Step]

In the production method of an organic electroluminescence element of the present invention, after a film is formed by a wet film-forming method by using the organic electroluminescence element composition, the coating film is dried. The drying step may be performed by any method as long as the film formed by a wet film-forming method can be dried. Also, when the film formed by a wet film-forming method is dried, this means that the drying step according to the present invention is performed.

The environment for the drying step is not particularly limited. However, for the same reason as the reason why the above-described film formation environment is preferred, the drying step is preferably performed in the same environment as that for the film formation step. Specifically, the drying step is preferably performed in at least one environment of the film formation environments 1 to 3, and it is more preferred to perform the drying step under the same temperature and humidity conditions.

In the drying step, drying by heating is usually performed.

Examples of the heating means include a clean oven, a hot plate, an infrared ray, a halogen heater, and microwave irradiation. Among these, a clean oven and a hot plate are preferred from the point of view that heat is likely to be evenly applied throughout the film.

The heating direction in the heating step is not limited as long as the effects of the present invention are not seriously impaired. As regards the heating direction, for example, there are a method of mounting the film-deposited substrate on a hot plate and heating the coating film through the hot plate, thereby heating the coating film from the substrate bottom surface (the substrate side where the organic layer is not formed), and a method of charging the film-deposited substrate into a clean oven, thereby heating the coating film from all of up, down, right and left directions.

The heating temperature in the heating step is not particularly limited as long as the effects of the present invention are not seriously impaired. The heating is preferably performed at a temperature of usually 90° C. or more, preferably 100° C. or more, and usually 300° C. or less, preferably 250° C. or less. The heating temperature is preferably low from the point of view that diffusion of components into other layers can hardly occur, and the heating temperature is preferably high from the standpoint that the remaining solvent is liable to be sufficiently removed. Also, in the case of a mixed solvent, that is, when two or more kinds of solvents are contained in the organic electroluminescence element composition, at least one kind of a solvent is preferably heated at a temperature not lower than its boiling point.

The heating time in the heating step is not limited as long as the effects of the present invention are not seriously impaired. The heating time is preferably 10 minutes or more, more preferably 15 minutes or more, and, on the other hand, preferably 4 hours or less, more preferably 2 hours or less. This heating makes it easy to sufficiently insolubilize the coating film. The heating time is preferably short from the point of view that diffusion of components into other layers can hardly occur, but, on the other hand, the heating time is preferably long in view of homogeneity of the film.

[Film Thickness]

In the production method of an organic electroluminescence element of the present invention, the film thickness of the organic layer formed differs depending on the kind or the like of the organic layer formed. The film thickness of the organic layer is usually 3 nm or more, preferably 5 nm or more, and, on the other hand, is usually 200 nm or less, preferably 100 nm or less. The film thickness is preferably large from the point of view that a defect is scarcely produced in the film, but, on the other hand, the film thickness is preferably small from the standpoint that the driving voltage of the element is liable to be reduced.

Incidentally, the preferred film thickness varies depending on the kind or the like of the organic layer formed. The film thickness of an emitting layer or a hole transport layer as the organic layer is described later.

[Storage Step]

In the case of forming the above-described organic layer by a wet film-forming method, for reasons of working process, the element in the halfway state to the production after the formation of an organic layer is sometimes stored until a layer is formed on the organic layer.

In the case of storing such an element halfway the film formation, in order to prevent reduction in the lifetime due to deterioration of the element during storage, the element halfway the film formation is stored in an environment from which oxygen and moisture are blocked, such as nitrogen gas atmosphere. Accordingly, an expensive storage facility for storing the element is required.

With respect to the storage environment for the element halfway the film formation, the present inventors have also found that for the same reason as the reason why the above-described film formation environment is preferred, the element stored in the air can be kept from deterioration by establishing the same environment as in the film formation step even without using an expensive storage facility. That is, specifically, the storage is preferably performed in at least one environment of the film formation environments 1 to 3, and it is more preferred to perform the storage under the same temperature and humidity conditions.

In this case, the method for forming an organic layer on the outermost surface of the element stored is as described above in the production method of an organic electroluminescence element of the present invention. Incidentally, the organic layer here may not be necessarily deposited in any one of the film formation environments 1 to 3. That is, as for the storage environment after film formation performed not in any of the film formation environments 1 to 3, the element is also preferably stored in the same environment as in the film formation step. Furthermore, the organic layer stored here is also preferably an emitting layer and/or a hole transport layer, similarly to the above.

In the case where the element halfway the film formation is stored in the same environment as any one of the film formation environments 1 to 3, the preferred environment conditions and the method or the like for preparing the environment conditions are as described above in the production method of an organic electroluminescence element of the present invention.

The temperature during storage is not particularly limited. The temperature during storage is preferably 10° C. or more, more preferably 13° C. or more, still more preferably 16° C. or more, and, on the other hand, preferably 50° C. or less, more preferably 40° C. or less.

The storage time is usually 6 hours or less, preferably 3 hours or less, more preferably 1 hour or less. The storage time in this range is preferred, because the productivity is high.

[2] Organic Electroluminescence Element

In the organic electroluminescence element of the present invention, the organic layer between the anode and the cathode of the organic electroluminescence element is formed by a wet film-forming method according to [1] Production Method of Organic Electroluminescence Element above of the present invention. In the organic electroluminescence element of the present invention, the organic layer formed according to the production method of an organic electroluminescence element of the present invention is preferably an emitting layer or a hole transport layer, more preferably an emitting layer.

The layer configuration of the organic electroluminescence element produced by the method of the present invention, the general formation method therefor, and the like are described below by referring to FIG. 1.

FIG. 1 is a cross-sectional schematic view showing an example of the structure of the organic electroluminescence element of the present invention. In FIG. 1, 1 indicates a substrate, 2 indicates an anode, 3 indicates a hole injection layer, 4 indicates a hole transport layer, 5 indicates an emitting layer, 6 indicates a hole blocking layer, 7 indicates an electron transport layer, 8 indicates an electron injection layer, 9 indicates a cathode, and 10 indicates an organic electroluminescence element.

[Substrate]

The substrate 1 works out to a support of an organic electroluminescence element. For the substrate 1, a quartz or glass plate, a metal plate or foil, a plastic film or sheet, and the like is used. In particular, the substrate 1 is preferably a glass plate or a transparent plate formed of a synthetic resin such as polyester, polymethacrylate, polycarbonate and polysulfone. In the case of using a synthetic resin substrate, gas barrier property is preferably kept in mind. That is, a substrate having high gas barrier property and scarcely causing deterioration of the organic electroluminescence element due to outside air passed through the substrate is preferably used. Specifically, for example, a method of providing a dense silicon oxide film or the like on at least one surface of the synthetic resin substrate to ensure the gas barrier property is one preferred method.

[Anode]

The anode 2 fulfills the role of injecting a hole into the layer on the emitting layer 5 side.

The anode 2 is usually composed of a metal such as aluminum, gold, silver, nickel, palladium and platinum, a metal oxide such as indium and/or tin oxide, a metal halide such as copper iodide, carbon black, or an electrically conductive polymer such as poly(3-methylthiophene), polypyrrole and polyaniline.

Formation of the anode 2 is usually performed by a sputtering method, a vacuum deposition method, or the like. In the case of forming the anode 2 by using, for example, a fine metal particle such as silver, a fine particle such as copper iodide, carbon black, a fine electrically conductive metal oxide particle or a fine electrically conductive polymer powder, the anode 2 can be also formed by dispersing the electrically conductive component in an appropriate binder resin solution and coating the solution on the substrate 1. Furthermore, in the case of an electrically conductive polymer, it is also possible to form a thin film directly on the substrate 1 by electrolytic polymerization. In addition, in the case of an electrically conductive polymer, the anode 2 can be also formed by coating the electrically conductive polymer on the substrate 1 (see, *Appl. Phys. Lett.*, Vol. 60, page 2711, 1992).

The anode 2 usually has a single-layer structure but, if desired, can have a multilayer structure composed of plural materials.

The thickness of the anode 2 varies depending on the required transparency or the like. In the case where transparency is required, the transmittance for visible light is desirably set to usually 60% or more, preferably 80% or more. In this case, the thickness of the anode 2 is usually 5 nm or more, preferably 10 nm or more, and, on the other hand, is usually 1,000 nm or less, preferably about 500 nm or less. In the case where the anode 2 can be opaque, the anode 2 may have an arbitrary thickness. The anode 2 may be the same as the substrate 1. It is also possible to further stack a different electrically conductive material on the anode 2.

The anode 2 surface is preferably subjected to an ultraviolet (UV)/ozone treatment or an oxygen plasma or argon plasma treatment so as to remove the attached impurities and adjust the ionization potential, thereby enhancing the hole injection performance.

[Hole Injection Layer]

The hole injection layer 3 is a layer for transporting a hole to the emitting layer 5 from the anode 2. The hole injection layer 3 is usually formed on the anode 2.

The method for forming a hole injection layer 3 according to the present invention may be either a vacuum deposition method or a wet film-forming method and is not particularly limited. From the standpoint of reducing the dark spot, the method for forming a hole injection layer 3 according to the present invention is preferably a wet film-forming method.

The film thickness of the hole injection layer 3 is usually 5 nm or more, preferably 10 nm or more, and, on the other hand, is usually 1,000 nm or less, preferably 500 nm or less.

[Formation of Hole Injection Layer by Wet Film-Forming Method]

In the case of forming the hole injection layer 3 by a wet film-forming method, usually, materials constituting the hole injection layer 3 are mixed with an appropriate solvent (solvent for hole injection layer) to prepare a composition for film formation (hole injection layer-forming composition), and the hole injection layer 3-forming composition is coated on a layer corresponding to the underlying layer (usually anode 2) of the hole injection layer by an appropriate method to form a coating film and then dried, whereby the hole injection layer 3 is formed.

<Hole Transporting Compound>

The hole injection layer-forming composition usually contains a hole transporting compound as the constituent material of the hole injection layer 3, and a solvent.

The hole transporting compound may be sufficient if it is a compound usually employed for the hole injection layer 3 of an organic electroluminescence element. The hole transporting compound may be a polymer compound such as polymer or a low molecular compound such as monomer but is preferably a polymer compound.

In view of barrier to charge injection from the anode 2 to the hole injection layer 3, the hole transporting compound is preferably a compound having an ionization potential of 4.5 to 6.0 eV. Examples of the hole transporting compound include an aromatic amine derivative, a phthalocyanine derivative, a porphyrin derivative, an oligothiophene derivative, a polythiophene derivative, a benzylphenyl derivative, a compound having tertiary amines connected through a fluorene group, a hydrazone derivative, a silazane derivative, a silanamine derivative, a phosphamine derivative, a quinacridone derivative, a polyaniline derivative, a polypyrrole derivative, a polyphenylenevinylene derivative, a polythienylenevinylene derivative, a polyquinoline derivative, a polyquinoxaline derivative, and carbon.

Incidentally, the derivative as used in the present invention includes, for example, in the case of an aromatic amine derivative, the aromatic amine itself and a compound where an aromatic amine forms the main skeleton, and the derivative may be a polymer or a monomer.

With respect to the hole transporting compound used as a material of the hole injection layer 3, any one of these compounds may be contained alone, or two or more thereof may be contained. In the case of containing two or more kinds of hole transporting compounds, any combination and any ratio may be employed, but it is preferred that one kind or two or more kinds of aromatic tertiary amine polymer compounds and one kind or two or more kinds of other hole transporting compounds are used in combination.

Among those compounds, in view of amorphous property and transmittance for visible light, an aromatic amine compound is preferred, and an aromatic tertiary amine compound is more preferred. The aromatic tertiary amine compound as used herein is a compound having an aromatic tertiary amine structure and includes also a compound having a group derived from an aromatic tertiary amine.

The aromatic tertiary amine compound is not particularly limited in its kind, but in view of uniform luminescence thanks to surface smoothing effect, the aromatic tertiary amine compound is preferably a polymer compound having a weight average molecular weight of 1,000 to 1,000,000 (a polymerized compound of a type where repeating units are connected). Preferred examples of the aromatic tertiary amine polymer compound include a polymer compound having a repeating unit represented by the following formula (I):

[Chem. 23]

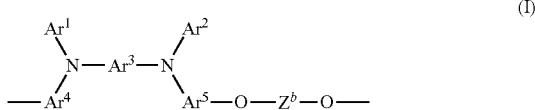

(wherein each of $Ar^1$ to $Ar^5$ independently represents an aromatic ring group which may have a substituent, $Z^b$ represents a linking group selected from the following linking groups, and out of $Ar^1$ to $Ar^5$, two groups bonded to the same N atom may combine with each other to form a ring):
<Linking Groups>

[Chem. 24]

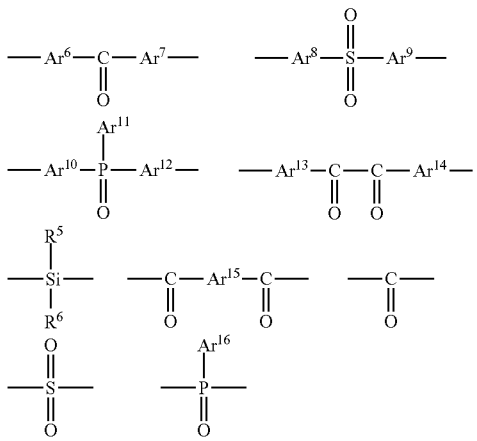

(wherein each of $Ar^6$ to $Ar^{16}$ independently represents an aromatic ring group which may have a substituent, and each of $R^5$ and $R^6$ independently represents a hydrogen atom or an arbitrary substituent, provided that the aromatic ring group indicates an aromatic hydrocarbon group or an aromatic heterocyclic group).

In view of solubility, heat resistance and hole injection/transport property of the polymer compound, the aromatic ring group of $Ar^1$ to $Ar^{16}$ is preferably a group derived from a benzene ring, a naphthalene ring, a phenanthrene ring, a thiophene ring or a pyridine ring, more preferably a group derived from a benzene ring or a naphthalene ring.

The aromatic ring group of $Ar^1$ to $Ar^{16}$ may further have a substituent. Usually, the molecular weight of the substituent is preferably 400 or less, more preferably about 250 or less. Preferred examples of the substituent include an alkyl group, an alkenyl group, an alkoxy group, and an aromatic ring group.

In the case where each of $R^5$ and $R^6$ is an arbitrary substituent, examples of the substituent include an alkyl group, an alkenyl group, an alkoxy group, a silyl group, a siloxy group, and an aromatic ring group.

Specific examples of the aromatic tertiary amine polymer compound having a repeating unit represented by formula (I) include the compounds described in International Publication No. 2005/089024.

As the hole transporting compound, an electrically conductive polymer (PEDOT/PSS) obtained by polymerizing 3,4-ethylenedioxythiophene as a polythiophene derivative in a high-molecular-weight polystyrenesulfonic acid is also preferred. Furthermore, the terminal of this polymer may be capped with a methacrylate or the like.

Incidentally, the hole transporting compound may be a crosslinking compound described later in [Hole Transport Layer]. The film formation method when using the crosslinking compound is also the same as the method described later in the paragraph of [Hole Transport Layer].

The concentration of the hole transporting compound in the hole injection layer-forming composition may be arbitrarily selected as long as the effects of the present invention are not seriously impaired. The concentration of the hole transporting compound is preferably small from the point of view that film thickness unevenness can be hardly caused, and, on the other hand, the concentration is preferably large from the standpoint that a defect is scarcely produced in the hole injection layer deposited. Specifically, in view of uniformity of the film thickness, the concentration of the hole transporting compound is usually 0.01 wt % or more, preferably 0.1 wt % or more, more preferably 0.5 wt % or more, and is usually 70 wt % or less, preferably 60 wt % or less, more preferably 50 wt % or less.

<Electron-Accepting Compound>

The hole injection layer-forming composition preferably contains an electron-accepting compound as a constituent material of the hole injection layer 3.

The electron-accepting compound is preferably a compound having oxidizing power and having an ability to accept one electron from the above-described hole transporting compound. Specifically, a compound having an electron affinity of 4 eV or more is preferred, and a compound having an electron affinity of 5 eV or more is more preferred.

Such an electron accepting compound includes, for example, one kind or two or more kinds of compounds selected from the group consisting of a triarylboron compound, a metal halide, a Lewis acid, an organic acid, an onium salt, a salt of arylamine with metal halide, and a salt of arylamine with Lewis acid. Specific examples thereof include an organic group-substituted onium salt such as 4-isopropyl-4'-methyldiphenyliodonium tetrakis(pentafluorophenyl)borate and triphenylsulfonium tetrafluoroborate (International Publication No. WO2005/089024); a high-valence inorganic compound such as iron(III) chloride (JP-A-11-251067) and ammonium peroxodisulfate; a cyano compound such as tetracyanoethylene, an aromatic boron compound such as tris(pentafluorophenyl)borane (JP-A-2003-31365); a fullerene derivative; iodine; and a sulfonate ion such as polystyrenesulfonate ion, alkylbenzenesulfonate ion and camphorsulfonate ion.

Such an electron-accepting compound can enhance the electric conductivity of the hole injection layer 3 by oxidizing the hole transporting compound.

The content of the electron-accepting compound in the hole injection layer 3 or the hole injection layer-forming composition based on the hole transporting compound is usually 0.1 mol % or more, preferably 1 mol % or more, and, on the other hand, is usually 100 mol % or less, preferably 40 mol % or less.

<Other Constituent Materials>

As the material of the hole injection layer 3, in addition to the above-described hole transporting compound and electron-accepting compound, other components may be further contained as long as the effects of the present invention are not seriously impaired. Examples of other components include various luminescent materials, electron transporting compounds, binder resins and coatability improvers. Incidentally, as for other components, only one kind of a component may be used, or two or more kinds of components may be used in arbitrary combination at an arbitrary ratio.

<Solvent>

Out of the solvents in the hole injection layer-forming composition used in a wet film-forming method, at least one solvent is preferably a compound capable of dissolving the above-described constituent materials of the hole injection layer 3. The boiling point of the solvent is preferably high from the point of view that the probability of deteriorating the film quality due to too fast drying is low, but, on the other hand, the boiling point is preferably low from the standpoint that drying at a low temperature is possible and the probability of affecting the other layers or the substrate is low. Accordingly, the boiling point of the solvent is usually 110° C. or more, preferably 140° C. or more, more preferably 200° C. or more, and, on the other hand, is usually 400° C. or less, preferably 300° C. or less.

The solvent includes, for example, an ether-based solvent, an ester-based solvent, an aromatic hydrocarbon-based solvent and an amide-based solvent.

Examples of the ether-based solvent include an aliphatic ether such as ethylene glycol dimethyl ether, ethylene glycol diethyl ether and propylene glycol-1-monomethyl ether acetate (PGMEA); and an aromatic ether such as 1,2-dimethoxybenzene, 1,3-dimethoxybenzene, anisole, phenetole, 2-methoxytoluene, 3-methoxytoluene, 4-methoxytoluene, 2,3-dimethylanisole and 2,4-dimethylanisole.

Examples of the ester-based solvent include an aromatic ester such as phenyl acetate, phenyl propionate, methyl benzoate, ethyl benzoate, propyl benzoate and n-butyl benzoate.

Examples of the aromatic hydrocarbon-based solvent include toluene, xylene, cyclohexylbenzene, 3-isopropylbiphenyl, 1,2,3,4-tetramethylbenzene, 1,4-diisopropylbenzene, cyclohexylbenzene and methylnaphthalene.

Examples of the amide-based solvent include N,N-dimethylformamide and N,N-dimethylacetamide.

In addition, dimethylsulfoxide and the like may also be used.

Only one of these solvents may be used, or two or more thereof may be used in arbitrary combination at an arbitrary ratio.

<Film Formation Method>

After the preparation of the hole injection layer-forming composition, the composition is coated/deposited by a wet film-forming method on a layer corresponding to the underlying layer (usually anode 2) of the hole injection layer 3 and dried to form the hole injection layer 3.

The temperature in the coating step is preferably 10° C. or more and is preferably 50° C. or less, because the film is less likely to have a defect due to production of a crystal in the composition.

The relative humidity in the coating step is not limited as long as the effects of the present invention are not seriously impaired. The relative humidity is usually 0.01 ppm or more and is usually 80% or less.

After the coating of the hole injection layer-forming composition, the film of the hole injection layer-forming composition is usually dried by heating or the like. Examples of the heating means used in the heating step include an oven, a hot plate, an infrared ray, a halogen heater, and microwave irradiation. Among these, an oven and a hot plate are preferred from the point of view that heat is likely to be evenly applied throughout the film.

The heating temperature in the heating step may be arbitrarily selected as long as the effects of the present invention are not seriously impaired. The heating temperature is preferably a temperature not lower than the boiling point of the solvent used for the hole injection layer-forming composition. In the case where two or more kinds of solvents are contained in the hole injection layer, the heating is preferably performed at a temperature not lower than the boiling point of at least one kind of the solvent. Considering a rise in the boiling point of the solvent, the heating in the heating step is preferably performed at 120° C. or more and preferably at 410° C. or less.

In the heating step, the heating time is not limited as long as the heating temperature is not lower than the boiling point of the solvent in the hole injection layer-forming composition and full insolubilization of the coating film occurs. The heating time is preferably 10 seconds or more and is usually 180 minutes or less. The heating time is preferably short because the components in other layers are less likely to diffuse, and, on the other hand, the heating time is preferably long because the hole injection layer is liable to become homogeneous. Heating may be performed in two portions.

Incidentally, at the wet film formation of the hole injection layer 3, the wet film formation may be performed in any one of the above-described film formation environments 1 to 3, but in general, the effect of the film formation environment of the hole injection layer on the element lifetime is not so large compared with the film formation environment of the emitting layer and therefore, the film formation of the hole injection layer 3 may be normal wet film formation in the air.

{Formation of Hole Injection Layer 3 by Vacuum Deposition Method}

In the case of forming the hole injection layer 3 by vacuum deposition, for example, the layer may be formed through the following procedure. One material or two or more materials out of the constituent materials (for example, the above-described hole transporting compound and electron-accepting compound) of the hole injection layer 3 are put in a crucible (when using two or more materials, in respective crucibles) placed in a vacuum vessel, and the inside of the vacuum vessel is evacuated to about $10^{-4}$ Pa by a vacuum pump. The crucible is heated (in the case of using two or more materials, respective crucibles are heated) to evaporate the material by controlling the amount of evaporation (in the case of using two or more materials, evaporate the materials by independently controlling each amount of evaporation), whereby a hole injection layer 3 is formed on the anode 2 on the substrate 1 placed to face the crucible. Incidentally, in the case of using two or more materials, the hole injection layer 3 may be also formed by putting a mixture of these materials in a crucible, and heating and evaporating the mixture.

The degree of vacuum at the vapor deposition is not limited as long as the effects of the present invention are not seriously impaired. The degree of vacuum is usually $0.1 \times 10^{-6}$ Torr ($0.13 \times 10^{-4}$ Pa) or more and is usually $9.0 \times 10^{-6}$ Torr ($12.0 \times 10^{-4}$ Pa) or less. The vapor deposition rate is not limited as long as the effects of the present invention are not seriously impaired. The vapor deposition rate is usually 0.1 Å/sec or more and is usually 5.0 Å/sec or less. The film formation temperature at the vapor deposition is not limited as long as the effects of the present invention are not seriously impaired. The film formation is performed preferably at 10° C. or more and preferably at 50° C. or less.

[Hole Transport Layer]

The hole transport layer 4 can be formed on the hole injection layer 3 in the case of having a hole injection layer 3 and can be formed on the anode 2 in the case of not having a hole injection layer 3. Also, the organic electroluminescence element of the present invention may have a configuration where the hole transport layer 4 is omitted.

The method for forming the hole transport layer 4 may be a vacuum deposition method or a wet film-forming method and is not particularly limited. From the standpoint of reducing the dark spot, the hole transport layer 4 is preferably formed by a wet film-forming method and more preferably wet-deposited in any one environment of the film formation environments 1 to 3 according to the method of the present invention.

The material for forming the hole transport layer 4 is preferably a material having high hole transporting property and being capable of efficiently transporting the injected hole. Accordingly, a material having small ionization potential, high transparency to visible light, large hole mobility and excellent stability and hardly allowing impurities working out to a trap to be produced during production or use is preferred. Also, the hole transport layer 4 when contacted with an emitting layer 5 preferably causes no quenching of light emitted from the emitting layer 5 or no formation of an exciplex with the luminescent layer 5 to reduce the efficiency.

The material for such a hole transport layer 4 may be sufficient if it is a material conventionally used as a constituent material of the hole transport layer 4. Specifically, the material includes, for example, those described above as examples of the hole transporting compound used in the hole injection layer 3. Other examples include an arylamine derivative, a fluorene derivative, a spiro derivative, a carbazole derivative, a pyridine derivative, a pyrazine derivative, a pyrimidine derivative, a triazine derivative, a quinoline derivative, a phenanthroline derivative, a phthalocyanine derivative, a porphyrin derivative, a silole derivative, an oligothiophene derivative, a condensed polycyclic aromatic derivative, and a metal complex.

Furthermore, examples of the material include a polyvinylcarbazole derivative, a polyarylamine derivative, a polyvinyltriphenylamine derivative, a polyfluorene derivative, a polyarylene derivative, a tetraphenylbenzidine-containing polyarylene ether sulfone derivative, a polyarylene vinylene derivative, a polysiloxane derivative, a polythiophene derivative, and a poly(p-phenylenevinylene) derivative. These may be any one of an alternating copolymer, a random copolymer, a block copolymer and a graft copolymer, and may be also a polymer having a branch in the main chain and having three or more terminal portions, so-called a dendrimer.

Among these, a polyarylamine derivative and a polyarylene derivative are preferred.

The polyarylamine derivative is preferably a polymer containing a repeating unit represented by the following formula (II). Above all, a polymer composed of repeating units represented by the following formula (II) is preferred, and in this case, $Ar^a$ or $Ar^b$ may differ among respective repeating units.

[Chem. 25]

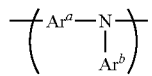

(II)

(wherein each of $Ar^a$ and $Ar^b$ independently represents an aromatic ring group which may have a substituent). The aromatic ring group as used herein indicates an aromatic hydrocarbon group or an aromatic heterocyclic group.

Examples of the aromatic hydrocarbon group which may have a substituent of $Ar^a$ and $Ar^b$ include a group derived from a 6-membered monocyclic ring or a 2- to 5-fused ring such as benzene ring, naphthalene ring, anthracene ring, phenanthrene ring, perylene ring, tetracene ring, pyrene ring, benzopyrene ring, chrysene ring, triphenylene ring, acenaphthene ring, fluoranthene ring and fluorene ring, and a group formed by connecting two or more of these rings by direct bonding.

Examples of the aromatic heterocyclic group which may have a substituent include a group derived from a 5- or 6-membered monocyclic ring or a 2- to 4-fused ring such as furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisoxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, phenanthridine ring, perimidine ring, quinazoline ring, quinazolinone ring and azulene ring, and a group formed by connecting two or more of these rings by direct bonding.

In view of solubility and heat resistance, each of $Ar^a$ and $Ar^b$ is independently, preferably a group derived from a ring selected from the group consisting of a benzene ring, a naphthalene ring, an anthracene ring, a phenanthrene ring, a triphenylene ring, a pyrene ring, a thiophene ring, a pyridine ring and a fluorene ring, or a group formed by connecting two or more benzene rings (for example, a biphenyl group (biphenyl group) or a terphenylene group (terphenylene group)).

Above all, a group derived from a benzene ring (phenyl group), a group formed by connecting two benzene rings (biphenyl group), and a group derived from a fluorene ring (fluorenyl group) are preferred.

Examples of the substituent which may be substituted on the aromatic ring group of $Ar^a$ and $Ar^b$ include an alkyl group, an alkenyl group, an alkynyl group, an alkoxy group, an aryloxy group, an alkoxycarbonyl group, a dialkylamino group, a diarylamino group, an acyl group, a halogen atom, a haloalkyl group, an alkylthio group, an arylthio group, a silyl group, a siloxy group, a cyano group, an aromatic hydrocarbon group and an aromatic heterocyclic group.

The polyarylene derivative includes, for example, a polymer having, in its repeating unit, an arylene group such as an aromatic ring group which may have a substituent, described as examples for $Ar^a$ or $Ar^b$ in formula (II).

The polyarylene derivative is preferably a polymer containing a repeating unit composed of the following formula (V-1) and/or the following formula (V-2):

[Chem. 26]

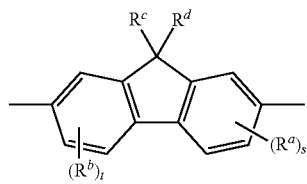

(V-1)

(wherein each of $R^a$, $R^b$, $R^c$ and $R^d$ independently represents an alkyl group, an alkoxy group, a phenylalkyl group, a phenylalkoxy group, a phenyl group, a phenoxy group, an alkylphenyl group, an alkoxyphenyl group, an alkylcarbonyl group, an alkoxycarbonyl group or a carboxy group, each of t and s independently represents an integer of 0 to 3, provided that when t or s is 2 or more, the plural $R^a$s or $R^b$s contained per molecule may be the same or different and adjacent $R^a$s or $R^b$s may form a ring);

[Chem. 27]

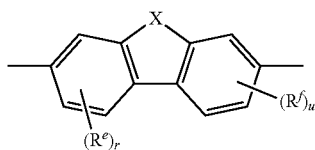

(V-2)

(wherein each of $R^e$ and $R^f$ independently has the same meaning as $R^b$ or $R^a$ in formula (V-1), each of r and u independently represents an integer of 0 to 3, provided that when r or u is 2 or more, the plural $R^e$s or $R^f$s contained per molecule may be the same or different and adjacent $R^e$s or $R^f$s may form a ring, and X represents an atom or atomic group constituting a 5-membered ring or a 6-membered ring).

Specific examples of X include —O—, —BR—, —NR—, —SiR$_2$—, —PR—, —SR—, —CR$_2$—, and a group formed by combining these. R represents a hydrogen atom or an arbitrary organic group. The organic group as used in the present invention is a group containing at least one carbon atom.

The polyarylene derivative preferably further contain a repeating unit represented by the following formula (V-3), in addition to the repeating unit composed of formula (V-1) and/or formula (V-2):

[Chem. 28]

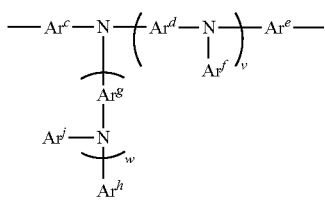

(V-3)

(wherein each of $Ar^c$ to $Ar^j$ independently represents an aromatic ring group which may have a substituent, and each of v and w independently represents 0 or 1).

Specific examples of $Ar^c$ to $Ar^j$ are the same as those of $Ar^a$ and $Ar^b$ in formula (II).

Specific examples of formulae (V-1) to (V-3), specific examples of the polyarylene derivative, and the like include those described in JP-A-2008-98619.

In the case of forming the hole transport layer 4 by a wet film-forming method, the layer can be formed by preparing a hole transport layer-forming composition and after wet film formation, drying by heating the coating film, similarly to the method for forming the hole injection layer 3.

The hole transport layer-forming composition contains a solvent in addition to the above-described hole transporting compound. The solvent used is the same as the solvent used for the hole injection layer-forming composition. Also, the film formation conditions, heating/drying conditions and the like are the same as those in the formation of the hole injection layer 3.

Also in the case of forming the hole transport layer 4 by a vacuum deposition method, the film formation conditions and the like are the same as those in the formation of the hole injection layer 3.

The hole transport layer 4 may contain various luminescent materials, electron transporting compounds, binder resins, coatability improvers and the like, in addition to the hole transporting compound.

The hole transport layer 4 may be a layer formed by crosslinking a crosslinking compound. The crosslinking compound is a compound having a crosslinking group and forms a network polymer compound by undergoing crosslinking.

Examples of the crosslinking group include a group derived from cyclic ether such as oxetane and epoxy; a group derived from an unsaturated double bond, such as vinyl group, trifluorovinyl group, styryl group, acryl group, methacryloyl and cinnamoyl; and a group derived from benzocyclobutane.

The crosslinking compound may be any of a monomer, an oligomer and a polymer. Only one kind of a crosslinking compound may be used, or two or more kinds of crosslinking compounds may be used in arbitrary combination at an arbitrary ratio.

As the crosslinking compound, a hole transporting compound having a crosslinking group is preferably used. The hole transporting compound includes those described above as examples. The hole transporting compound includes compounds where a crosslinking group is bonded to the main chain or side chain of the hole transporting compound above. In particular, the crosslinking group is preferably bonded to the main chain through a linking group such as alkylene group. Above all, the hole transporting compound is preferably a polymer containing a repeating unit having a crosslinking group and is preferably a polymer containing a repeating unit where a crosslinking group is bonded to formula (II) or formula (V-1) to (V-3) directly or through a linking group.

Examples of the hole transporting compound include a nitrogen-containing aromatic compound derivative such as pyridine derivative, pyrazine derivative, pyrimidine derivative, triazine derivative, quinoline derivative, phenanthroline derivative, carbazole derivative, phthalocyanine derivative and porphyrin derivative; a triphenylamine derivative; a silole derivative; an oligothiophene derivative, a condensed polycyclic aromatic derivative, and a metal complex. Among these, a nitrogen-containing aromatic derivative such as pyridine derivative, pyrazine derivative, pyrimidine derivative, triazine derivative, quinoline derivative, phenanthroline derivative and carbazole derivative; a triphenylamine derivative, a silole derivative, a condensed polycyclic aromatic derivative and a metal complex are preferred, and a triphenylamine derivative is more preferred.

For forming the hole transport layer 4 by crosslinking a crosslinking compound, usually, a hole transport layer-forming composition obtained by dissolving or dispersing a crosslinking compound in a solvent is prepared, and the composition is deposited as a film by wet film formation and then crosslinked.

The hole transport layer-forming composition may contain an additive for accelerating the crosslinking reaction, other than the crosslinking compound. Examples of the additive for accelerating the crosslinking reaction include a polymerization initiator and a polymerization accelerator, such as alkylphenone compound, acylphosphine oxide compound, metallocene compound, oxime ester compound, azo compound and onium salt; and a photosensitizer such as condensed polycyclic hydrocarbon, porphyrin compound and diaryl ketone compound.

Also, the hole transport layer-forming composition may contain a coatability improver such as leveling agent and defoaming agent; an electron-accepting compound; a binder resin; and the like.

The hole transport layer-forming composition contains the crosslinking compound in an amount of usually 0.01 wt % or more, preferably 0.05 wt % or more, more preferably 0.1 wt % or more, and usually 50 wt % or less, preferably 20 wt % or less, more preferably 10 wt % or less.

The hole transport layer-forming composition containing a crosslinking compound in such a concentration is deposited on the underlying layer (usually, the hole injection layer 3) and then, the crosslinking compound is crosslinked under heating and/or by irradiation with active energy such as light to form a network polymer compound.

The conditions such as temperature and humidity at the film formation are the same as those at the wet film formation of the hole injection layer.

The method for heating after film formation is not particularly limited. The heating temperature condition is usually 120° C. or more and is preferably 400° C. or less.

The heating time is usually 1 minute or more and is preferably 24 hours or less. The heating method is not particularly limited. The heating is performed, for example, by a method of placing the laminate having the deposited layer on a hot plate or heating it in an oven. For example, conditions such as heating on a hot plate at 120° C. or more for 1 minute or more may be employed.

In the case of crosslinking the compound by the irradiation with active energy such as light, examples of the method therefor include direct irradiation with an ultraviolet, visible or infrared light source such as ultrahigh pressure mercury lamp, high pressure mercury lamp, halogen lamp and infrared lamp, and irradiation using a mask aligner having incorporated thereinto the light source described above or using a conveyor-type light irradiation apparatus. The method for irradiation with active energy other than light includes, for example, irradiation using an apparatus capable of irradiating a microwave generated by a magnetron, that is, a so-called microwave oven. As for the irradiation time, a condition necessary to reduce the solubility of the film is preferably set. The irradiation time is usually 0.1 seconds or more and preferably 10 hours or less.

Heating and irradiation with active energy such as light may be performed individually or in combination. In the case of combining these means, the order of practicing them is not particularly limited.

The film thickness of the thus-formed hole transport layer 4 is usually 5 nm or more, preferably 10 nm or more, and, on the other hand, is usually 300 nm or less, preferably 100 nm or less.

[Emitting Layer]

An emitting layer 5 is usually provided on the hole injection layer 3 or when a hole transport layer 4 is provided, on the hole transport layer 4. The emitting layer 5 is a layer which becomes a main luminous source by being excited when a hole injected from the anode 2 and an electron injected from the cathode 9 are recombined between electrodes to which an electric field is applied.

{Emitting Layer Material}

The emitting layer 5 contains at least a material having luminescent property (luminescent material) as its constituent material. The emitting layer 5 preferably contains, as its constituent material, a compound having a property of transporting a hole (hole transporting compound) or a compound having a property of transporting an electron (electron transporting compound). It is also possible to use a luminescent material as the dopant material and use a hole transporting compound, an electron transporting compound or the like as the host material in the emitting layer 5. The luminescent material is not particularly limited. As the luminescent material, a substance emitting light at a desired emission wavelength and giving good luminous efficiency may be used. The emitting layer 5 may contain other components as long as the effects of the present invention are not seriously impaired. Incidentally, in the case of forming the emitting layer 5 by a wet film-forming method, a material having a low molecular weight is preferably used for all components.

<Luminescent Material>

As the luminescent material, an arbitrary known material can be applied. The luminescent material may be, for example, a fluorescent material or a phosphorescent material. In view of inner quantum efficiency, the luminescent material is preferably a phosphorescent material. Also, plural kinds of luminescent materials may be used in combination, for example, while using a fluorescent material for blue, a phosphorescent material may be used for green and red.

In the luminescent material, for the purpose of enhancing the solubility of the luminescent material for a solvent, it is preferred to reduce the molecular symmetry or rigidity of the luminescent material or introduce a lipophilic substituent such as alkyl group.

Examples of the fluorescent material out of the luminescent materials are described below. However, the fluorescent dye is not limited to these examples.

Examples of the fluorescent material giving blue luminescence (blue fluorescent dye) include naphthalene, perylene, pyrene, chrysene, anthracene, coumarin, p-bis(2-phenylethenyl)benzene, and derivatives thereof.

Examples of the fluorescent material giving green luminescence (green fluorescent dye) include a quinacridone derivative, a coumarin derivative, and an aluminum complex such as $Al(C_9H_6NO)_3$.

Examples of the fluorescent material giving yellow luminescence (yellow fluorescent dye) include rubrene and a perimidone derivative.

Examples of the fluorescent material giving red luminescence (red fluorescent dye) include a DCM (4-(dicyanomethylene)-2-methyl-6-(p-dimethylaminostyryl)-4H-pyran)-based compound, a benzopyran derivative, a Rhodamine derivative, a benzothioxanthene derivative, and azabenzothioxanthene.

Examples of the phosphorescent material include organometallic complexes described as examples of the organic electroluminescence element material in the organic electroluminescence element composition used for the formation of an organic layer by a wet film-forming method in the production method of an organic electroluminescence element of the present invention.

The compound used as the luminescent material may have an arbitrary molecular weight as long as the effects of the present invention are not seriously impaired. The molecular weight of the luminescent material is preferably large from the point of view that, for example, the heat resistance is excellent, gas generation scarcely occurs, the film formed can have excellent film quality, or the organic electroluminescence element is less likely to cause a change in the morphology due to migration or the like. On the other hand, the molecular weight of the luminescent material is preferably small from the standpoint that purification of the organic compound is facilitated and dissolution in a solvent is easily attained in a short time. For these reasons, specifically, the molecular weight is usually 10,000 or less, preferably 5,000 or less, more preferably 4,000 or less, still more preferably 3,000 or less, and, on the other hand, is usually 100 or more, preferably 200 or more, more preferably 300 or more, still more preferably 400 or more.

Only one of these luminescent materials may be used, or two or more thereof may be used in arbitrary combination at an arbitrary ratio.

The ratio of the luminescent material in the emitting layer may be arbitrarily selected as long as the effects of the present invention are not seriously impaired. The ratio of the luminescent material in the emitting layer is preferably large in view of luminous efficiency, but, on the other hand, the ratio is preferably small from point of view that luminescence unevenness is less likely to occur. Accordingly, the ratio of the luminescent material in the emitting layer is usually 0.05 wt % or more and is usually 35 wt % or less. In the case of using two or more kinds of luminescent materials in combination, the total content thereof is preferably set to fall in the range above.

<Hole Transporting Compound>

The emitting layer 5 may contain a hole transporting compound as its constituent material. Here, out of hole transporting compounds, examples of the hole transporting compound having a low molecular weight include various compounds described above as examples of (Hole Transporting Compound Having Low Molecular Weight) in the hole injection layer. Other examples of the hole transporting compound having a low molecular weight include an aromatic diamine containing two or more tertiary amines, in which two or more fused aromatic rings are substituted on the nitrogen atom, typified by 4,4'-bis[N-(1-naphthyl)-N-phenylamino]biphenyl (JP-A-5-234681); an aromatic amine compound having a starburst structure, such as 4,4',4''-tris(1-naphthylphenylamino)triphenylamine (*Journal of Luminescence*, Vol. 72-74, page 985, 1997); an aromatic amine compound composed of a tetramer of triphenylamine (*Chemical Communications*, page 2175, 1996); and a spiro compound such as 2,2',7,7'-tetrakis-(diphenylamino)-9,9'-spirobifluorene (*Synthetic Metals*, Vol. 91, page 209, 1997).

In the emitting layer 5, as the hole transporting compound, only one kind of a compound may be used, or two or more kinds of compounds may be used in arbitrary combination at an arbitrary ratio.

In the emitting layer 5, the ratio of the hole transporting compound may be arbitrarily selected as long as the effects of the present invention are not seriously impaired. The ratio of the hole transporting compound is preferably large from the point of view that the layer is hardly susceptible to a short circuit, and, on the other hand, the ratio is preferably small from the standpoint that thickness unevenness is scarcely caused. The ratio of the hole transporting compound in the emitting layer 5 is usually 0.1 wt % or more and is usually 65 wt % or less. In the case of using two or more kinds of hole transporting compounds in combination, the total content thereof is preferably set to fall in the range above.

<Electron Transporting Compound>

The emitting layer 5 may contain an electron transporting compound as its constituent material. Here, out of electron transporting compounds, examples of the electron transporting compound having a low molecular weight include 2,5-bis (1-naphthyl)-1,3,4-oxadiazole (BND), 2,5-bis(6'-(2',2''-bipyridyl))-1,1-dimethyl-3,4-diphenylsole (PyPySPyPy), bathophenanthroline (BPhen), 2,9-dimethyl-4,7-diphenyl-1, 10-phenanthroline (BCP, bathocuproine), 2-(4-biphenylyl)-5-(p-tertiary-butylphenyl)-1,3,4-oxadiazole (tBu-PBD), and 4,4'-bis(9-carbazole)-biphenyl (CBP). In the emitting layer, as the electron transporting compound, only one kind of a compound may be used, or two or more kinds of compounds may be used in arbitrary combination at an arbitrary ratio.

In the emitting layer 5, the ratio of the electron transporting compound may be arbitrarily selected as long as the effects of the present invention are not seriously impaired. The ratio of the electron transporting compound is preferably large from the point of view that the layer is hardly susceptible to a short circuit, and the ratio is preferably small from the standpoint that thickness unevenness is scarcely caused. The ratio of the electron transporting compound in the emitting layer 5 is usually 0.1 wt % or more and is usually 65 wt % or less. In the case of using two or more kinds of electron transporting compounds in combination, the total content thereof is preferably set to fall in the range above.

{Formation of Emitting Layer}

In the case of forming the emitting layer 5 by a wet film-forming method according to the present invention, the above-described materials are dissolved in an appropriate solvent to prepare an emitting layer-forming composition, and the composition is wet-deposited as a film, whereby the emitting layer 5 can be formed. The wet film formation is preferably performed in any one environment of the above-described film formation environments 1 to 3.

As the emitting layer solvent contained in the emitting layer-forming composition for forming the emitting layer 5 by a wet film-forming method according to the present invention, an arbitrary solvent can be used as long as an emitting layer can be formed. Suitable examples of the emitting layer solvent are the same as those described above for the solvent in the hole injection layer-forming composition.

The ratio of the emitting layer solvent to the emitting layer-forming composition for forming the emitting layer may be arbitrarily selected as long as the effects of the present invention are not seriously impaired. The ratio of the emitting layer solvent to the emitting layer-forming composition is usually 30 wt % or more and usually 99.9 wt % or less. In the case of using a mixture of two or more solvents as the emitting layer solvent, the total amount of these solvents is preferably set to fall in the range above.

The total concentration of solid contents such as emitting material, hole transporting compound and electron transporting compound in the emitting layer-forming composition is preferably low from the point of view that film thickness unevenness can be hardly caused, and, on the other hand, the total concentration is preferably high from the standpoint that a defect is scarcely produced in the film. The total concentration of solid contents is usually 0.01 wt % or more and is usually 70 wt % or less.

After wet film formation of the emitting layer-forming composition, the obtained coating film is dried to remove the solvent, whereby the emitting layer 5 is formed. Specifically, the method for forming the emitting layer 5 is the same as the method described above for the formation of the hole injection layer 4. The wet film-forming method is not limited in its system, and any system may be used as long as the effects of the present invention are not seriously impaired.

The film thickness of the emitting layer 5 may be arbitrarily selected as long as the effects of the present invention are not seriously impaired. The film thickness of the emitting layer 5 is preferably large from the point of view that a defect is scarcely produced in the film, but on the other hand, the film thickness is preferably small from the standpoint that the driving voltage is liable to be reduced. The film thickness of the emitting layer 5 is usually 3 nm or more, preferably 5 nm or more, and is usually 200 nm or less, preferably 100 nm or less.

[Hole Blocking Layer]

A hole blocking layer 6 may be provided between the emitting layer 5 and the later-described electron injection layer 8. The hole blocking layer 6 is a layer usually stacked on the emitting layer 5 to come into contact with the interface on the cathode 9 side of the emitting layer 5.

The hole blocking layer 6 has a role of blocking a hole moving from the anode 2 to reach the cathode 9 and a role of efficiently transporting an electron injected from the cathode 9 toward the emitting layer 5.

Physical properties required of the material constituting the hole blocking layer 6 include high electron mobility, low hole mobility, large energy gap (difference between HOMO and LUMO), and high triplet excited level (T1). Examples of the hole blocking layer 6 material satisfying these conditions include a mixed ligand complex such as bis(2-methyl-8-quinolinolato)(phenolato)aluminum and bis(2-methyl-8-quinolinolato)(triphenylsilanolato)aluminum, a metal complex such as bis(2-methyl-8-quinolate)aluminum-μ-oxo-bis-(2-methyl-8-quinolilato)aluminum binuclear metal complex, a styryl compound such as distyrylbiphenyl derivative (JP-A-11-242996), a triazole derivative such as 3-(4-biphenylyl)-4-phenyl-5(4-tert-butylphenyl)-1,2,4-triazole (JP-A-7-41759), and a phenanthroline derivative such as bathocuproine (JP-A-10-79297). Furthermore, a compound having at least one pyridine ring substituted at 2-, 4- and 6-positions described in International Publication No. 2005-022962 is also preferred as the material of the hole blocking layer 6.

As the material of the hole blocking layer 6, only one kind of a material may be used, or two or more kinds of materials may be used in arbitrary combination at an arbitrary ratio.

The method for forming the hole blocking layer 6 is not limited. Accordingly, the layer can be formed by a wet film-forming method, a vapor deposition method or other methods.

The film thickness of the hole blocking layer 6 may be arbitrarily selected as long as the effects of the present invention are not seriously impaired. The film thickness of the hole blocking layer 6 is usually 0.3 nm or more, preferably 0.5 nm or more, and, on the other hand, is usually 100 nm or less, preferably 50 nm or less.

[Electron Transport Layer]

An electron transport layer 7 may be provided between the emitting layer 5 and the later-described electron injection layer 8.

The electron transport layer 7 is a layer provided for the purpose of more enhancing the luminous efficiency of the element. The electron transport layer 7 is formed of a compound capable of efficiently transporting an electron injected from the cathode 9 toward the emitting layer 5 between the electrodes to which an electric field is applied.

As the electron transporting compound used for the electron transport layer 7, a compound having high electron injection efficiency from the cathode 9 or the electron injection layer 8 and high electron mobility and being capable of efficiently transporting the injected electron is usually used. Examples of the compound satisfying these conditions include a metal complex such as aluminum complex of 8-hydroxyquinoline (JP-A-59-194393), a metal complex of 10-hydroxybenzo[h]quinoline, an oxadiazole derivative, a distyrylbiphenyl derivative, a silole derivative, a 3-hydroxyflavone metal complex, a 5-hydroxyflavone metal complex, a benzoxazole metal complex, a benzothiazole metal complex, trisbenzimidazolylbenzene (U.S. Pat. No. 5,645,948), a quinoxaline compound (JP-A-6-207169), a phenanthroline derivative (JP-A-5-331459), 2-tert-butyl-9,10-N,N-dicyanoanthraquinonediimine, n-type hydrogenated amorphous silicon carbide, n-type zinc sulfide, and n-type zinc selenide.

As the material of the electron transport layer 7, only one kind of a material may be used, or two or more kinds of materials may be used in arbitrary combination at an arbitrary ratio.

The method for forming the electron transport layer 7 is not limited. Accordingly, the layer can be formed by a wet film-forming method, a vapor deposition method or other methods.

The film thickness of the electron transport layer 7 may be arbitrarily selected as long as the effects of the present invention are not seriously impaired. The film thickness of the electron transport layer 7 is usually 1 nm or more, preferably 5 nm or more, and, on the other hand, is usually 300 nm or less, preferably 100 nm or less.

[Electron Injection Layer]

The electron injection layer 8 fulfills the role of efficiently injecting an electron injected from the cathode 9, into the emitting layer 5. In order to efficiently perform the electron injection, the material forming the electron injection layer 8 is preferably a metal having a low work function. Examples thereof include an alkali metal such as sodium and cesium, and an alkaline earth metal such as barium and calcium. The film thickness of the electron injection layer 8 is usually 0.1 nm or more and is preferably 5 nm or less.

In the electron injection layer 8, an organic electron transport compound typified by a nitrogen-containing heterocyclic compound such as bathophenanthroline and a metal complex such as aluminum complex of 8-hydroxyquinoline is preferably doped with an alkali metal such as sodium, potassium, cesium, lithium and rubidium (described, for example, in JP-A-10-270171, JP-A-2002-100478 and JP-A-2002-100482), because both enhanced electron injection/transport performance and excellent film quality can be achieved. In this case, the film thickness is usually 5 nm or more, preferably 10 nm or more, and is usually 200 nm or less, preferably 100 nm or less.

As the material of the electron injection layer 8, only one kind of a material may be used, or two or more kinds of materials may be used in arbitrary combination at an arbitrary ratio.

The method for forming the electron injection layer 8 is not limited. Accordingly, the layer can be formed by a wet film-forming method, a vapor deposition method or other methods.

[Cathode]

The cathode 9 fulfills the role of injecting an electron into the layer (for example, the electron injection layer 8 or the emitting layer 5) on the emitting layer 5 side.

As the material of the cathode 9, materials used for the anode 2 may be used. In order to efficiently perform the electron injection, the material of the cathode 9 is preferably a metal having a low work function. Specifically, for example, an appropriate metal such as tin, magnesium, indium, calcium, aluminum and silver, is used. An alloy thereof is also preferably used. Specific examples thereof include an alloy electrode having a low work function, such as magnesium-silver alloy, magnesium-indium alloy and aluminum-lithium alloy.

Incidentally, as the material of the cathode 9, only one kind of a material may be used, or two or more kinds of materials may be used in arbitrary combination at an arbitrary ratio.

The film thickness of the cathode 9 is usually the same as that of the anode 2.

For the purpose of protecting the cathode 9 composed of a metal having a low work function, a metal layer having a high work function and being stable to the air is preferably further stacked thereon, because the stability of the element is increased. For example, a metal such as aluminum, silver, copper, nickel, chromium, gold and platinum is used for this purpose. As such a material, only one kind of a material may be used, or two or more kinds of materials may be used in arbitrary combination at an arbitrary ratio.

[Other Layers]

The organic electroluminescence element of the present invention may have other configurations without departing from the scope of the invention. For example, the organic electroluminescence element according to the present invention may have an arbitrary layer between the anode 2 and the cathode 9 in addition to the layers described above as long as the performance thereof is not impaired. Also, out of the layers described above, an arbitrary layer may be omitted.

The layer which may be provided other than the layers described above includes, for example, an electron blocking layer.

The electron blocking is usually provided between the hole injection layer 3 or hole transport layer 4 and the emitting layer 5. The electron blocking layer has a role of blocking an electron moving from the emitting layer 5 to reach the hole injection layer 3, thereby increasing the probability of recombination of a hole and an electron in the emitting layer 5 and confining the produced exciton in the emitting layer 5, and a role of efficiently transporting a hole injected from the hole injection layer 3 toward the emitting layer 5. In particular, when a phosphorescent material or a blue emitting material is used as the luminescent material, it is effective to provide an electron blocking layer.

The characteristics required of the electron blocking layer include high hole transportability, large energy gap (difference between HOMO and LUMO), and high triplet excited level (T1). Furthermore, in the present invention, when the emitting layer 5 is produced as the organic layer according to the present invention by a wet film-forming method, the electron blocking layer is also required to have wet film formation compatibility. Examples of the material used for such an electron blocking layer include a copolymer of dioctylfluorene and triphenylamine, typified by F8-TFB (International Publication No. 2004/084260).

As the material of the electron blocking layer, only one kind of a material may be used, or two or more kinds of materials may be used in arbitrary combination at an arbitrary ratio.

The method for forming the electron blocking layer is not limited. Accordingly, the layer can be formed by a wet film-forming method, a vapor deposition method or other methods.

It is also an effective method for enhancing the element efficiency to insert an ultrathin insulating film (from 0.1 to 5 nm) formed of, for example, lithium fluoride (LiF), magnesium fluoride ($MgF_2$), lithium oxide ($Li_2O$) or cesium(II) carbonate ($CsCO_3$) into the interface between the cathode 9 and the emitting layer 5 or the electron transport layer 7 (see, for example, *Applied Physics Letters*, Vol. 70, page 152 (1997); JP-A-10-74586; *IEEE Transactions on Electron Devices*, Vol. 44, page 1245 (1997); and *SID* 04 *Digest*, page 154).

Furthermore, in the layer configuration described above, the constituent elements except for the substrate may be stacked in reverse order. For example, in the layer configuration of FIG. 1, other constituent elements may be provided on the substrate 1 in order of a cathode 9, an electron injection layer 8, an electron transport layer 7, a hole blocking layer 6, an emitting layer 5, a hole transport layer 4, a hole injection layer 3 and an anode 2.

In addition, the organic electroluminescence element according to the present invention can be also configured by stacking constituent elements except for the substrate between two substrates with at least one substrate having transparency.

A structure where constituent elements (luminescent unit) except for the substrate are layered in plural tiers (a structure where plural luminescent units are stacked) may be also employed. In this case, when a carrier generation layer (CGL) composed of, for example, vanadium pentoxide ($V_2O_5$) is provided in place of interface layers (when the anode is ITO and the cathode is Al, these two layers) between respective tiers (between luminescent units), the barrier between tiers is reduced and this more preferred in view of luminous efficiency and driving voltage.

Also, the organic electroluminescence element according to the present invention may be configured as a single organic electroluminescence element, may be applied to a configuration where plural organic electroluminescence elements are arranged in an array manner, or may be applied to a configuration where the anode and the cathode are arranged in an X-Y matrix manner.

In each of the above-described layers, components other than those described as the material may be contained as long as the effects of the present invention are not seriously impaired.

[3] Organic EL Display Device

The organic EL display device of the present invention is a display device using the above-described organic electroluminescence element of the present invention. The organic EL display device of the present invention is not particularly limited in its mode or structure. The organic EL display device of the present invention can be fabricated according to a conventional method by using the organic electroluminescence element of the present invention. Specifically, for example, the organic EL display device of the present invention can be fabricated by such a method as described in Seishi Tokito, Chihaya Adachi and Hideyuki Murata, *Yuki EL Display* (*Organic EL Display*), Ohm-Sha (Aug. 20, 2004).

[4] Organic EL Lighting

The organic EL lighting of the present invention is a lighting using the above-described organic electroluminescence element of the present invention. The organic EL lighting of the present invention is not particularly limited in the mode or structure of the organic EL lighting of the present invention. The organic EL lighting of the present invention can be fabricated according to a conventional method by using the organic electroluminescence element of the present invention.

[5] Apparatus for Producing Organic Electroluminescence Element

The apparatus for producing an organic electroluminescence element of the present invention is described below by referring to the drawing.

Figure 2:
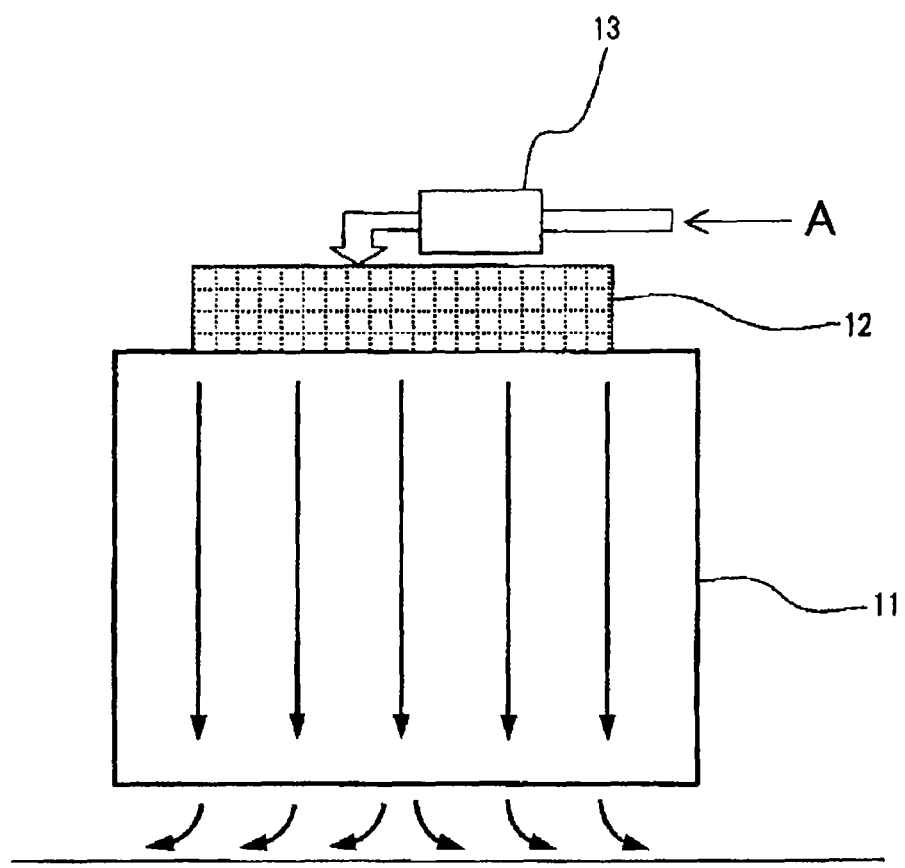
FIG. 2 is a view schematically showing one example of the internal structure of the apparatus for producing an organic electroluminescence element of the present invention.

FIG. 2 is a view schematically showing one example of the internal structure of the apparatus for producing an organic electroluminescence element of the present invention.

In FIG. 2, 11 is a housing, and wet film formation of an organic layer is performed in this housing 11. That is, a substrate for forming an organic layer thereon by a wet film-forming method (for example, when the organic layer formed is a hole transport layer, a substrate on which an anode and further, if desired, a hole injection layer are formed, and when the organic layer formed is an emitting layer, a substrate on which an anode and further, if desired, a hole transport layer, or a hole injection layer and a hole transport layer are formed) is charged into the housing 11, and a coating film for the organic layer is formed by the above-described wet film-forming method.

12 is air purification means for purifying air fed into the housing 11 and reducing at least any one of the carbon dioxide concentration, the sulfur oxide concentration and the nitrogen oxide concentration in the air, thereby creating the film formation environments 1 to 3 in the housing 11. In the air purification means 12, for example, the above-described chemical filter for purifying air A introduced from an air blower 13 and led to pass through the filter, an activated carbon layer, a water layer, or a combination thereof is provided.

According to such an apparatus for producing an organic electroluminescence element, in a simple apparatus mainly consisting of an air blower 13, air purification means 12 and a housing 11, the purified air can be fed into the housing 11 and wet-deposited under the condition of the film formation environments 1 to 3, so that the problem of deterioration during film formation can be eliminated and a high-efficiency, long-life organic electroluminescence element of the present invention can be efficiently produced by an inexpensive apparatus or facility.

EXAMPLES

The present invention is described in greater detail below by referring to Examples, but the present invention is not limited to the following Examples as long as the gist of the present invention is observed.

[Method for Quantitative Determination of Specific Component in Environment]

(1) Measuring Method of Carbon Dioxide Concentration

The carbon dioxide concentration in the environment was measured using "GC-2010" manufactured by Shimadzu Corporation. Specifically, a gas prepared by mixing an He standard gas containing carbon dioxide in a predetermined concentration and a nitrogen gas at various flow rate ratios was introduced into "GC-2010" manufactured by Shimadzu Corporation and measured by a gas chromatograph. A calibration curve of the carbon dioxide concentration and the signal strength of GC/TCD was formed. Subsequently, a gas to be measured was trapped in a predetermined amount in a syringe having a cock at its tip and then introduced into "GC-2010" manufactured by Shimadzu Corporation, and GC/TCD measurement was performed. The carbon dioxide concentration was calculated by using the calibration curve above. Incidentally, the detection limit of carbon dioxide concentration was 0.04 g/m$^3$.

(2) Measuring Method of Sulfur Oxide Concentration and Nitrogen Oxide Concentration The sulfur oxide concentration and nitrogen oxide concentration in the environment was measured by trapping a gas to be measured in water at 1.5 L/min for 1 hour and analyzing it by an ion chromatographic analyzer, "Model DX500" (manufactured by DIONEX). The detection limit was 0.1 μg/m$^3$ for both the sulfur oxide concentration and the nitrogen oxide concentration.

(3) Measuring Method of Absolute Humidity

The absolute humidity in the air atmosphere was measured using "testo 608-H2" manufactured by testo K.K. Also, the absolute humidity in the nitrogen atmosphere was measured using "Model DS1000" manufactured by Alpha Moisture System.

Example 1

An organic electroluminescence element having a structure shown in FIG. 1 was produced by the following method.

<Formation of Hole Injection Layer on ITO Substrate>

A glass substrate 1 on which an indium tin oxide (ITO) transparent electroconductive film having a film thickness of 150 nm is formed as the anode 2 was used as the ITO substrate.

Subsequently, Polymer Compound HI-1 having a repeating structure shown below and 4-isopropyl-4'-methyldiphenyliodonium tetrakis(pentafluorophenyl)borate were mixed in a weight ratio of 100:20. This mixture was dissolved in ethyl benzoate to have a total concentration of 2.0 wt %, whereby a composition was prepared. This composition was spin-coated on the ITO substrate in an air atmosphere in two steps of a spinner rotation speed of 500 rpm for 2 seconds and 1,500 rpm for 30 seconds. Thereafter, the coating film was heated at 230° C. for 1 hour to form a hole injection layer 3 having a film thickness of 30 nm.

[Chem. 29]

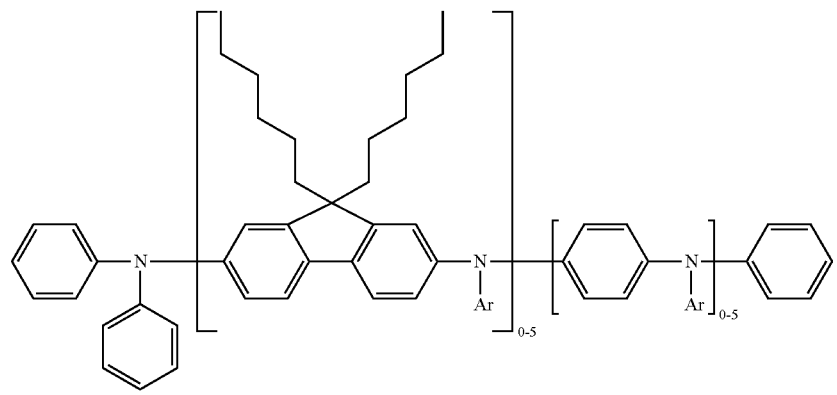

HI-1

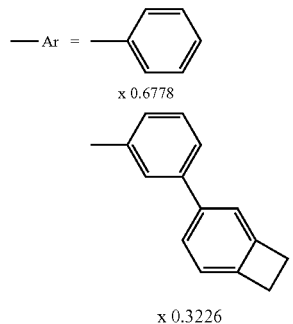

<Formation of Hole Transport Layer>

A composition obtained by dissolving Polymer Compound HT-1 having a repeating structure shown below in cyclohexylbenzene to a concentration of 1.0 wt % was prepared. This composition was spin-coated on the hole injection layer 3 in a dry nitrogen atmosphere in two steps of a spinner rotation speed of 500 rpm for 2 seconds and 1,500 rpm for 120 seconds. Thereafter, the coating film was heated at 230° C. for 1 hour to form a hole transport layer 4 having a film thickness of 15 nm.

[Chem. 30]

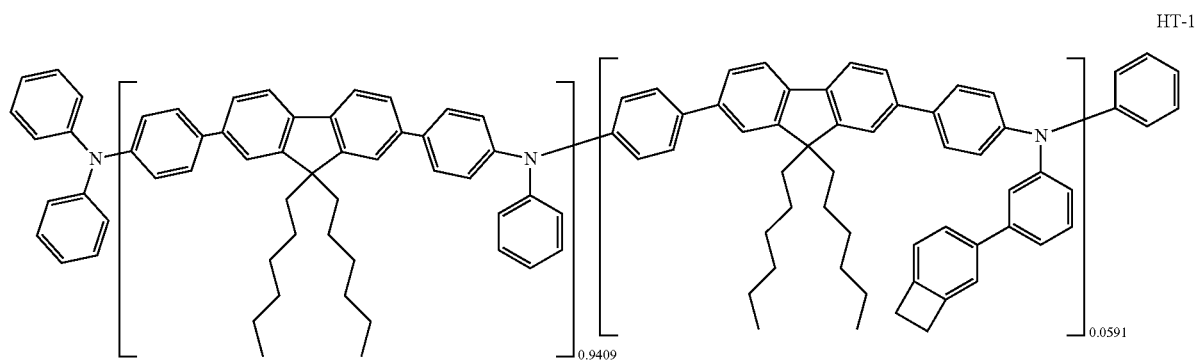

<Formation of Emitting Layer>

Blue Fluorescent Materials BH-1 and BD-1 shown below were mixed in a weight ratio of 100:7. This mixture was dissolved in cyclohexylbenzene to have a total concentration of 6.0 wt %, whereby a composition was prepared. This composition was spin-coated on the hole transport layer 4 in two steps of a spinner rotation speed of 500 rpm for 2 seconds and 2,250 rpm for 120 seconds. Here, spin coating was performed in an air atmosphere having a carbon dioxide concentration of 0.3 g/m$^3$ (oxygen concentration: 21 vol % (hereinafter, referred to as "%"), absolute humidity: 7.2 g/kg (DA)). Thereafter, the coating film was heated at 130° C. for 1 hour to form an emitting layer 5 having a film thickness of 50 nm.

[Chem. 31]

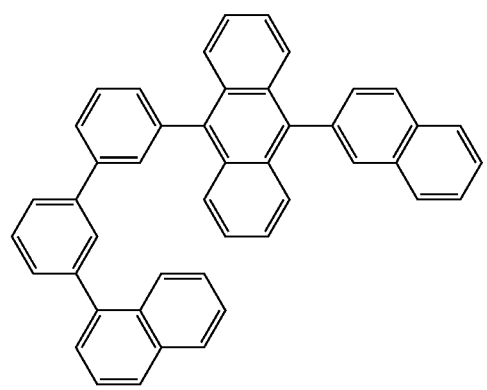

-continued

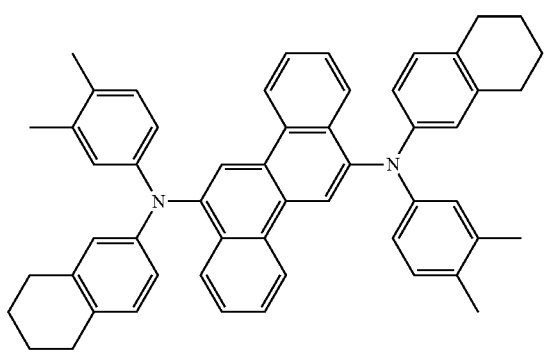

BD-1

<Formation of Hole Blocking Layer and Electron Transport Layer>

Subsequently, a hole blocking layer 6 was formed by vapor-depositing Compound HB-1 shown below on the emitting layer 5 by a vacuum deposition method to have a film thickness of 10 nm.

[Chem. 32]

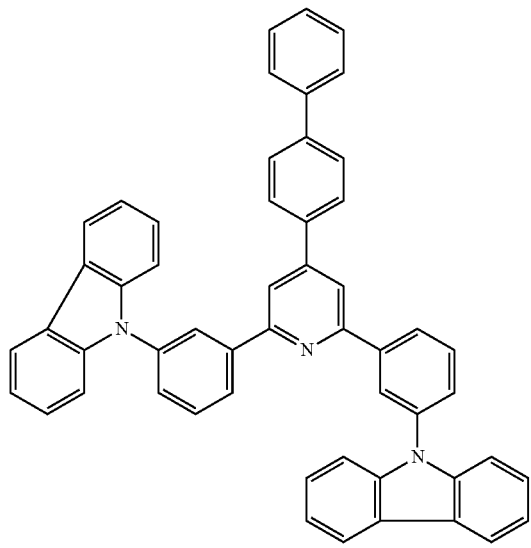

HB-1

Furthermore, an electron transport layer 7 was formed by vapor-depositing tris(8-hydroxyquinolinato)aluminum on the hole blocking layer 6 by a vacuum deposition method to have a film thickness of 20 nm.

<Formation of Electron Injection Layer and Cathode>

Thereafter, an electron injection layer 8 was formed by vapor-depositing lithium fluoride (LiF) on the electron transport layer 7 by a vacuum deposition method to have a film thickness of 0.5 nm. Furthermore, a cathode 9 was formed by vapor-depositing aluminum by a vacuum deposition method to have a film thickness of 80 nm.

<Encapsulation>

Subsequently, in a nitrogen glove box, a photocurable resin was coated in the outer peripheral part of a glass plate, and a moisture getter sheet was disposed in the center portion of the glass plate. This glass plate and the element up to formation of the cathode 9 were laminated together and then, only the region coated with the photocurable resin was irradiated with ultraviolet light to cure the resin, whereby an organic electroluminescence element was obtained.

Comparative Example 1

An organic electroluminescence element was produced in the same manner as in Example 1 except that the spin coating at film formation of the emitting layer 5 was performed in a dry nitrogen atmosphere having a carbon dioxide concentration not more than the detection limit (oxygen concentration: 1 ppm or less, absolute humidity: 0.0001 g/kg (DA) or less).

Comparative Example 2

An organic electroluminescence element was produced in the same manner as in Example 1 except that the spin coating at film formation of the emitting layer 5 was performed in an air atmosphere having a carbon dioxide concentration of 1.2 g/m$^3$ (oxygen concentration: 21 vol %, absolute humidity: 10.3 g/kg (DA)).

[Evaluation]

Each of the thus-produced organic electroluminescence elements of Example 1 and Comparative Examples 1 and 2 was measured for the luminous efficiency and the luminance half life. The results are shown in Table 1 as a relative value by taking each of the luminous efficiency and the luminance half life of the organic electroluminescence element of Comparative Example 1 as 1.00. The luminance half life is a time required for the luminance to decrease from the initial luminance to half the initial luminance. Here, the initial luminance was set to 1,000 cd/m$^2$ (all of the following evaluations were performed in the same manner).

TABLE 1

| | Film formation Environment of Emitting Layer | | | | Evaluation | |
| --- | --- | --- | --- | --- | --- | --- |
| | Atmosphere | Oxygen Concentration | Absolute Humidity [g/kg (DA)] | Carbon Dioxide Concentration [g/m$^3$] | Luminous Efficiency | Luminance Half Life |
| Example 1 | air | 21 vol % | 7.2 | 0.3 | 1.06 | 1.04 |
| Comparative Example 1 | nitrogen | 1 ppm or less | 0.0001 or less | not more than detection limit | 1.00 | 1.00 |
| Comparative Example 2 | air | 21 vol % | 10.3 | 1.2 | 0.90 | 0.46 |

It is seen from Table 1 that even in an air atmosphere where oxygen concentration and humidity are not controlled, an organic electroluminescence element having performances equal to those of the organic electroluminescence element produced by depositing the emitting layer in an inert gas atmosphere can be obtained by reducing the carbon dioxide concentration in the film formation environment of the emitting layer.

Example 2

An organic electroluminescence element was produced in the same manner as in Example 1 except that the spin coating at film formation of the emitting layer 5 was performed in an air atmosphere having a sulfur oxide concentration of 0.2 μg/m³ (oxygen concentration: 21 vol %, absolute humidity: 6.7 g/kg (DA)).

Comparative Example 3

An organic electroluminescence element was produced in the same manner as in Example 1 except that the spin coating at film formation of the emitting layer 5 was performed in a dry nitrogen atmosphere having a sulfur oxide concentration not more than the detection limit (oxygen concentration: 1 ppm or less, absolute humidity: 0.0001 g/kg (DA) or less).

Comparative Example 4

An organic electroluminescence element was produced in the same manner as in Example 1 except that the spin coating at film formation of the emitting layer 5 was performed in an air atmosphere having a sulfur oxide concentration of 4.2 μg/m³ (oxygen concentration: 21 vol %, absolute humidity: 9.4 g/kg (DA)).

[Evaluation]

Each of the thus-produced organic electroluminescence elements of Example 2 and Comparative Examples 3 and 4 was measured for the luminous efficiency and the luminance half life. The results are shown in Table 2 as a relative value by taking each of the luminous efficiency and the luminance half life of the organic electroluminescence element of Comparative Example 3 as 1.00. The luminance half life is a time required for the luminance to decrease from the initial luminance to half the initial luminance. Here, the initial luminance was set to 1,000 cd/m² (all of the following evaluations were performed in the same manner).

It is seen from Table 2 that even in an air atmosphere where oxygen concentration and humidity are not controlled, an organic electroluminescence element having performances equal to those of the organic electroluminescence element produced by depositing the emitting layer in an inert gas atmosphere can be obtained by reducing the sulfur oxide concentration in the film formation environment of the emitting layer.

Example 3

An organic electroluminescence element was produced in the same manner as in Example 1 except that the spin coating at film formation of the emitting layer 5 was performed in an air atmosphere having a nitrogen oxide concentration not more than the detection limit (oxygen concentration: 21 vol %, absolute humidity: 5.6 g/kg (DA)).

Comparative Example 5

An organic electroluminescence element was produced in the same manner as in Example 1 except that the spin coating at film formation of the emitting layer 5 was performed in a dry nitrogen atmosphere having a nitrogen oxide concentration not more than the detection limit (oxygen concentration: 1 ppm or less, absolute humidity: 0.0001 g/kg (DA) or less).

Comparative Example 6

An organic electroluminescence element was produced in the same manner as in Example 1 except that the spin coating at film formation of the emitting layer 5 was performed in an air atmosphere having a nitrogen oxide concentration of 4.3 μg/m³ (oxygen concentration: 21 vol %, absolute humidity: 7.6 g/kg (DA)).

[Evaluation]

Each of the thus-produced organic electroluminescence elements of Example 3 and Comparative Examples 5 and 6 was measured for the luminous efficiency and the luminance half life. The results are shown in Table 3 as a relative value by taking each of the luminous efficiency and the luminance half life of the organic electroluminescence element of Comparative Example 5 as 1.00. The luminance half life is a time required for the luminance to decrease from the initial luminance to half the initial luminance. Here, the initial luminance was set to 1,000 cd/m² (all of the following evaluations were performed in the same manner).

TABLE 2

| | Film formation Environment of Emitting Layer | | | | Evaluation | |
|---|---|---|---|---|---|---|
| | Atmosphere | Oxygen Concentration | Absolute Humidity [g/kg (DA)] | Sulfur Oxide Concentration [μg/m³] | Luminous Efficiency | Luminance Half Life |
| Example 2 | air | 21 vol % | 6.7 | 0.2 | 1.00 | 1.05 |
| Comparative Example 3 | nitrogen | 1 ppm or less | 0.0001 or less | not more than detection limit | 1.00 | 1.00 |
| Comparative Example 4 | air | 21 vol % | 9.4 | 4.2 | 0.87 | 0.56 |

TABLE 3

| | Film formation Environment of Emitting Layer | | | | Evaluation | |
|---|---|---|---|---|---|---|
| | Atmosphere | Oxygen Concentration | Absolute Humidity [g/kg (DA)] | Nitrogen Oxide Concentration [μg/m³] | Luminous Efficiency | Luminance Half Life |
| Example 3 | air | 21 vol % | 5.6 | not more than detection limit | 0.96 | 0.99 |
| Comparative Example 5 | nitrogen | 1 ppm or less | 0.0001 or less | not more than detection limit | 1.00 | 1.00 |
| Comparative Example 6 | air | 21 vol % | 7.6 | 4.3 | 0.82 | 0.36 |

It is seen from Table 3 that even in an air atmosphere where oxygen concentration and humidity are not controlled, an organic electroluminescence element having performances equal to those of the organic electroluminescence element produced by depositing the emitting layer in an inert gas atmosphere can be obtained by reducing the nitrogen oxide concentration in the film formation environment of the emitting layer.

Example 4

An organic electroluminescence element was produced in the same manner as in Example 1 except that the method for forming the emitting layer 5 was changed as follows.

Blue Fluorescent Material BH-1 used in Example 1 and Green Phosphorescent Materials GH-1 and GD-1 were mixed in a weight ratio of 25:75:10. A composition obtained by dissolving this mixture in cyclohexylbenzene to have a total concentration of 5.0 wt % was prepared. This composition was spin-coated on the hole transport layer 4 in two steps of a spinner rotation speed of 500 rpm for 2 seconds and 2,000 rpm for 120 seconds. Here, spin coating was performed in an air atmosphere having a carbon dioxide concentration, a sulfur oxide concentration and a nitrogen oxide concentration of 0.3 g/m³, 0.2 μg/m³ and 1.9 μg/m³, respectively (oxygen concentration: 21 vol %, absolute humidity: 13.9 g/kg (DA)). Thereafter, the coating film was heated at 130° C. for 1 hour to form an emitting layer 5 having a film thickness of 50 nm.

[Chem. 33]

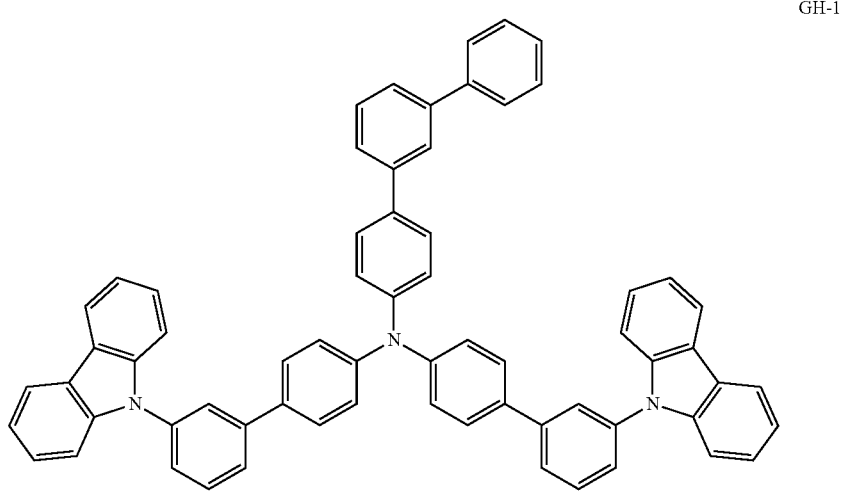

GH-1

-continued

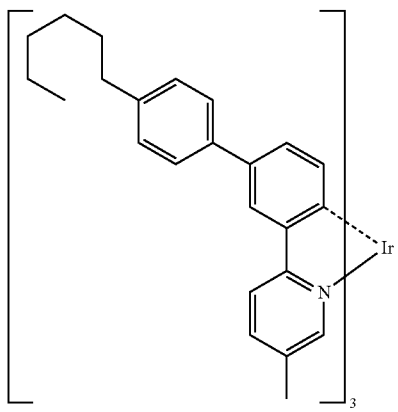

GD-1

Comparative Example 7

An organic electroluminescence element was produced in the same manner as in Example 4 except that spin coating at the film formation of the emitting layer 5 was performed in a dry nitrogen atmosphere where all of the carbon dioxide concentration, the sulfur oxide concentration and the nitrogen oxide concentration were not more than the detection limit (oxygen concentration: 1 ppm or less, absolute humidity: 0.0001 g/kg (DA) or less).

[Evaluation]

Each of the thus-produced organic electroluminescence elements of Example 4 and Comparative Example 7 was measured for the luminous efficiency and the luminance half life. The results are shown in Table 4 as a relative value by taking each of the luminous efficiency and the luminance half life of the organic electroluminescence element of Comparative Example 7 as 1.00. The luminance half life is a time required for the luminance to decrease from the initial luminance to half the initial luminance. Here, the initial luminance was set to 1,000 cd/m² (all of the following evaluations were performed in the same manner).

Reference Example 1

An organic electroluminescence element was produced in the same manner as in Example 1 except that the method for forming the emitting layer 5 was changed as follows.

Blue Fluorescent Materials BH-1 and BD-1 used in Example 1 were mixed in a weight ratio of 100:7. A composition obtained by dissolving this mixture in cyclohexylbenzene to have a total concentration of 3.8 wt % was prepared. This composition was spin-coated on the hole transport layer 4 in a dry nitrogen atmosphere in two steps of a spinner rotation speed of 500 rpm for 2 seconds and 1,500 rpm for 120 seconds. Thereafter, the coating film was dried in the same manner as in Example 1 to form an emitting layer 5 having a film thickness of 50 nm. The element up to formation of the emitting layer 5 was stored for 30 minutes in an air atmosphere having a carbon dioxide concentration, a nitrogen oxide concentration and a sulfur oxide concentration of 0.3 g/m³, 1.9 μg/m³ and 0.2 μg/m³, respectively (oxygen concentration: 21 vol %, absolute humidity: 7.6 g/kg (DA)). Subsequently, formation of a hole blocking layer, an electron trans-

TABLE 4

| | Film formation Environment of Emitting Layer | | | | | Evaluation | |
|---|---|---|---|---|---|---|---|
| | Atmosphere | Oxygen Concentration | Absolute Humidity [g/kg (DA)] | Carbon Dioxide Concentration [g/m³] | Sulfur Oxide Concentration [μg/m³] | Nitrogen Oxide Concentration [μg/m³] | Luminous Efficiency | Luminance Half Life |
| Example 4 | air | 21 vol % | 13.9 | 0.3 | 0.2 | 1.9 | 1.02 | 1.03 |
| Comparative Example 7 | nitrogen | 1 ppm or less | 0.0001 or less | not more than detection limit | not more than detection limit | not more than detection limit | 1.00 | 1.00 |

It is seen from Table 4 that also with respect to an organic electroluminescence element using a green phosphorescent material as the luminescent material of the emitting layer, even in an air atmosphere where oxygen concentration and humidity are not controlled, an organic electroluminescence element having performances equal to those of the organic electroluminescence element produced by depositing the emitting layer in an inert gas atmosphere can be obtained by reducing the carbon dioxide concentration, the sulfur oxide concentration and the nitrogen oxide concentration in the film formation environment of the emitting layer.

port layer, an electron injection layer and a cathode, and encapsulation were performed in the same manner as in Example 1.

Reference Example 2

An organic electroluminescence element was produced in the same manner as in Reference Example 1 except that the element up to formation of the emitting layer 5 was stored for 30 minutes in an air atmosphere having a carbon dioxide concentration, a nitrogen oxide concentration and a sulfur oxide concentration of 0.7 g/m³, 3.1 μg/m³ and 2.2 μg/m³, respectively (oxygen concentration: 21 vol %, absolute humidity: 7.5 g/kg (DA)).

Here, the storage environment above was formed by mixing the air used in Reference Example 1 having a carbon dioxide concentration, a nitrogen oxide concentration and a sulfur oxide concentration of 0.3 g/m³, 1.9 μg/m³ and 0.2 μg/m³, respectively, and normal air having a carbon dioxide concentration, a nitrogen oxide concentration and a sulfur oxide concentration of 1.2 g/m³, 4.3 μg/m³ and 4.2 μg/m³, respectively, in the same volume ratio.

Reference Example 3

An organic electroluminescence element was produced in the same manner as in Reference Example 1 except that the element up to formation of the emitting layer 5 was stored for 30 minutes in a dry nitrogen atmosphere where all of the carbon dioxide concentration, the sulfur oxide concentration and the nitrogen oxide concentration were not more than the detection limit (oxygen concentration: 1 ppm or less, absolute humidity: 0.0001 g/kg (DA) or less).

Reference Example 4

An organic electroluminescence element was produced in the same manner as in Reference Example 1 except that the element up to formation of the emitting layer 5 was stored for 30 minutes in an air atmosphere having a carbon dioxide concentration, a nitrogen oxide concentration and a sulfur oxide concentration of 1.2 g/m³, 4.3 μg/m³ and 4.2 μg/m³, respectively (oxygen concentration: 21 vol %, absolute humidity: 7.6 g/kg (DA)).

[Evaluation]

Each of the thus-produced organic electroluminescence elements of Reference Examples 1 to 4 was measured for the luminous efficiency and the luminance half life. The results are shown in Table 5 as a relative value by taking each of the luminous efficiency and the luminance half life of the organic electroluminescence element of Reference Example 3 as 1.00. The luminance half life is a time required for the luminance to decrease from the initial luminance to half the initial luminance. Here, the initial luminance was set to 1,000 cd/m² (all of the following evaluations were performed in the same manner).

ronment after formation of the emitting layer to 0.7 g/m³, 3.1 μg/m³ and 2.2 μg/m³, respectively, exhibits equal performances compared with the organic electroluminescence element stored in an inert gas atmosphere.

Example 5

An organic electroluminescence element was produced in the same manner as in Example 4 except for performing spin coating at the film formation of the emitting layer 5 in a dry nitrogen atmosphere where all of the carbon dioxide concentration, the sulfur oxide concentration and the nitrogen oxide concentration were not more than the detection limit (oxygen concentration: 1 ppm or less, absolute humidity: 0.0016 g/kg (DA)), and changing the method for forming the hole transport layer 4 as follows.

A composition obtained by dissolving Polymer Compound HT-1 in cyclohexylbenzene to a concentration of 1.0 wt % was prepared. This composition was spin-coated on the hole injection layer 3 in an air atmosphere having a carbon dioxide concentration, a sulfur oxide concentration and a nitrogen oxide concentration of 0.3 g/m³, 0.2 μg/m³ and 1.9 μg/m³, respectively (oxygen concentration: 21 vol %, absolute humidity: 13.1 g/kg (DA)), in two steps of a spinner rotation speed of 500 rpm for 2 seconds and 1,500 rpm for 120 seconds. Thereafter, the coating film was heated at 230° C. for 1 hour to form a hole transport layer 4 having a film thickness of 15 nm.

Comparative Example 8

An organic electroluminescence element was produced in the same manner as in Example 5 except that spin coating at the film formation of the hole transport layer 4 was performed in a dry nitrogen atmosphere where all of the carbon dioxide concentration, the sulfur oxide concentration and the nitrogen oxide concentration were not more than the detection limit (oxygen concentration: 1 ppm or less, absolute humidity: 0.0001 g/kg (DA) or less).

[Evaluation]

Each of the thus-produced organic electroluminescence elements of Example 5 and Comparative Example 8 was measured for the luminous efficiency and the luminance half life. The results are shown in Table 6 as a relative value by

TABLE 5

| | | | | Film formation Environment of Emitting Layer | | | | |
| | | | | | Carbon Dioxide | Sulfur Oxide | Nitrogen Oxide | Evaluation | |
| | Atmosphere | Oxygen Concentration | Absolute Humidity [g/kg (DA)] | Concentration [g/m³] | Concentration [μg/m³] | Concentration [μg/m³] | Luminous Efficiency | Luminance Half Life |
|---|---|---|---|---|---|---|---|---|
| Reference Example 1 | Air | 21 vol % | 7.6 | 0.3 | 0.2 | 1.9 | 0.96 | 1.11 |
| Reference Example 2 | Air | 21 vol % | 7.5 | 0.7 | 2.2 | 3.1 | 0.98 | 0.95 |
| Reference Example 3 | Nitrogen | 1 ppm or less | 0.0001 or less | not more than detection limit | not more than detection limit | not more than detection limit | 1.00 | 1.00 |
| Reference Example 4 | Air | 21 vol % | 7.6 | 1.2 | 4.2 | 4.3 | 0.85 | 0.50 |

It is seen from Table 5 that the organic electroluminescence element stored in an air atmosphere formed by reducing the carbon dioxide concentration, the nitrogen oxide concentration and the sulfur oxide concentration in the storage environment after formation of the emitting layer to 0.7 g/m³, 3.1 μg/m³ and 2.2 μg/m³, respectively, exhibits equal perfortaking each of the luminous efficiency and the luminance half life of the organic electroluminescence element of Comparative Example 8 as 1.00. The luminance half life is a time required for the luminance to decrease from the initial luminance to half the initial luminance. Here, the initial luminance was set to 1,000 cd/m² (all of the following evaluations were performed in the same manner).

tration: 0.1 vol % or more, nitrogen oxide concentration: 0.1 vol % or more, oxygen concentration: 21 vol %).

TABLE 6

| | | | Film formation Environment of Emitting Layer | | | | Evaluation | |
|---|---|---|---|---|---|---|---|---|
| | Atmosphere | Oxygen Concentration | Absolute Humidity [g/kg (DA)] | Carbon Dioxide Concentration [g/m³] | Sulfur Oxide Concentration [μg/m³] | Nitrogen Oxide Concentration [μg/m³] | Luminous Efficiency | Luminance Half Life |
| Example 5 | air | 21 vol % | 13.1 | 0.3 | 0.2 | 1.9 | 0.99 | 0.99 |
| Comparative Example 8 | nitrogen | 1 ppm or less | 0.0001 or less | not more than detection limit | not more than detection limit | not more than detection limit | 1.00 | 1.00 |

It is seen from Table 6 that even in an air atmosphere where oxygen concentration and humidity are not controlled, an organic electroluminescence element having performances equal to those of the organic electroluminescence element produced by depositing the hole transport layer in an inert gas atmosphere can be obtained by reducing the carbon dioxide concentration, the sulfur oxide concentration and the nitrogen oxide concentration in the film formation environment of the hole transport layer.

Reference Example 5

An organic electroluminescence element was produced in the same manner as in Reference Example 1 except that the element up to formation of the emitting layer 5 was stored for 15 minutes in a dry nitrogen atmosphere where the sulfur oxide concentration and the nitrogen oxide concentration were not more than the detection limit (oxygen concentration: 1 ppm or less, absolute humidity: 0.0001 g/kg (DA) or less).

Reference Example 6

An organic electroluminescence element was produced in the same manner as in Reference Example 1 except that the element up to formation of the emitting layer 5 was stored for 15 minutes in a dry nitrogen atmosphere where sulfur oxide and nitrogen oxide were added (sulfur oxide concentration: 0.1 vol % or more, nitrogen oxide concentration: 0.1 vol % or more, oxygen concentration: 1 ppm or less, absolute humidity: 0.0001 g/kg (DA) or less).

Reference Example 7

An organic electroluminescence element was produced in the same manner as in Reference Example 1 except that the element up to formation of the emitting layer 5 was stored for 15 minutes in a nitrogen atmosphere where sulfur oxide, nitrogen oxide and oxygen were added (sulfur oxide concen-

[Evaluation]

Each of the thus-produced organic electroluminescence elements of Reference Examples 5 to 7 was measured for the luminous efficiency and the luminance half life. The results are shown in Table 7 as a relative value by taking each of the luminous efficiency and the luminance half life of the organic electroluminescence element of Reference Example 5 as 1.00. The luminance half life is a time required for the luminance to decrease from the initial luminance to half the initial luminance. Here, the initial luminance was set to 1,000 cd/m² (all of the following evaluations were performed in the same manner). Incidentally, in Reference Example 7, the characteristics of the organic electroluminescence element were deteriorated to such an extent that the measurements for evaluation could not be performed.

TABLE 7

| | | Film formation Environment of Emitting Layer | | | Evaluation | |
|---|---|---|---|---|---|---|
| | Atmosphere | Oxygen Concentration | Sulfur Oxide Concentration | Nitrogen Oxide Concentration | Luminous Efficiency | Luminance Half Life |
| Reference Example 5 | nitrogen | 1 ppm or less | not more than detection limit | not more than detection limit | 1.00 | 1.00 |
| Reference Example 6 | nitrogen | 1 ppm or less | 0.1 vol % or more | 0.1 vol % or more | 0.98 | 1.00 |
| Reference Example 7 | air | 21 vol % | 0.1 vol % or more | 0.1 vol % or more | could not be evaluated | could not be evaluated |

As seen from Table 7, with respect to the storage environment after forming the emitting layer, the organic electroluminescence element stored in an atmosphere where each of the nitrogen oxide concentration and the sulfur oxide concentration is 0.1 vol % or more and the oxygen concentration is 1 ppm or less, exhibits equal performances compared with the organic electroluminescence element stored in an inert gas atmosphere. On the other hand, it is seen that with respect to the storage environment after forming the emitting layer, the organic electroluminescence element stored in an atmosphere where each of the nitrogen oxide concentration and the sulfur oxide concentration is 0.1 vol % or more and the oxygen concentration is 21 vol %, is significantly deteriorated in the characteristics compared with the organic electroluminescence element stored in an inert gas atmosphere.

Reference Example 8

An organic electroluminescence element was produced in the same manner as in Reference Example 1 except that the element up to formation of the emitting layer 5 was stored for 15 minutes in a dry nitrogen atmosphere where the carbon dioxide concentration was not more than the detection limit (oxygen concentration: 1 ppm or less, absolute humidity: 0.0001 g/kg (DA) or less).

Reference Example 9

An organic electroluminescence element was produced in the same manner as in Reference Example 1 except that the element up to formation of the emitting layer 5 was stored for 15 minutes in a mixed atmosphere of carbon dioxide and nitrogen (carbon dioxide concentration: 80 vol % or more, oxygen concentration: 1 ppm or less).

Reference Example 10

An organic electroluminescence element was produced in the same manner as in Reference Example 1 except that the element up to formation of the emitting layer 5 was stored for 15 minutes in a mixed atmosphere of carbon dioxide, nitrogen and oxygen (carbon dioxide concentration: 80 vol % or more, oxygen concentration: 5 vol %).

[Evaluation]

Each of the thus-produced organic electroluminescence elements of Reference Examples 8 to 10 was measured for the luminous efficiency and the luminance half life. The results are shown in Table 8 as a relative value by taking each of the luminous efficiency and the luminance half life of the organic electroluminescence element of Reference Example 8 as 1.00. The luminance half life is a time required for the luminance to decrease from the initial luminance to half the initial luminance. Here, the initial luminance was set to 1,000 cd/m$^2$ (all of the following evaluations were performed in the same manner).

TABLE 8

| | Film formation Environment of Emitting Layer | | | Evaluation | |
|---|---|---|---|---|---|
| | Atmosphere | Oxygen Concentration | Carbon Dioxide Concentration | Luminous Efficiency | Luminance Half Life |
| Reference Example 8 | nitrogen | 1 ppm or less | not more than detection limit | 1.00 | 1.00 |
| Reference Example 9 | nitrogen | 1 ppm or less | 80 vol % or more | 0.96 | 1.00 |
| Reference Example 10 | air | 5 vol % | 80 vol % or more | 0.96 | 0.85 |

As seen from Table 8, with respect to the storage environment after forming the emitting layer, the organic electroluminescence element stored in an atmosphere having a carbon dioxide concentration of 80 vol % or more and an oxygen concentration of 1 ppm or less exhibits equal performances compared with the organic electroluminescence element stored in an inert gas atmosphere. On the other hand, it is seen that with respect to the storage environment after forming the emitting layer, the organic electroluminescence element stored in an atmosphere having a carbon dioxide concentration of 80 vol % or more and an oxygen concentration of 5 vol % is significantly deteriorated in the characteristics compared with the organic electroluminescence element stored in an inert gas atmosphere.

While the invention has been described in detail and with reference to specific embodiments thereof, it will be apparent to one skilled in the art that various changes and modifications can be made therein without departing from the spirit and scope of the invention. This application is based on Japanese Patent Application (Patent Application No. 2010-057606) filed on Mar. 15, 2010, the contents of which are incorporated herein by way of reference.

INDUSTRIAL APPLICABILITY

The present invention can be suitably used in various fields using an organic electroluminescence element, for example, in the fields of a flat panel/display (such as OA computer display or wall-hanging television), a light source utilizing the characteristics as a surface illuminant (such as light source of copiers, and backlight source of liquid crystal displays or gauges), a display board, and a marker lamp.

DESCRIPTION OF REFERENCE NUMERALS AND SIGNS

1 Substrate
2 Anode
3 Hole injection layer
4 Hole transport layer
5 Emitting layer
6 Hole blocking layer
7 Electron transport layer
8 Electron injection layer
9 Cathode
10 Organic electroluminescence element
11 Housing
12 Air purification means
13 Air blower
A Air

The invention claimed is:

1. A method for producing an organic electroluminescence element comprising an organic layer between an anode and a cathode, the method comprising:
    a wet film-forming step with an organic electroluminescence element composition comprising an organic electroluminescence element material and a solvent, to form a film; and
    a film-drying step of drying the film,
to form at least one film layer contained in the organic layer,
    wherein the wet film-forming step occurs in an environment having a sulfur oxide concentration of 2.2 µg/m$^3$ or less, an oxygen concentration of 18 to 22 vol % and a carbon dioxide concentration is 0.7 g/m$^3$ or less.

2. A method for producing an organic electroluminescence element comprising an organic layer between an anode and a cathode, the method comprising:
    a wet film-forming step with an organic electroluminescence element composition comprising an organic electroluminescence element material and a solvent, to form a film; and
    a film-drying step of drying the film, to form at least one film layer contained in the organic layer,
wherein the wet film-forming step occurs in an environment having a nitrogen oxide concentration of 3.1 μg/m³ or less, an oxygen concentration of 18 to 22 vol % and a carbon dioxide concentration is 0.7 g/m³ or less.

3. A method for producing an organic electroluminescence element comprising an organic layer between an anode and a cathode, the method comprising:
  a wet film-forming step with an organic electroluminescence element composition comprising an organic electroluminescence element material and a solvent, to form a film; and
  a film-drying step of drying the film,
to form at least one film layer contained in the organic layer,
  wherein the wet film-forming step occurs in an environment having an oxygen concentration of 18 to 22 vol % and an absolute humidity of 15 g/kg (DA) or less, a carbon dioxide concentration is 0.7 g/m³ or less and satisfying at least one of the following (2) and (3):

(2) a sulfur oxide concentration is 2.2 μg/m³ or less, and (3) a nitrogen oxide concentration is 3.1 μg/m³ or less.

4. The method of producing an organic electroluminescence element as claimed in claim 1, 2 or 3, wherein the film layer obtained through the wet film-forming step and the film-drying step is an emitting layer.

5. The method of producing an organic electroluminescence element as claimed in claim 1, 2 or 3, wherein the film layer obtained through the wet film-forming step and the film-drying step is a hole transport layer.

6. The method of producing an organic electroluminescence element as claimed in claim 1, 2 or 3, wherein the organic electroluminescence element material comprises at least one selected from the group consisting of an organometallic complex, an aromatic amine-based compound and an anthracene derivative.

* * * * *